(12) United States Patent
Takahata

(10) Patent No.: US 12,087,604 B2
(45) Date of Patent: Sep. 10, 2024

(54) TEMPLATE, MANUFACTURING METHOD OF TEMPLATE, AND MANUFACTURING METHOD OF SEMICONDUCTOR DEVICE

(71) Applicant: Kioxia Corporation, Tokyo (JP)

(72) Inventor: Kazuhiro Takahata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 326 days.

(21) Appl. No.: 17/471,038

(22) Filed: Sep. 9, 2021

(65) Prior Publication Data
US 2022/0301908 A1    Sep. 22, 2022

(30) Foreign Application Priority Data

Mar. 16, 2021   (JP) .................... 2021-042715

(51) Int. Cl.
*H01L 21/67* (2006.01)
*G03F 7/00* (2006.01)
(Continued)

(52) U.S. Cl.
CPC ...... *H01L 21/67282* (2013.01); *G03F 7/0002* (2013.01); *G03F 9/7042* (2013.01);
(Continued)

(58) Field of Classification Search
CPC ........ G03F 7/0002; G03F 9/7042; G03F 1/00; G03F 3/00; H01L 21/67282; H01L 21/76817; H01L 23/544; H01L 2223/54426; H01L 2223/54453; B82Y 40/00
See application file for complete search history.

(56) References Cited

U.S. PATENT DOCUMENTS 6,869,557 B1 *  3/2005  Wago .............. G11B 5/855
                                                264/293
6,916,584 B2 *  7/2005  Sreenivasan ...... B29C 59/02
                                                264/494
(Continued)

FOREIGN PATENT DOCUMENTS

JP    2009-545887 A    12/2009
JP    2011-508459 A    3/2011
(Continued)

*Primary Examiner* — Britt D Hanley
*Assistant Examiner* — Victor V Barzykin
(74) *Attorney, Agent, or Firm* — Finnegan, Henderson, Farabow, Garrett & Dunner, LLP

(57) ABSTRACT

A template includes a first mark surrounding a recessed portion disposed in an inside region of the first mark. The first mark is provided with, in a planar view, an inner portion having a pair of first sides opposed to each other and a pair of second sides opposed to each other. The first sides extend in a first direction along the first substrate. The second sides extend in a second direction intersecting with the first direction along the first substrate. The inner portion surrounds the recessed portion of the first mark. An outer portion has a pair of third sides opposed to each other and a pair of fourth sides opposed to each other. The third sides extend in the first direction. The fourth sides extend in the second direction. The outer portion is an outer edge portion of the first mark.

11 Claims, 28 Drawing Sheets

(51) Int. Cl.
*G03F 9/00* (2006.01)
*H01L 23/544* (2006.01)

(52) U.S. Cl.
CPC .. *H01L 23/544* (2013.01); *H01L 2223/54426* (2013.01); *H01L 2223/54453* (2013.01)

(56) References Cited

U.S. PATENT DOCUMENTS

| | | | | |
|---|---|---|---|---|
| 7,309,225 | B2* | 12/2007 | McMackin | B82Y 40/00 264/1.36 |
| 7,709,373 | B1* | 5/2010 | Dakshina-Murthy | B82Y 10/00 438/597 |
| 8,288,242 | B2* | 10/2012 | Cho | G03F 9/7076 257/E21.249 |
| 8,850,980 | B2* | 10/2014 | Sreenivasan | G03B 27/42 101/485 |
| 9,202,788 | B2* | 12/2015 | Okuno | G03F 7/70633 |
| 2005/0067379 | A1 | 3/2005 | Sreenivasan | B82Y 10/00 216/44 |
| 2005/0202350 | A1* | 9/2005 | Colburn | H01L 21/76817 430/323 |
| 2006/0032437 | A1* | 2/2006 | McMackin | G03F 7/0002 118/100 |
| 2008/0028360 | A1 | 1/2008 | Picciotto et al. | |
| 2009/0166682 | A1 | 7/2009 | Scheuerlein | |
| 2010/0301449 | A1* | 12/2010 | Scheuerlein | H01L 27/0688 257/E27.009 |
| 2011/0062623 | A1* | 3/2011 | Saito | G03F 7/0002 264/219 |
| 2011/0115057 | A1* | 5/2011 | Harn | G03F 9/7084 257/E23.179 |
| 2011/0189438 | A1 | 8/2011 | Furusho | |
| 2012/0028378 | A1* | 2/2012 | Morinaga | G03F 7/0002 257/E21.529 |
| 2012/0072003 | A1* | 3/2012 | Matsuoka | G03F 7/0002 700/110 |
| 2013/0264675 | A1 | 10/2013 | Scheuerlein | |
| 2015/0048559 | A1* | 2/2015 | Kobayashi | G03F 7/0002 425/141 |
| 2016/0308020 | A1* | 10/2016 | Sreenivasan | G03F 7/0002 |
| 2016/0320696 | A1* | 11/2016 | Nishimura | G03F 7/0002 |
| 2017/0025141 | A1* | 1/2017 | Yang | G03F 7/0002 |
| 2018/0264712 | A1* | 9/2018 | Asano | B29C 59/002 |
| 2019/0283281 | A1 | 9/2019 | Yamamoto | |

FOREIGN PATENT DOCUMENTS

| | | |
|---|---|---|
| JP | 2011-159850 A | 8/2011 |
| JP | 2020-43279 A | 3/2020 |
| JP | 2020-120023 A | 8/2020 |
| JP | 6755168 B2 | 9/2020 |

* cited by examiner

FIG.1A
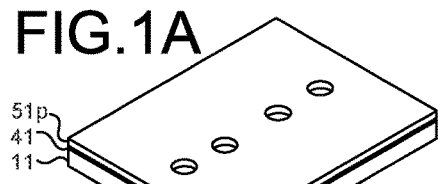
FIG.1B
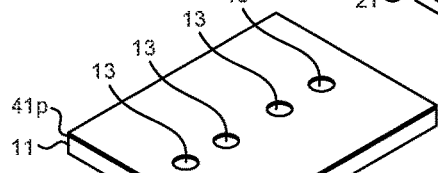
FIG.1C
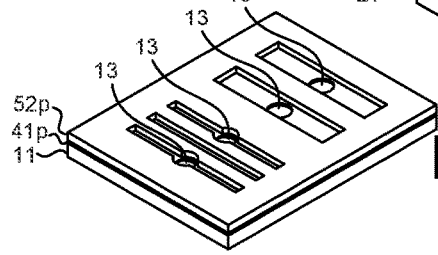
FIG.1D
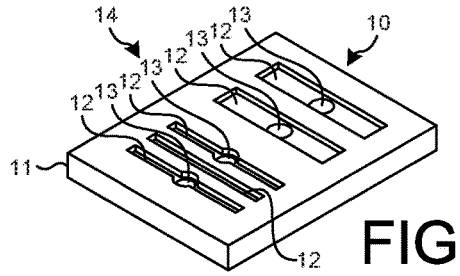
FIG.1E
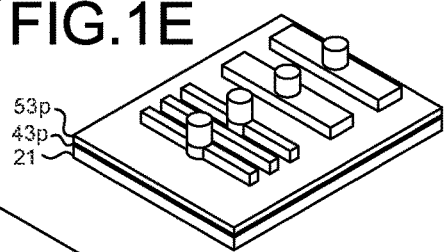
FIG.1F
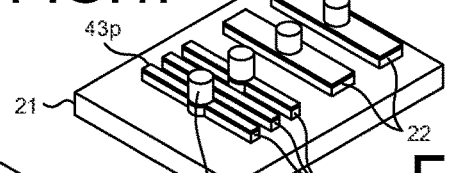
FIG.1G
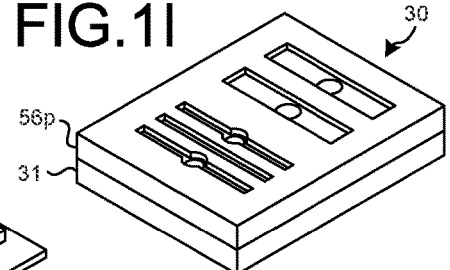
FIG.1H
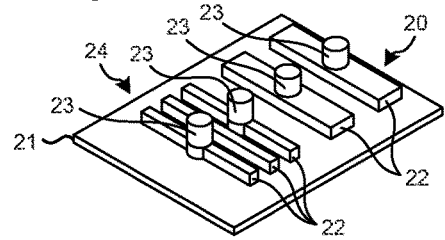
FIG.1I
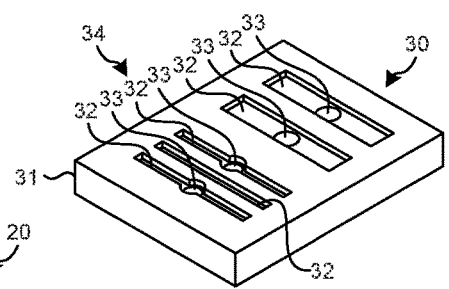
FIG.1J
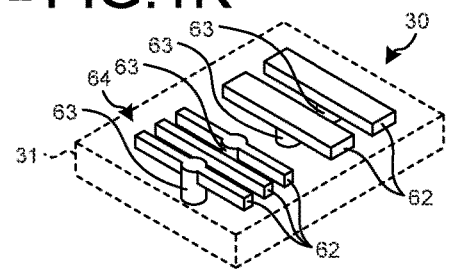
FIG.1K

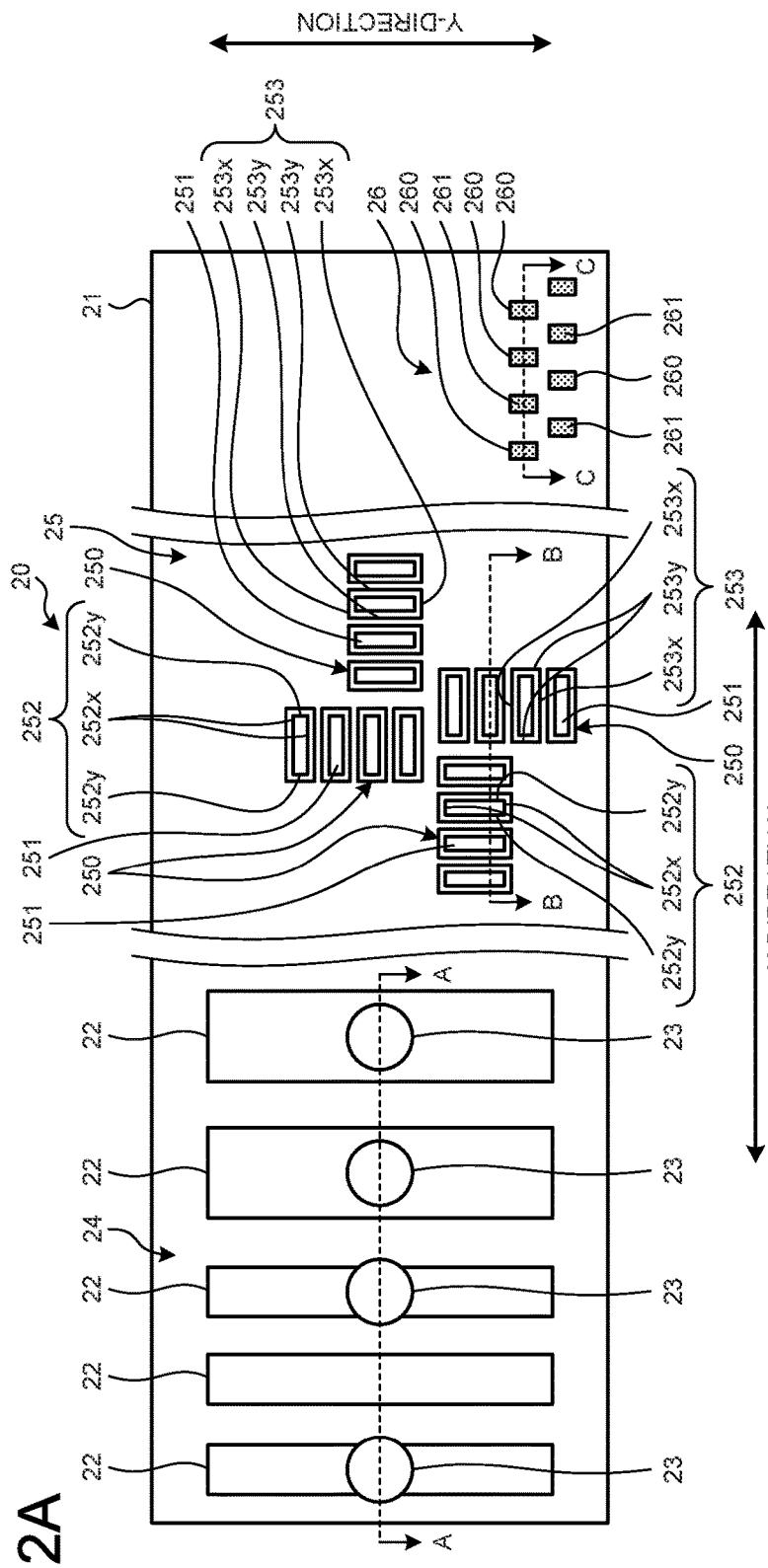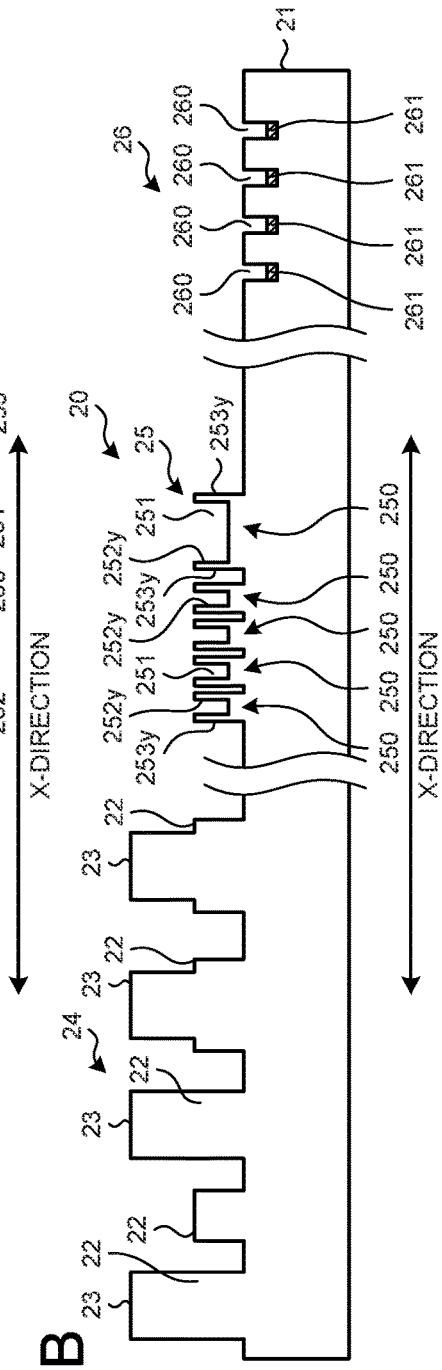

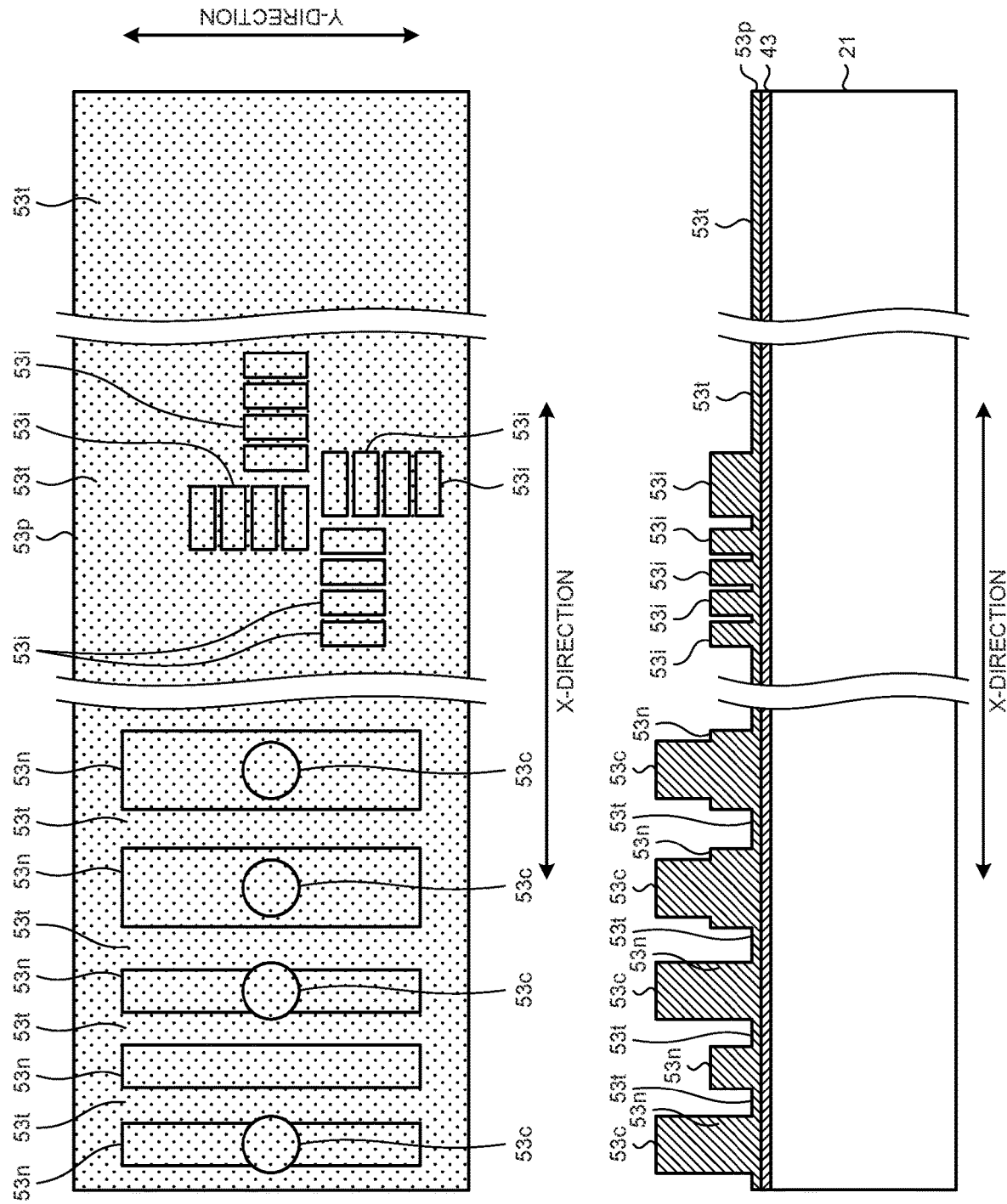

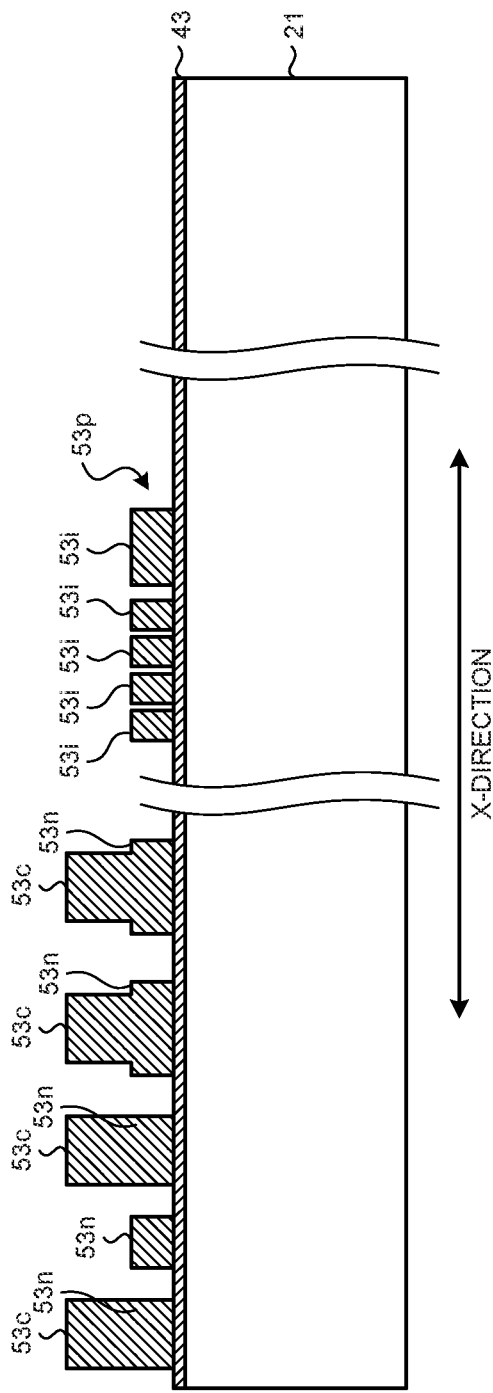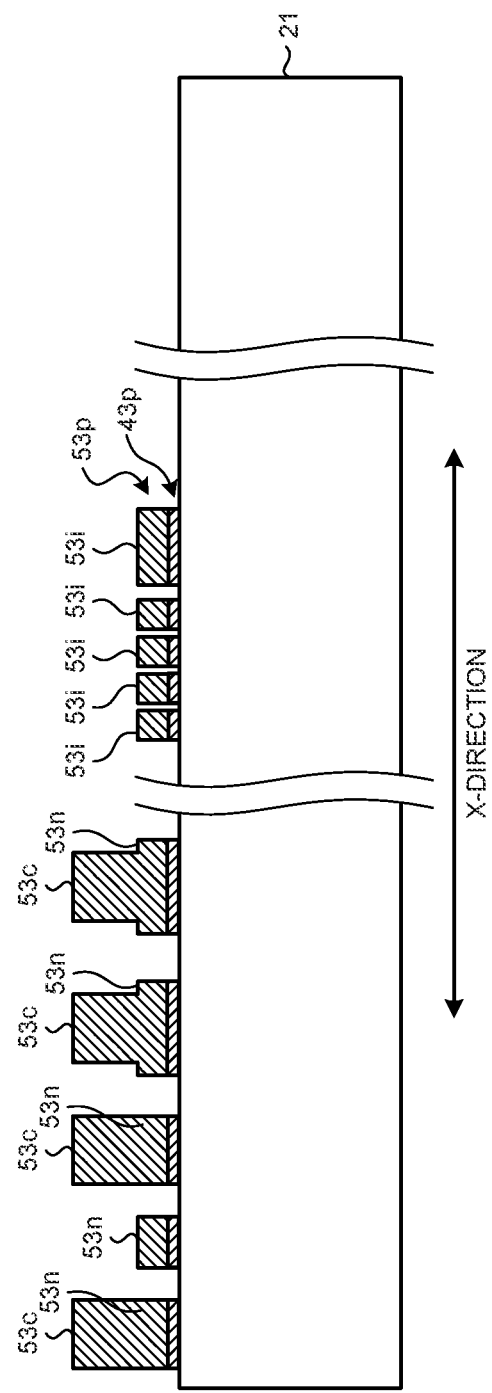

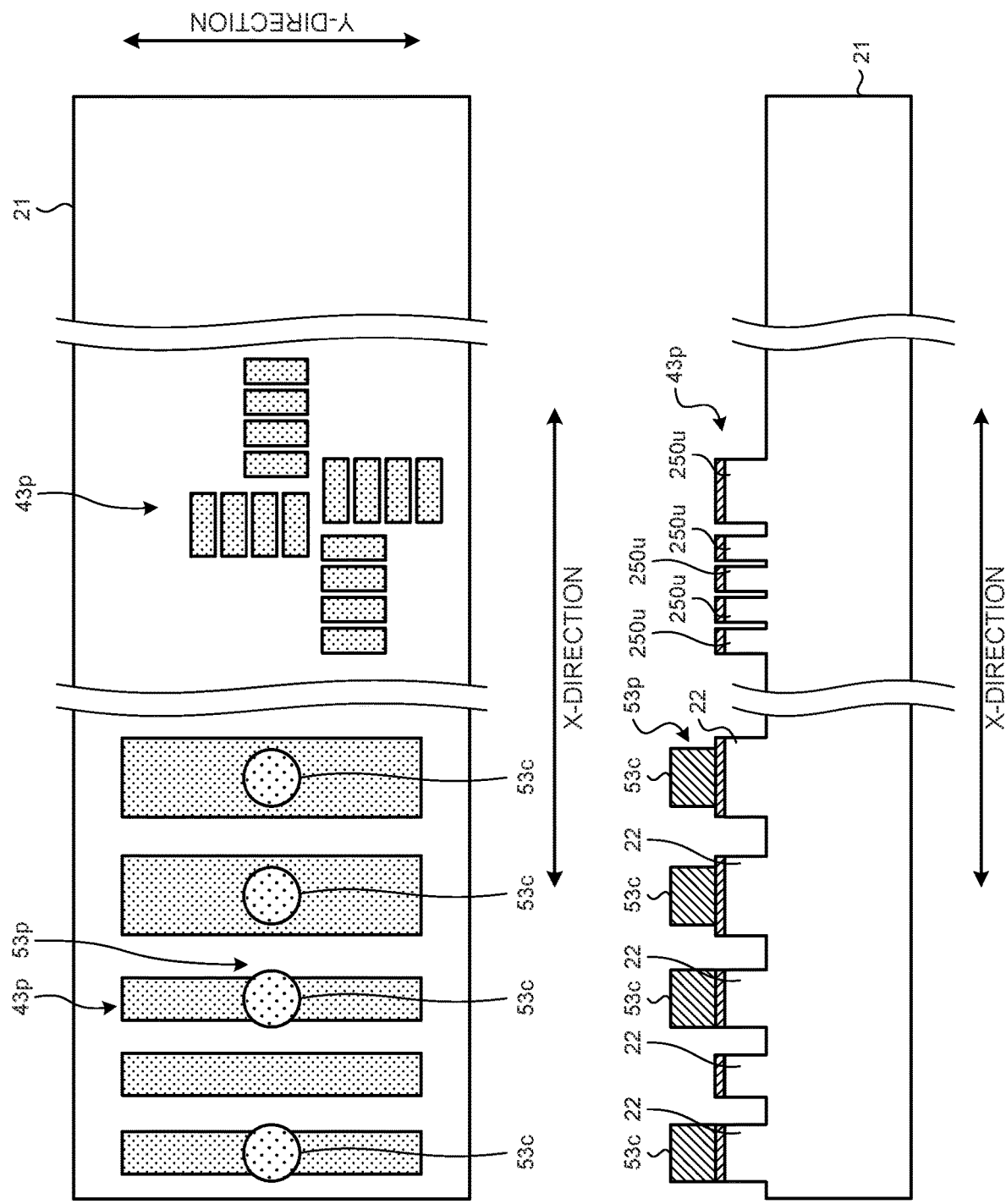

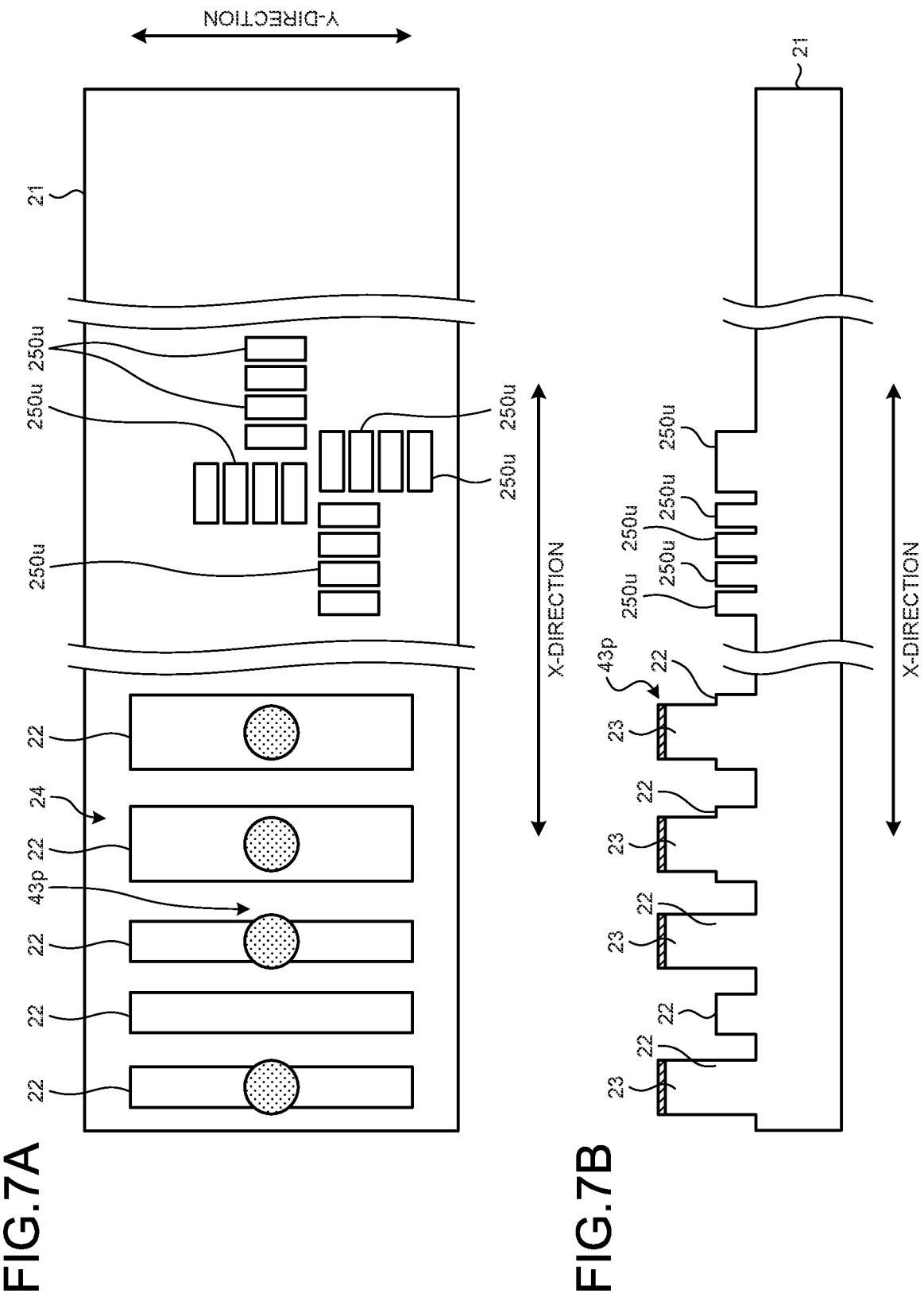

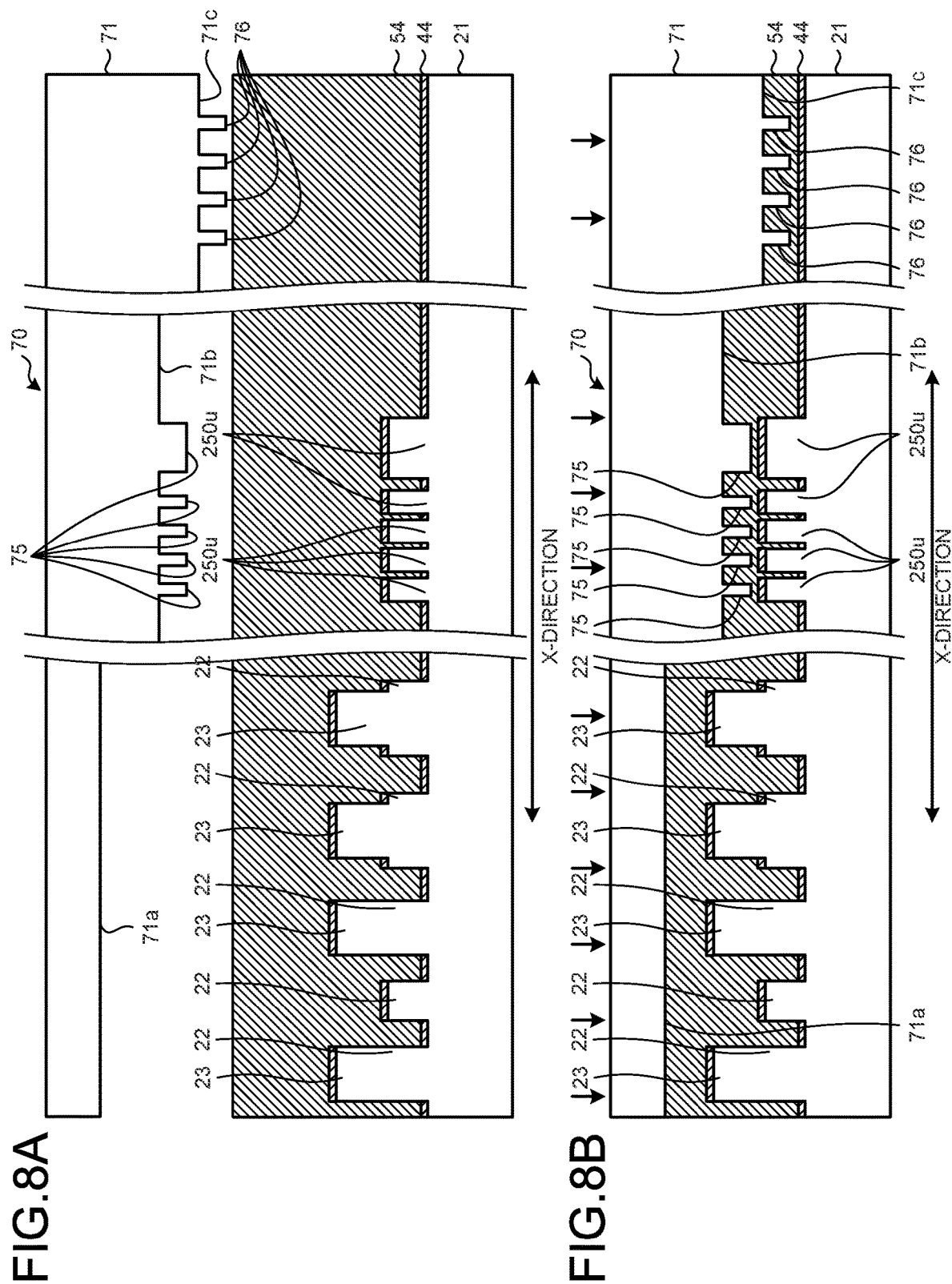

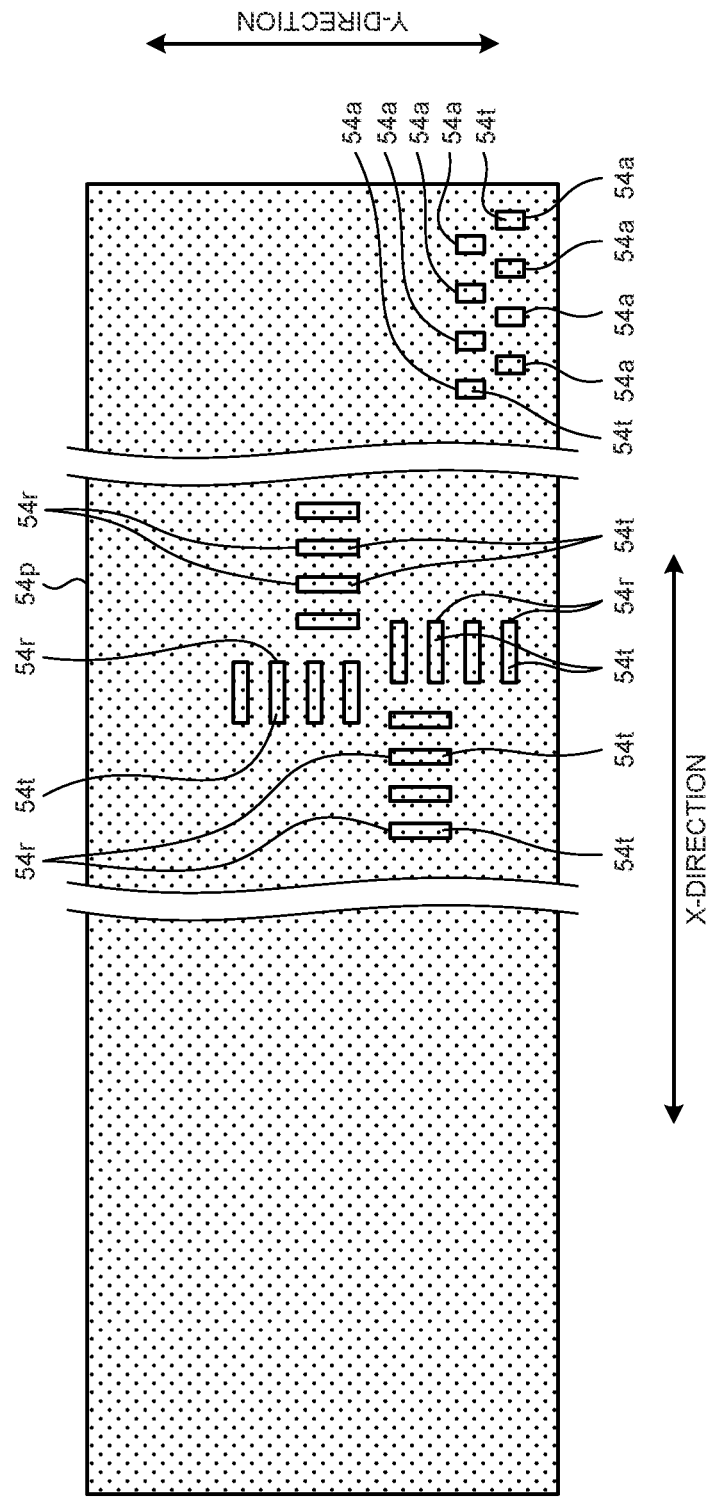
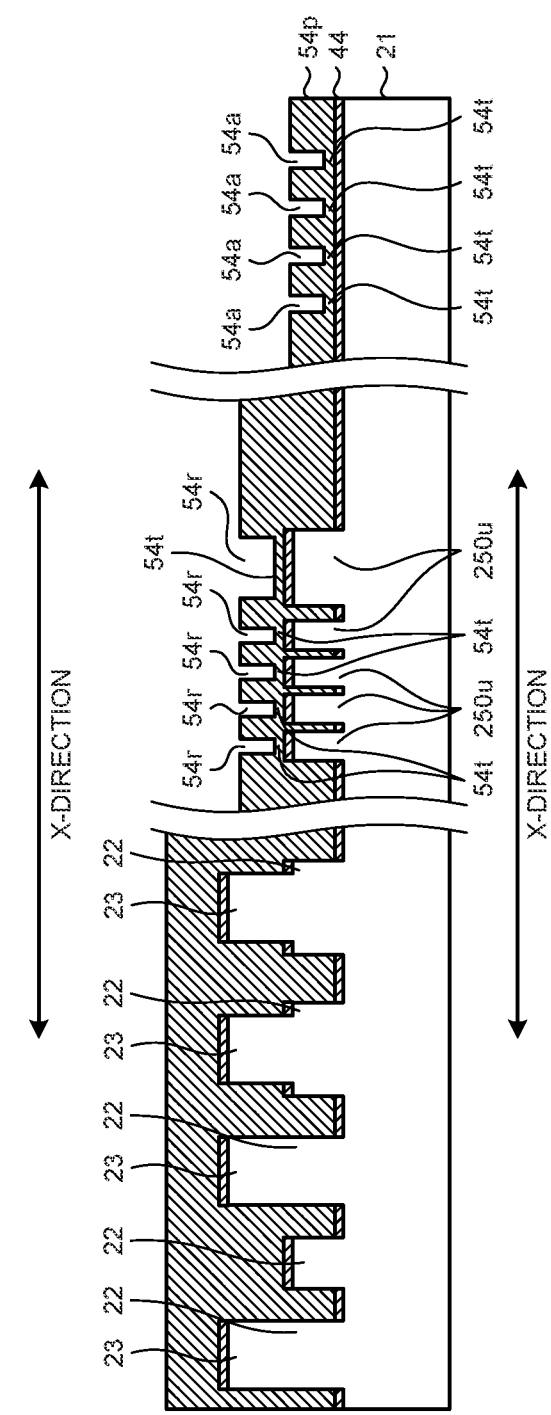

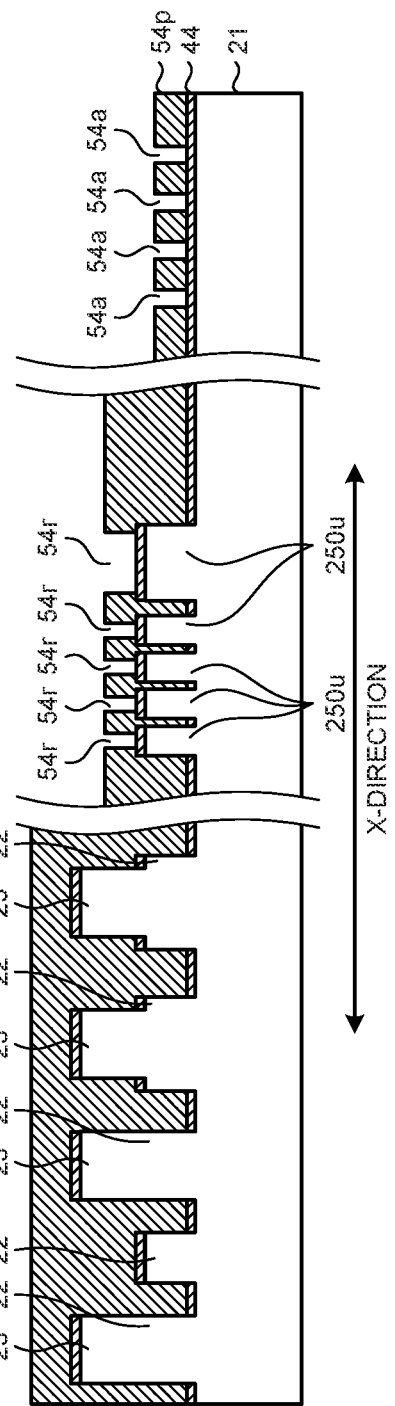
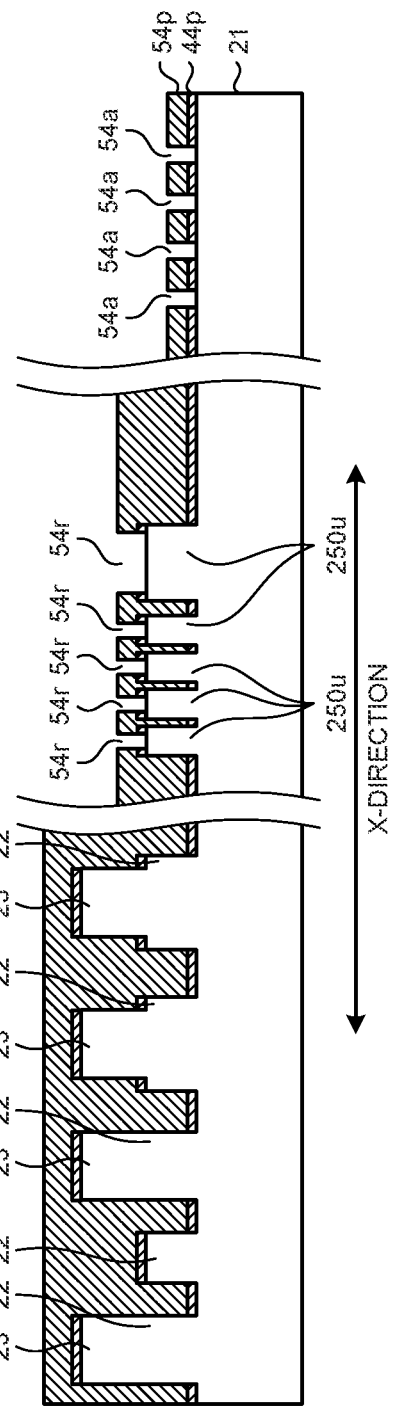

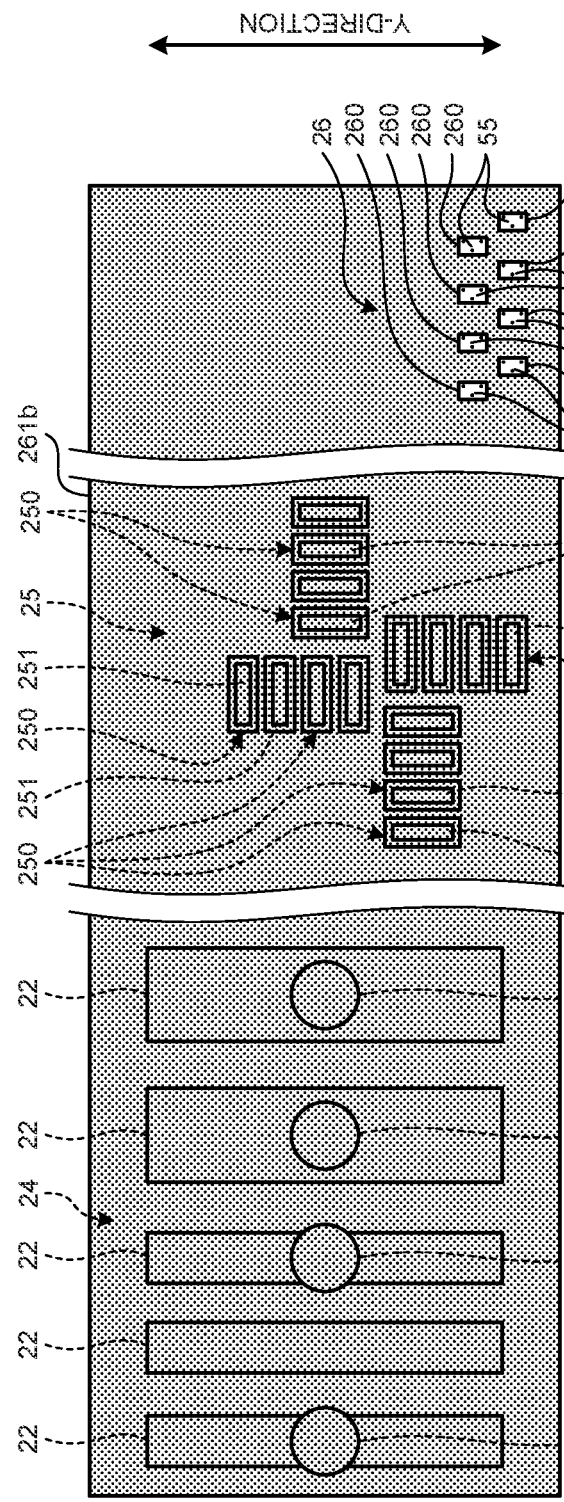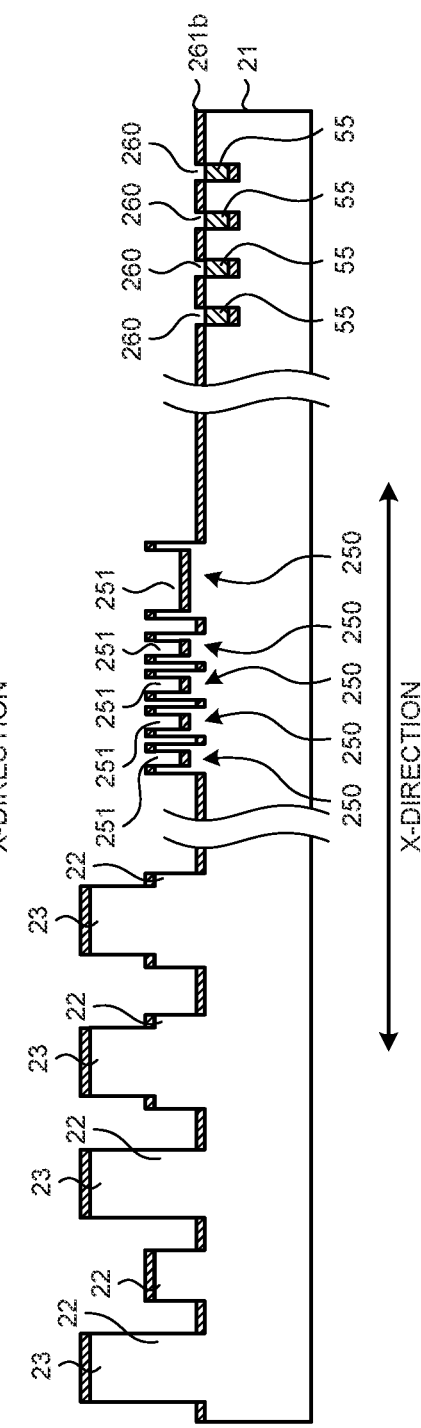
FIG.13A
FIG.13B

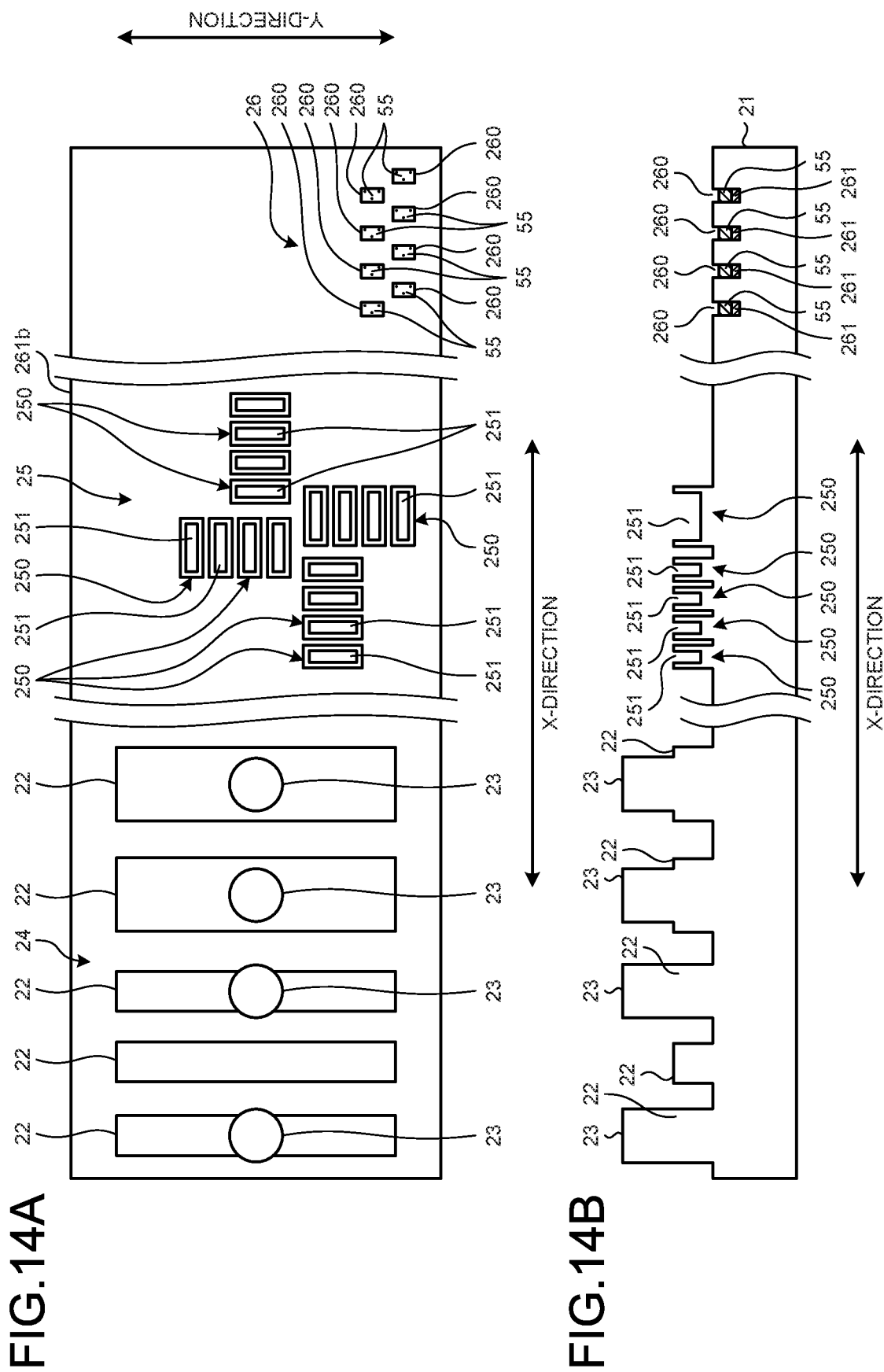

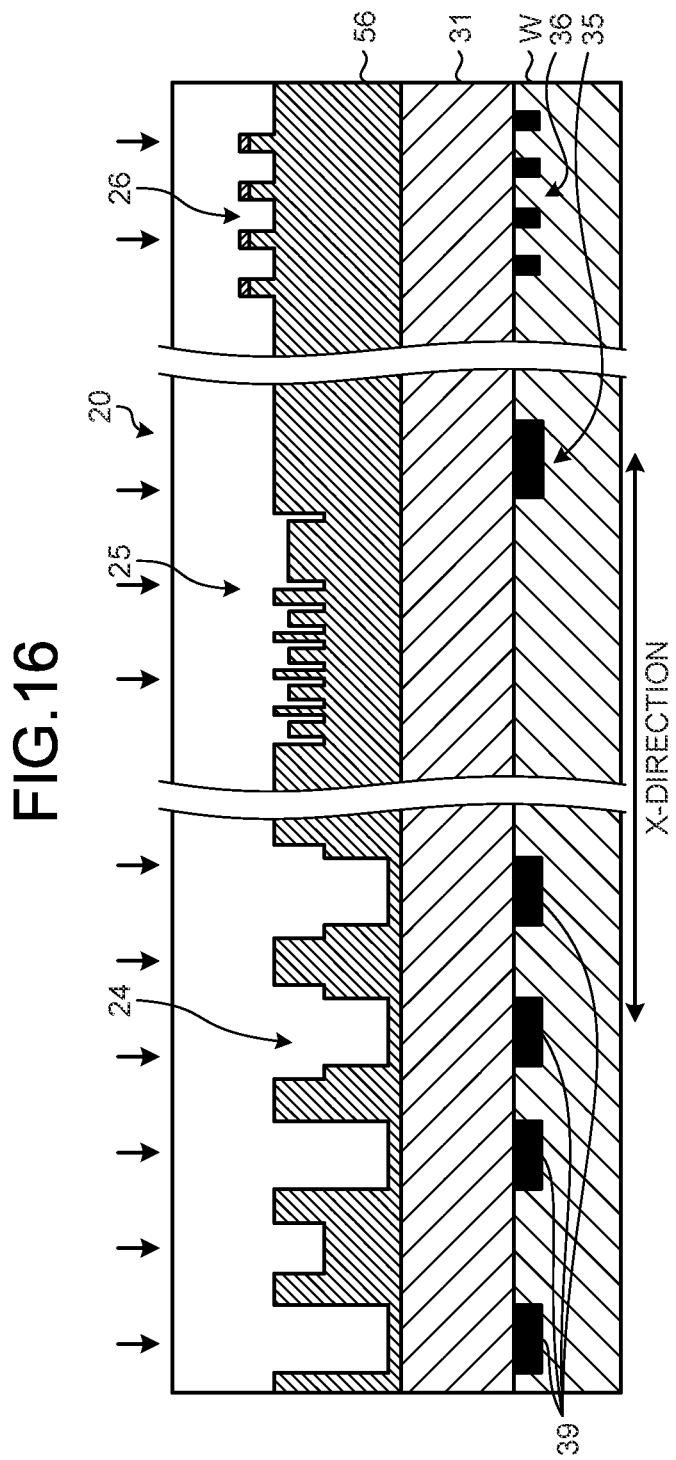

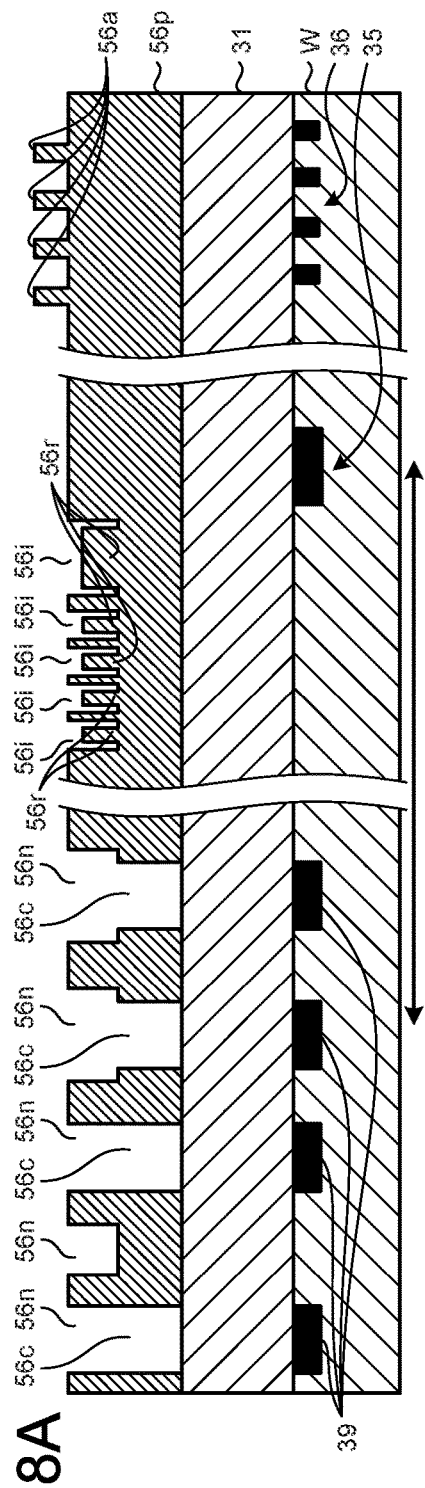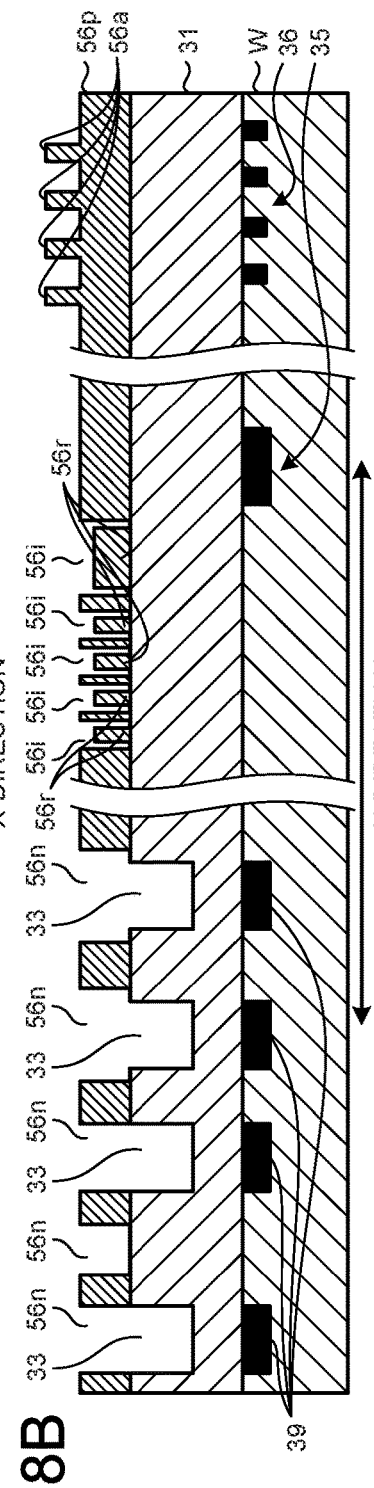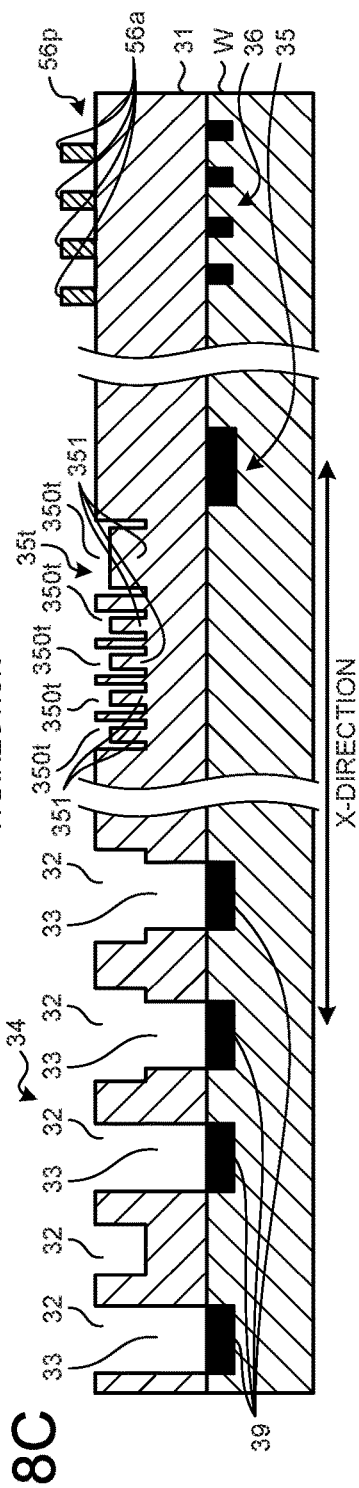

TEMPLATE, MANUFACTURING METHOD OF TEMPLATE, AND MANUFACTURING METHOD OF SEMICONDUCTOR DEVICE

CROSS-REFERENCE TO RELATED APPLICATIONS

This application is based upon and claims the benefit of priority from Japanese Patent Application No. 2021-042715, filed on Mar. 16, 2021; the entire contents of which are incorporated herein by reference.

FIELD

Embodiments described herein relate generally to a template, a mark, a manufacturing method of a template, and a manufacturing method of a semiconductor device.

BACKGROUND

A manufacturing process of a semiconductor device sometimes includes an imprinting process. In the imprinting process, for example, a pattern of a template is pressed against and transferred to a film such as a resin film disposed on a substrate.

On the template, marks for aligning, for example, the positions of the template and the substrate in a direction along a surface of the substrate are disposed on the template. Also, for example, a mark for detecting overlay misalignment of a transfer pattern with respect to the substrate is disposed on the template.

However, if the disposed positions of the marks and the pattern of the template are misaligned, sometimes it becomes difficult to specify the relative positions of the transfer pattern of the resin film and the substrate after the imprinting process.

BRIEF DESCRIPTION OF THE DRAWINGS

FIG. 1A to FIG. 1K are schematic diagrams illustrating outlines of a forming flow of wiring and vias by a dual damascene method using an imprinting process according to the embodiment;

FIG. 2A and FIG. 2B are diagrams illustrating an example of a configuration of a template according to the embodiment;

FIG. 3A and FIG. 3B are diagrams illustrating an example of a procedure of a manufacturing method of the template according to the embodiment;

FIG. 4A and FIG. 4B are diagrams illustrating the example of the procedure of the manufacturing method of the template according to the embodiment;

FIG. 5A and FIG. 5B are diagrams illustrating the example of the procedure of the manufacturing method of the template according to the embodiment;

FIG. 7A and FIG. 7B are diagrams illustrating the example of the procedure of the manufacturing method of the template according to the embodiment;

FIG. 8A and FIG. 8B are diagrams illustrating the example of the procedure of the manufacturing method of the template according to the embodiment;

FIG. 9A and FIG. 9B are diagrams illustrating the example of the procedure of the manufacturing method of the template according to the embodiment;

FIG. 10A and FIG. 10B are diagrams illustrating the example of the procedure of the manufacturing method of the template according to the embodiment;

FIG. 13A and FIG. 13B are diagrams illustrating the example of the procedure of the manufacturing method of the template according to the embodiment;

FIG. 14A and FIG. 14B are diagrams illustrating the example of the procedure of the manufacturing method of the template according to the embodiment;

FIG. 16 is a diagram illustrating the example of the procedure of the imprinting process using the template according to the embodiment;

FIG. 18A to FIG. 18C are diagrams illustrating an example of a procedure of a forming method of the dual damascene structure according to the embodiment;

DETAILED DESCRIPTION

Figure 6A:
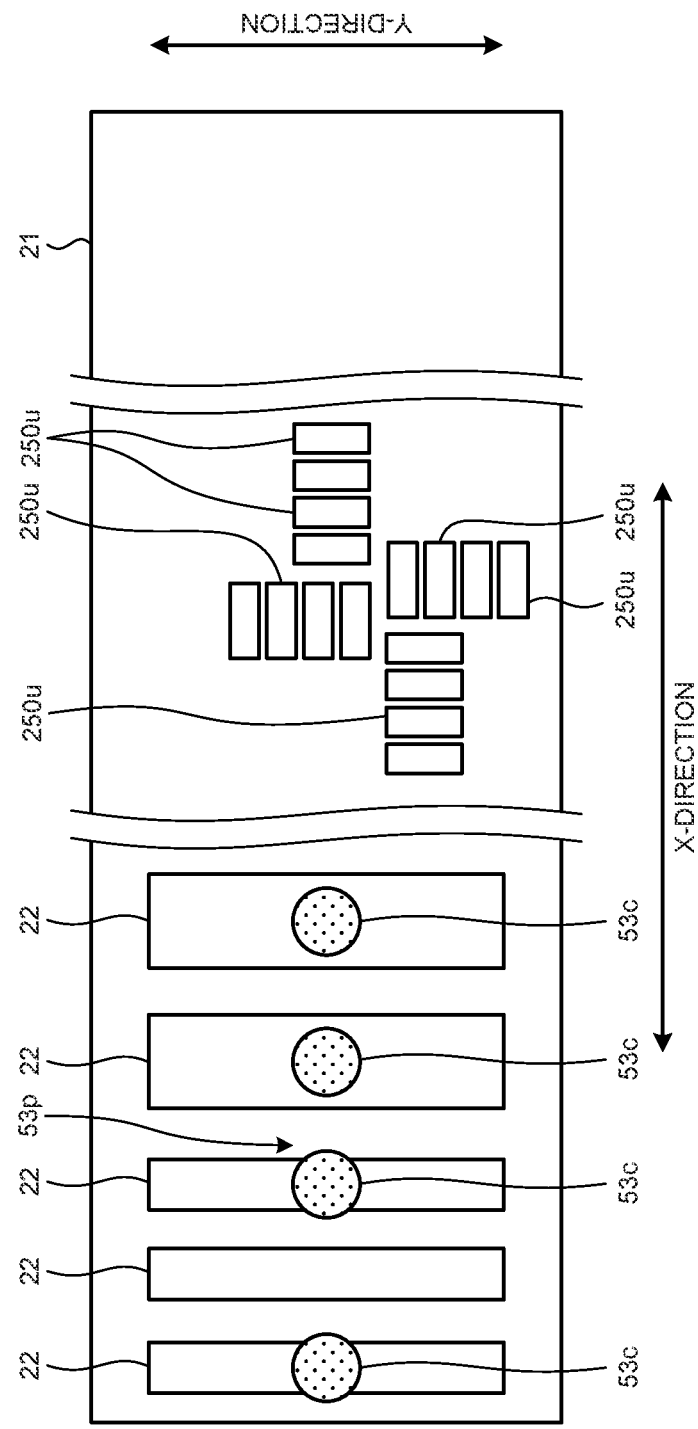
FIG. 6A and FIG. 6B are diagrams illustrating the example of the procedure of the manufacturing method of the template according to the embodiment.

In general, according to one embodiment, a template is provided with: a first substrate; a pattern projected from a principal surface of the first substrate; a first mark projected from the principal surface of the first substrate, the first mark surrounding a recessed portion disposed in an inside region of the first mark; and a second mark recessed from the principal surface of the first substrate; wherein the first mark is provided with, in a planar view, an inner portion having a pair of first sides opposed to each other and a pair of second sides opposed to each other, the first sides extending in a first direction along the first substrate, the second sides extending in a second direction intersecting with the first direction along the first substrate, the inner portion surrounding the recessed portion of the first mark, and an outer portion having a pair of third sides opposed to each other and a pair of fourth sides opposed to each other, the third sides extending in the first direction, the fourth sides extending in the second direction, the outer portion being an outer edge portion of the first mark.

Exemplary embodiments of the present invention will be explained below in detail with reference to the accompanying drawings. The present invention is not limited to the following embodiments. The constituent elements in the below described embodiments include those that are easily conceivable for those skilled in the art or practically the same elements.

(Forming Flow of Dual Damascene Structure)

In a manufacturing process of a semiconductor device, a dual damascene method is sometimes used in formation of vias and wiring. In the dual damascene method, an insulating film such as a $SiO_2$ film is engraved to form holes and trenches disposed above the holes, the holes and trenches are filled with an electrically conductive material, and vias and wiring to be connected to the vias are formed collectively.

In a semiconductor device of an embodiment, for example, a dual damascene structure including vias and wiring connected to the vias is formed by using an imprinting method. Outlines thereof are illustrated in FIG. 1A to FIG. 1K.

FIG. 1A to FIG. 1K are schematic diagrams illustrating outlines of a forming flow of wiring 62 and vias 63 by a dual damascene method using an imprinting process according to the embodiment. Note that the diagrams illustrated in FIG. 1A to FIG. 1K are simplified diagrams and are not necessarily precisely expressing respective constituents.

As illustrated in FIG. 1A to FIG. 1K, in the embodiment, first, a master template 10 is manufactured. Templates 20 are mass-produced from the master template 10, and a dual damascene structure 64 is formed on a semiconductor device 30 by using the template 20.

FIG. 1A to FIG. 1D are perspective views illustrating outlines of a manufacturing method of the master template 10 of the embodiment.

As illustrated in FIG. 1A, a mask film 41 such as a chromium film is formed on a substrate 11, which includes a transparent member such as quartz, and a resist pattern 51p having a hole pattern is formed on the mask film 41.

As illustrated in FIG. 1B, the mask film 41 is subjected to etching while using the resist pattern 51p as a mask to form a mask pattern 41p, which has a hole pattern. Also, the substrate 11 is subjected to etching while using the mask pattern 41p as a mask to form holes 13 in the substrate 11. In this process, for example, the resist pattern 51p disappears.

As illustrated in FIG. 1C, a resist pattern 52p, which has a trench pattern at a position overlaid with the hole pattern on the mask pattern 41p, is formed. Also, the mask pattern 41p is subjected to etching while using the resist pattern 52p as a mask to form a trench pattern on the mask pattern 41p.

As illustrated in FIG. 1D, the substrate 11 is subjected to etching while using the mask pattern 41p as a mask to form trenches 12 at the positions overlaid with the holes 13 of the substrate 11. As a result, the trenches 12, which are recessed from an upper surface of the substrate 11, and the recessed pattern 14, which is provided with the holes 13 extending downward further from bottom surfaces of the trenches 12, are formed. In this process, for example, the resist pattern 52p disappears. Also, the mask pattern 41p on the substrate 11 is removed.

In the above described manner, the master template 10 of the embodiment is manufactured.

FIG. 1E to FIG. 1H are perspective views illustrating outlines of the manufacturing method of the template 20 of the embodiment.

As illustrated in FIG. 1E, a mask film 43 such as a chromium film is formed on a substrate 21, which includes a transparent member such as quartz, the recessed pattern 14 of the master template 10 is transferred thereto, and a resist pattern 53p, which has a line pattern and a columnar pattern projecting from the line pattern, is formed.

As illustrated in FIG. 1F, the mask film 43 is subjected to etching while using the resist pattern 53p as a mask to form a mask pattern 43p, which has a line pattern. Also, the substrate 21 is subjected to etching while using the mask pattern 43p as a mask to form line portions 22 on the substrate 21. In this process, for example, the resist pattern 53p except for the part of the columnar pattern disappears, and the resist pattern 53p, which has the columnar pattern on the line pattern of the mask pattern 43p, remains.

As illustrated in FIG. 1G, the mask pattern 43p is subjected to etching while using the resist pattern 53p as a mask to form a mask pattern 43p, which has a columnar pattern. Also, the substrate 21 is subjected to etching while using the mask pattern 43p as a mask to form columnar portions 23 on the line portions 22 of the substrate 21. As a result, the line portions 22, which are projecting from the upper surface of the substrate 21, and a protruding pattern 24, which is provided with the columnar portions 23 projecting further from upper surfaces of the line portions 22, are formed. In this process, for example, the resist pattern 53p disappears.

As illustrated in FIG. 1H, the mask pattern 43p remaining on upper surfaces of the columnar portions 23 of the substrate 21 is removed.

In the above described flow, the template 20 of the embodiment is manufactured.

FIG. 1I to FIG. 1K are perspective views illustrating outlines of a forming method of the dual damascene structure 64 on the semiconductor device 30 of the embodiment.

As illustrated in FIG. 1I, the semiconductor device 30 during manufacturing is provided with a process target film 31 such as a $SiO_2$ film. The protruding pattern 24 of the template 20 is transferred onto the process target film 31, and a trench pattern and a resist pattern 56p, which has a hole pattern extending downward from bottom surfaces of the trench pattern, are formed.

As illustrated in FIG. 1J, the substrate 21 is subjected to etching while using the resist pattern 56p as a mask to form a recessed pattern 34 provided with a trench pattern 32, which is recessed from the upper surface of the substrate 21, and a hole pattern 33, which is extending downward further from bottom surfaces of the trench pattern 32, on the process target film 31. Also, the resist pattern 56p on the process target film 31 is removed.

As illustrated in FIG. 1K, the hole pattern 33 of the process target film 31 is filled with an electrically conductive material such as copper or tungsten to form vias 63. Also, the trench pattern 32 of the process target film 31 is filled with an electrically conductive material to form the wiring 62. As a result, the dual damascene structure 64 provided with the vias 63 and the wiring 62 is formed on the semiconductor device 30.

Meanwhile, regarding the above described master template 10, for example, the holes 13 and the trenches 12 are formed in different processes by using the mutually different resist patterns 51p and 52p. In such a case, the holes 13 and the trenches 12 are formed in a positionally misaligned state in some cases because of misalignment of the formation position of the resist pattern 51p on the substrate 11 and the formation position of the resist pattern 52p on the substrate 11.

As described later in detail, the manufacturing method of the template 20 also includes processing of forming plural constituents on the template 20 in different processes. In the following embodiment, means for solving the problems of the positional misalignment in the template 20 will be described among the positional misalignments that can occur in the master template 10 and the template 20.

(Configuration Example of Template)

Next, by using FIG. 2A and FIG. 2B, a configuration example of the template 20 of the embodiment will be described. The template 20 of the embodiment is, for example, a replica template of a mass-production type manufactured by using the above described master template 10.

FIG. 2A and FIG. 2B are diagrams illustrating an example of a configuration of the template 20 according to the embodiment. FIG. 2A is a plan view of a side on which the protruding pattern 24, etc. of the template 20 are disposed. FIG. 2B is a cross-sectional view of the template 20. More specifically, FIG. 2B includes, sequentially from the left side of the paper surface, an A-A-line cross-sectional view of the protruding pattern 24 of FIG. 2A, a B-B-line cross-sectional view of an overlay mark 25 of FIG. 2A, and a C-C-line cross-sectional view of an alignment mark 26 of FIG. 2A.

Note that, in the present specification, both of an X-direction and a Y-direction are the directions along a direction of a principal surface of the substrate 21 of the template 20, and the X-direction and the Y-direction are orthogonal to each other. Also, the direction along one side of the rectangular substrate 21 may be referred to as a first direction, and the first direction is a direction in the X-direction. Also, a direction which is along another side adjacent to the above described side of the rectangular substrate 21 and intersects with the first direction may be referred to as a second direction. The second direction is a direction in the Y-direction. However, since constituents of the template 20 may include manufacturing errors, the first direction and the second direction are not necessarily orthogonal to each other.

As illustrated in FIG. 2A and FIG. 2B, the template 20 is provided with the substrate 21, the protruding pattern 24, the overlay mark 25, and the alignment mark 26.

FIG. 2A and FIG. 2B illustrates a state in which one set of the protruding pattern 24, the overlay mark 25, and the alignment mark 26 is disposed on the substrate 21 of the template 20. However, plural sets of these constituents may be disposed on the single template 20. A different number of each of these constituents may be disposed on the template 20.

The substrate 21 as a first substrate, for example, has a rectangular flat-plate-like shape and includes a transparent member such as quartz.

The protruding pattern 24 is projecting from the upper surface, which is one of the principal surfaces of the substrate 21, and is transferred to a resist film or the like disposed on a wafer. The protruding pattern 24 is provided with, for example, the plural line portions 22, which are extending in the Y-direction, and the plural columnar portions 23, which are projecting from upper surfaces of the line portions 22. A cross section of the columnar portion 23 in the direction along the surface of the substrate 21 has, for example, a circular, elliptical, or oblong (oval) shape.

The overlay mark 25, for example, is disposed in a region outside the protruding pattern 24 and includes plural inspection marks 250. The plural inspection marks 250 are disposed in an approximately cross shape. Alternatively, it can be also said that the plural inspection marks 250 are disposed in a shape like a windmill in which center points of respective sides of a cross are mutually shifted.

By virtue of this, the overlay mark 25 is used to detect, for example, a misalignment amount of the protruding pattern 24, which is overlaid with a wafer, with respect to the wafer after the protruding pattern 24 is transferred to a resist film on the wafer. Such a misalignment amount is referred to as an overlay misalignment amount, an overlay misalignment amount, or the like.

The inspection mark 250 as a first mark projects from the upper surface of the substrate 21 and surrounds a recessed portion 251, which is disposed in an inside region of the inspection mark 250. In other words, a recessed part in the inside region of an upper surface of the inspection mark 250 is the recessed portion 251. Ideally, the recessed portion 251 is disposed at a central portion of the upper surface of the inspection mark 250. In other words, a center point of the recessed portion 251 expressed by a position in the X-direction and the Y-direction ideally matches a center point of the inspection mark 250 expressed by a position in the X-direction and the Y-direction. The height of a bottom surface of the recessed portion 251 may be higher or lower than the upper surface of the substrate 21 or may be the same height as the upper surface of the substrate 21.

Also, the inspection mark 250 is provided with an inner portion 252, which sections the recessed portion 251 of the inspection mark 250, and an outer portion 253, which constitutes an outer edge portion of the inspection mark 250.

In a planar view, the inner portion 252 is formed in a rectangle having sides 252x and 252x serving as a pair of first sides, which extend in the X-direction and are opposed to each other, and sides 252y and 252y serving as a pair of second sides, which extend in the Y-direction and are opposed to each other. The inner portion 252 sections the recessed portion 251 by surrounding the recessed portion 251 with the four sides 252x, 252y, 252x, and 252y in this order. Note that, when the inner portion 252 is viewed three dimensionally, these sides 252x, 252y, 252x, and 252y can be also assumed as faces which constitute inner lateral walls of the inner portion 252.

As described later, by using these four sides, the inner portion 252 is used to detect a position of the protruding pattern 24 in the X-direction and the Y-direction with respect to the wafer after the transfer onto the resist film on the wafer.

In a planar view, the outer portion 253 is formed in a rectangle having sides 253x and 253x serving as a pair of third sides, which extend in the X-direction and are opposed to each other, and sides 253y and 253y serving as a pair of fourth sides, which extend in the Y-direction and are opposed to each other. The outer portion 253 constitutes the outer edge portion of the inspection mark 250 by surrounding the inner portion 252 with the four sides 253x, 253y, 253x, and 253y in this order. Note that, when the outer portion 253 is viewed three dimensionally, these sides 253x, 253y, 253x, and 253y can be also assumed as faces which constitute outer lateral walls of the outer portion 253.

As described later, by using these four sides, the outer portion 253 is used to detect overlay misalignment of the protruding pattern 24 with respect to the wafer after the transfer onto the resist film on the wafer.

The alignment mark 26, for example, is disposed in a region outside the protruding pattern 24 and includes plural alignment marks 260. The plural alignment marks 260 are arranged, for example, in one row or in plural rows in the X-direction.

By virtue of this, the alignment mark 26 is used to align a transfer position of the protruding pattern 24 in the X-direction and the Y-direction with respect to the wafer when the protruding pattern 24 is to be transferred onto the resist film on the wafer.

The alignment mark 260 serving as a second mark is configured to be in a state that the mark is recessed from the upper surface of the substrate 21. In other words, a bottom surface of the alignment mark 260 is at a position lower than the upper surface of the substrate 21. Also, the depth from the upper surface of the substrate 21 to the bottom surface of the alignment mark 260 is approximately equal to the depth from the upper surface of the inspection mark 250 to the bottom surface of the recessed portion 251. A heterogeneous film 261 such as a chromium film is disposed on the bottom surface of the alignment mark 260. In other words, the heterogeneous film 261 includes a material which is different from the constituent material of the substrate 21. By virtue of this, in a case in which the alignment mark 260 is observed for alignment, the alignment mark 260 can be easily distinguished.

In a planar view, the alignment mark 260 is formed in, for example, a rectangle provided with four sides, i.e., a pair of sides, which extend in the X-direction and are opposed to each other, and a pair of sides, which extend in the Y-direction and are opposed to each other. Note that, when the alignment mark 260 is viewed three dimensionally, these sides can be also assumed as faces which constitute inner lateral walls of the alignment mark 260.

By virtue of this, as described later, the alignment marks 260 are used to align the X-direction and Y-direction position of the protruding pattern 24 before the transfer with respect to the wafer. In other words, the alignment marks 260 are used in the alignment of the protruding pattern 24 and the wafer.

Meanwhile, among the protruding pattern 24, the overlay mark 25, and the alignment mark 26 provided on the template 20, only the alignment mark 26 has a recessed pattern in order to dispose the heterogeneous film 261, which improves distinguishability. In the manufacturing process of the template 20, it is difficult to collectively form protruding constituents and recessed constituents. Therefore, the alignment mark 26 is formed separately from, for example, the protruding pattern 24 and the overlay mark 25. Hereinafter, details thereof will be described.

(Manufacturing Method of Template)

Next, the manufacturing method of the template 20 of the embodiment will be described by using FIG. 3A to FIG. 14B. FIG. 3A to FIG. 14B are diagrams illustrating an example of a procedure of the manufacturing method of the template 20 according to the embodiment.

FIG. 3A to FIG. 7B illustrate processes of forming in batch, on the substrate 21, the protruding pattern 24, which is a pattern projecting from the upper surface of the substrate 21 and to be transferred to the resist film disposed on the wafer, and projecting portions 250u, which have outer shapes corresponding to the outer shapes of the outer portions 253 constituting the outer edge portions of the inspection marks 250 and project from the upper surface of the substrate 21. Details of FIG. 3A to FIG. 7B will be described below.

As illustrated in the plan view of FIG. 3A and the cross-sectional view of FIG. 3B, a mask film 53 such as a chromium film is formed on the substrate 21, which includes a transparent member such as quartz. The resist pattern 53p is formed on the mask film 53, for example, by an imprinting process using the above described master template 10.

The resist pattern 53p includes, for example, a photo-curing resin or the like. Other than that, as the resist pattern to be subjected to the imprinting process, a thermosetting resin or the like can be also used. However, an organic material other than them may be used as long as the material functions as a mask of the substrate 21 when the substrate 21 is subjected to etching as described later.

As described above, the master template 10 has the recessed pattern 14. Also, the master template 10 is provided with another recessed pattern disposed in an outside region of the recessed pattern 14 although the description thereof has been omitted in the above described manufacturing method of FIG. 1A to FIG. 1D.

The resist pattern 53p has a protruding line pattern 53n and a protruding columnar pattern 53c to which the recessed pattern 14 of the master template 10 has been transferred. The columnar pattern 53c is disposed on an upper surface of the line pattern 53n. The line pattern 53n is a pattern which is to be transferred to the substrate 21 and become the line portions 22, and the columnar pattern 53c is a pattern which is to be transferred to the substrate 21 and serve as the columnar portions 23.

Also, the resist pattern 53p has a protruding block pattern 53i to which the other recessed pattern of the master template 10 is transferred. The block pattern 53i is a pattern which is to be transferred to the substrate 21 and constitute part of the inspection marks 250.

Also, the resist pattern 53p has a resist residual film 53t, which is a thin film of resist, between the protruding portions of the line pattern 53n, the columnar pattern 53c, and the block pattern 53i. When the recessed pattern 14 of the master template 10 is to be transferred, in order to avoid contact between the master template 10 and the mask film 43, a gap is provided therebetween. The resist residual film 53t is a resist film remaining in the gap therebetween.

The template 20 is, for example, a replica template repeatedly used in the manufacturing process of the semiconductor device 30 and is a consumable item which wears intensely. Therefore, as described above, the template 20 can be manufactured easily at low cost, for example, by mass-producing the templates from the master template 10.

As illustrated in a cross-sectional view of FIG. 4A, the resist residual film 53t is removed, for example, by subjecting the resist pattern 53p to etch back.

As illustrated in a cross-sectional view of FIG. 4B, the mask film 43 is subjected to etching while using the resist pattern 53p as a mask to form the mask pattern 43p to which line pattern 53n, the columnar pattern 53c, and the block pattern 53i of the resist pattern 53p are transferred.

As illustrated in a plan view of FIG. 5A and a cross-sectional view of FIG. 5B, the substrate 21 is subjected to etching while using the mask pattern 43p as a mask. As a result, the upper surface of the substrate 21 exposed from the mask pattern 43p is dug down, and a new upper surface is exposed. Also, the line portions 22, which are projecting from the new upper surface of the substrate 21, and the projecting portions 250u, which are projecting from the new upper surface of the substrate 21, are formed. In this process, the dug-down amount of the substrate 21 is, for example, caused to be equivalent to the height of the line portions 22 of the template 20.

The projecting portions 250u are formed to have, for example, outer shapes which match the outer shapes of the inspection marks 250 in the region in which the inspection marks 250 are to be formed. More specifically, in the projecting portions 250u, the recessed portions 251 correspond to the unformed inspection marks 250.

Note that, in the above described process, the part of the resist pattern 53p excluding the columnar pattern 53c disappears. The remaining columnar pattern 53c becomes a state in which the columnar pattern is disposed on the line portions 22 of the substrate 21 via the mask pattern 43p.

Figure 6B:
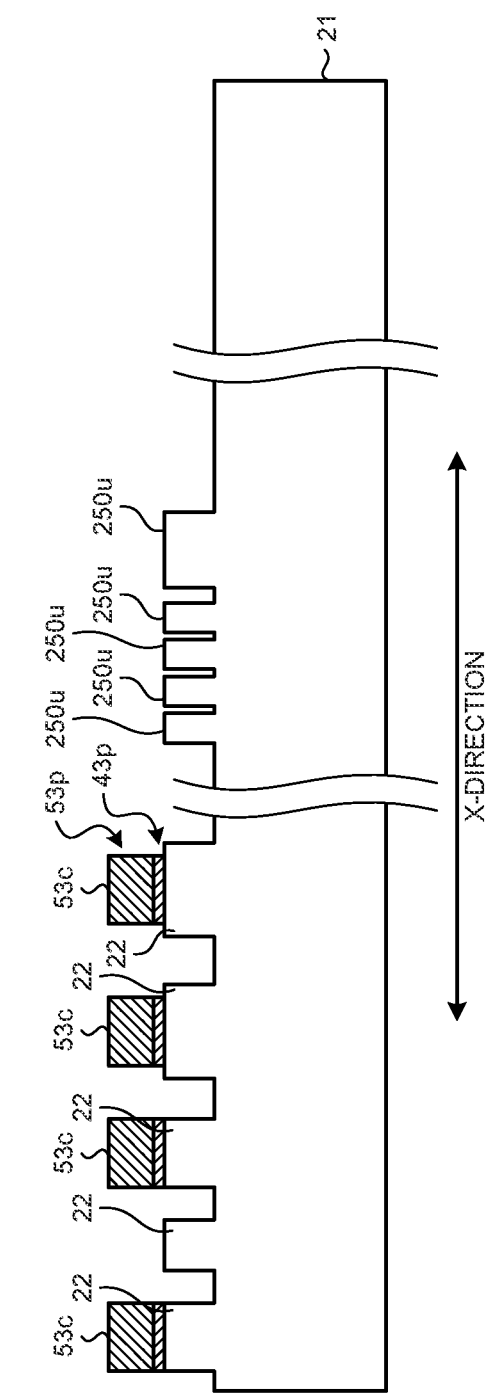

As illustrated in a plan view of FIG. 6A and a cross-sectional view of FIG. 6B, the mask pattern 43p is further subjected to etching while using the resist pattern 53p as a mask to form the mask pattern 43p to which the columnar pattern 53c of the resist pattern 53p has been transferred.

As illustrated in a plan view of FIG. 7A and a cross-sectional view of FIG. 7B, the substrate 21 is subjected to etching while using the mask pattern 43p as a mask.

As a result, the upper surface of the substrate 21, which has been exposed in the process of FIG. 5A and FIG. 5B, is further dug down, and a new upper surface is exposed. In this process, the dug-down amount of the substrate 21 is, for example, caused to be equivalent to the height of the columnar portion 23 from the upper surface of the line portion 22 of the template 20. The newly exposed upper surface is maintained, for example, until the manufacturing process of the template 20 is finished. In other words, the newly exposed upper surface is a surface which is practically the same as the upper surface serving as the principal surface of the substrate 21 of the template 20.

Also, by the above described etching, the line portions 22 and the projecting portions 250u formed in the process of FIG. 5A and FIG. 5B are subjected to etch back, and the line portions 22 and the projecting portions 250u projecting from the new upper surface of the substrate 21 are formed. In other words, when the projecting portions 250u are formed in this manner, the four sides of the outer portion 253 of the inspection mark 250 are formed as a result at this point of time.

Also, at the part that is protected by the mask pattern 43p, the line portions 22 are not subjected to etch back, and the height thereof is maintained. Therefore, the columnar portions 23, which project from the upper surfaces of the line portions 22, are formed.

The line portions 22 and the columnar portions 23 formed herein are maintained, for example, until the manufacturing process of the template 20 finishes. In other words, at this point of time, the protruding pattern 24 of the template 20 including the line portions 22 and the columnar portions 23 is formed.

Note that, in the above described process, the resist pattern 53p disappears.

FIG. 8A to FIG. 11B illustrate the processes of forming in batch the alignment marks 260, which are recessed from the upper surface of the substrate 21, and the inspection marks 250, which have the recessed portions 251 in the inside region of the upper surface, on the substrate 21. As described above, the projecting portions 250u have the outer shapes corresponding to the outer shapes of the outer portions 253 of the inspection marks 250. The inspection marks 250 are formed by recessing the inside regions of the upper surfaces of the projecting portions 250u and forming the recessed portions 251. Details of FIG. 8A to FIG. 11B will be described below.

As illustrated in a cross-sectional view of FIG. 8A, a mask film 44 such as a chromium film is formed across the entire surface of the substrate 21. On the mask film 44, a resist film 54 as a mask film is formed, for example, by applying a photo-curing resin or the like by spin application (spin coating) or the like. By carrying out spin application of the liquid photo-curing resin or the like, the entirety of the line portions 22, the columnar portions 23, and the projecting portions 250u formed on the upper surface of the substrate 21 is covered, and the resist film 54 having an approximately flat upper surface is formed across the entire surface of the substrate 21. The resist film 54, which has undergone spin application, is still liquid and maintains fluidity at this point of time.

Also, in order to subject the resist film 54 to pattern transfer by an imprinting process, a template 70 provided with patterns 75 and 76 is disposed above the substrate 21 on which the resist film 54 is formed. The template 70 is provided with a substrate 71, which has mutually different thicknesses in predetermined regions, and the template 70 is disposed so that a surface of the substrate 71 on which the patterns 75 and 76 are disposed faces the substrate 21.

The substrate 71 has a surface 71a in a region in which the thickness of the substrate 71 is the thinnest. The surface 71a is disposed so as to be opposed to the region of the substrate 21 in which the line portions 22 and the columnar portions 23 are formed.

The substrate 71 has a surface 71b in a region in which the thickness of the substrate 71 is at an intermediate degree. The pattern 75 is disposed on the surface 71b. The surface 71b is disposed so as to be opposed to the region in which the projecting portions 250u of the substrate 21 are formed. The pattern 75 is, for example, a pattern of protruding shapes slightly smaller than the individual projecting portions 250u. When the surface 71b of the substrate 71 is disposed so as to be opposed to the formation region of the projecting portions 250u, the pattern 75 is opposed to the individual projecting portions 250u.

The substrate 71 has a surface 71c in a region in which the thickness of the substrate 71 is the thickest. The pattern 76 is disposed on the surface 71c. The surface 71c is disposed so as to be opposed to a region outside the line portions 22, the columnar portions 23, and the projecting portions 250u of the substrate 21. The pattern 76 is a protruding pattern having plural projections.

As illustrated in a cross-sectional view of FIG. 8B, the template 70 is pressed against the resist film 54 on the substrate 21.

As a result, above the line portions 22 and the columnar portions 23 of the substrate 21, the surface 71a of the template 70 is disposed at a position distant from the substrate 21. Therefore, the film thickness of the resist film 54 interposed between the template 70 and the substrate 21 is maintained to be thick, and the resist film 54 still maintains the state in which the film covers the entirety of the line portions 22 and the columnar portions 23.

Also, above the projecting portions 250u of the substrate 21, the surface 71b of the template 70 is disposed at an intermediate distance from the substrate 21. Therefore, the pattern 75 of the template 70 is disposed in proximity of the upper surface of the projecting portions 250u having the mask pattern 44p. However, a gap is provided therebetween so that the projecting surface of the pattern 75 and the mask pattern 44p of the upper surface of the projecting portions 250u do not contact each other. By virtue of this, collision between the pattern 75 and the projecting portions 250u is constrained, and damage thereof is constrained.

Also, above the region outside the line portions 22, the columnar portions 23, and the projecting portions 250u of the substrate 21, the surface 71c of the template 70 is disposed in the closest proximity to the substrate 21. Therefore, the pattern 76 of the template 70 is disposed in proximity of the upper surface of the substrate 21 which has the mask pattern 44p. However, a gap is provided therebetween so that the projecting surface of the pattern 76 and the mask pattern 44p of the upper surface of the substrate 21 do not contact each other. By virtue of this, collision between the pattern 76 and the substrate 21 is constrained, and damage thereof is constrained.

When the template 70 is maintained in the above described state, the resist film 54 is interposed between the template 70 and the substrate 21 and the recessed portions of the patterns 75 and 76 of the template 70 are filled with the resist film. After the patterns 75 and 76 are filled with the resist film 54, the resist film 54 on the substrate 21 is irradiated with ultraviolet light via the template 70. As a result, the resist film 54 is cured, and the patterns 75 and 76 of the template 70 are transferred to the resist film 54.

As illustrated in a plan view of FIG. 9A and a cross-sectional view of FIG. 9B, when the template 70 is released, a resist pattern 54p to which the patterns of 75 and 76 of the template 70 have been transferred is formed.

The resist pattern 54p as the mask pattern has mutually different thicknesses in predetermined regions and has a recessed pattern 54r to which the protruding pattern 75 of the template 70 has been transferred and a recessed pattern 54a to which the protruding pattern 76 of the template 70 has been transferred. A resist residual film 54t is disposed at bottom surfaces of the patterns 54r and 54a.

Above the line portions 22 and the columnar portions 23, the resist pattern 54p is formed to have a film thickness of a first thickness which is the thickest overall and covers the entirety of the line portions 22 and the columnar portions 23. Above the projecting portions 250u, the resist pattern 54p is formed to have a film thickness of a second thickness which is intermediate overall and has a pattern 54r, which later becomes the recessed portions 251. The pattern 54r is disposed at a position overlaid with the projecting portions 250u. Above the region outside the line portions 22, the columnar portions 23, and the projecting portion 250u, the resist pattern 54p is formed to have a film thickness of a third thickness which is the thinnest overall and has the pattern 54a which later becomes the alignment marks 260.

However, the resist pattern 54p may be formed by a method different from the imprinting process. As another method, for example, the resist pattern 54p can be formed by drawing a desired pattern on the resist film 54 by using electron-beam drawing or the like. In such a method, the template 20 can be manufactured at further lower cost since there is no need to prepare the template 70.

As illustrated in a cross-sectional view of FIG. 10A, the resist residual film 54t is removed, for example, by subjecting the resist pattern 54p to etch back.

As illustrated in a cross-sectional view of FIG. 10B, the mask film 44 is subjected to etching while using the resist pattern 54p as a mask to form the mask pattern 44p to which the patterns 54r and 54a of the resist pattern 54p have been transferred.

Figures 11A, 11B:
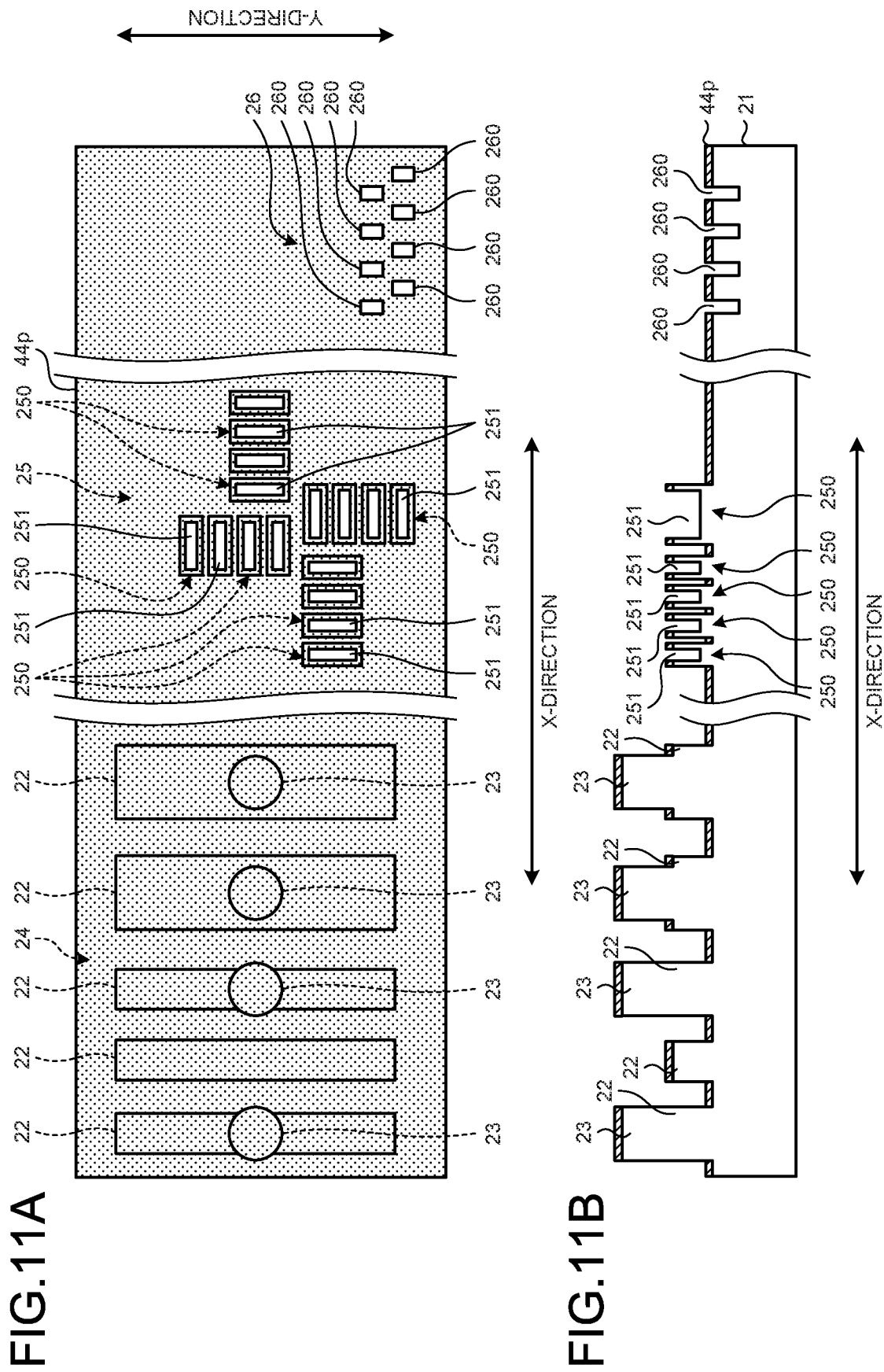
FIG. 11A and FIG. 11B are diagrams illustrating the example of the procedure of the manufacturing method of the template according to the embodiment.

As illustrated in a plan view of FIG. 11A and a cross-sectional view of FIG. 11B, the substrate 21 is subjected to etching while using the mask pattern 44p as a mask.

As a result, part of the upper surfaces of the projecting portions 250u which is exposed from the mask pattern 44p is dug down. In other words, the inside regions of the upper surfaces of the projecting portions 250u are recessed, and the plural inspection marks 250 which individually have the recessed portions 251 are formed. In this process, the dug-down amount of the upper surfaces of the projecting portions 250u may be arbitrarily determined so that the bottom surfaces of the recessed portions 251 are, for example, at a position higher than, a position lower than, or at an approximately same position as the upper surface of the substrate 21.

When the recessed portions 251 are formed in the projecting portions 250u in this manner, the inspection marks 250 are formed, and the inner portions 252, which section the recessed portions 251 of the inspection marks 250, are formed.

Also, in the region outside the line portions 22, the columnar portions 23, and the projecting portions 250u, the upper surface of the substrate 21 exposed from the mask pattern 44p is dug down, and the plural alignment marks 260 recessed from the upper surface of the substrate 21 are formed.

Herein, the formed inspection marks 250 constitute the overlay mark 25, and the alignment marks 260 constitute the alignment mark 26. In other words, at this point of time, the overlay mark 25 including the plural inspection marks 250 and the alignment mark 26 including the plural alignment marks 260 are formed.

Note that the resist pattern 54p disappears in the above described process. Also, the remaining mask pattern 44p is removed from above the substrate 21 thereafter.

FIG. 12A to FIG. 14B illustrate processes of forming, on the bottom surfaces of the individual alignment marks 260, the heterogeneous film 261 of a constituent material which is different from the substrate 21. Details of FIG. 12A to FIG. 14B will be described below.

Figure 12A:
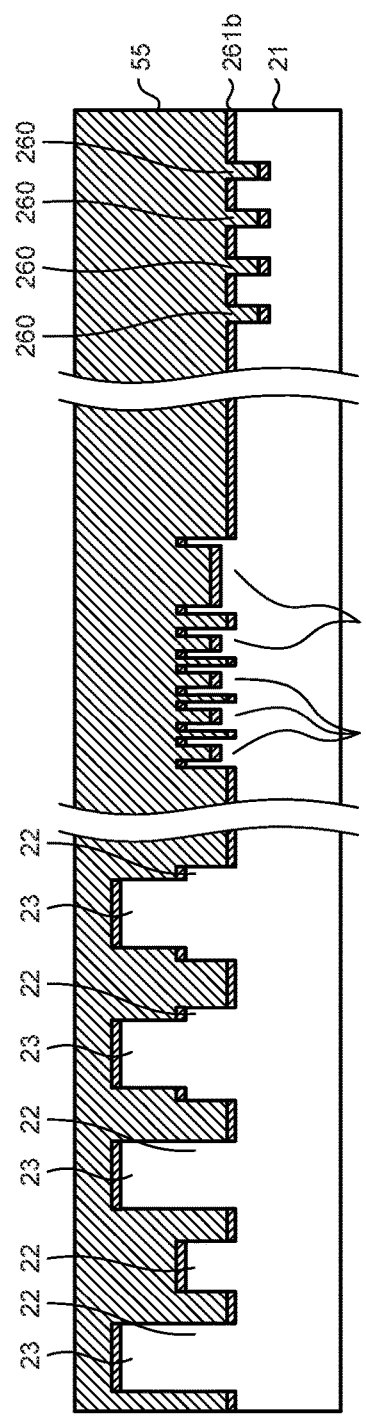
FIG. 12A to FIG. 12C are diagrams illustrating the example of the procedure of the manufacturing method of the template according to the embodiment.

As illustrated in the cross-sectional view of FIG. 12A, a heterogeneous film 261b such as a chromium film is formed across the entire surface of the substrate 21. In other words, the heterogeneous film 261b covers the upper surface of the substrate 21, the upper surfaces of the line portions 22, the upper surfaces of the columnar portions 23, the upper surfaces and the bottom surfaces of the inspection marks 250, and the bottom surfaces of the alignment marks 260.

On the heterogeneous film 261b, a resist film 55 is formed, for example, by applying a resist material by spin application or the like. By carrying out spin application of a resist material, the entirety of the line portions 22, the columnar portions 23, the inspection marks 250, and the alignment marks 260 formed on the upper surface of the substrate 21 is covered, and the resist film 55 having an approximately flat upper surface is formed across the entire surface of the substrate 21. In this process, the film thickness of the resist film 55 is the thinnest above the upper surfaces of the columnar portions 23 on the line portions 22 and is the thickest above the bottom surfaces of the alignment marks 260. Thereafter, the resist film 55 is cured, for example, by radiating ultraviolet light.

Figure 12B:
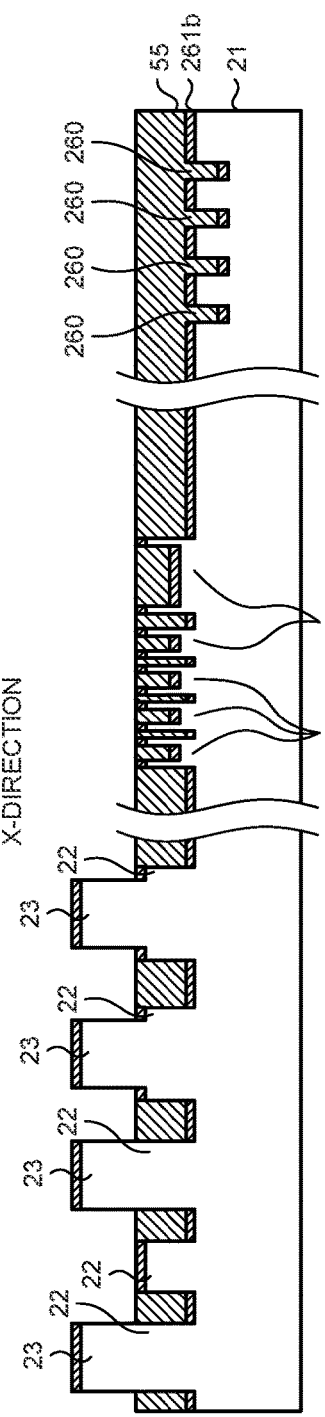

As illustrated in a cross-sectional view of FIG. 12B, the resist film 55 is subjected to etch back. As a result, first, the upper surface of the heterogeneous film 261b on the columnar portions 23 is exposed, and the upper surface of the heterogeneous film 261b on the line portions 22 and on the inspection marks 250 is then exposed.

Figure 12C:
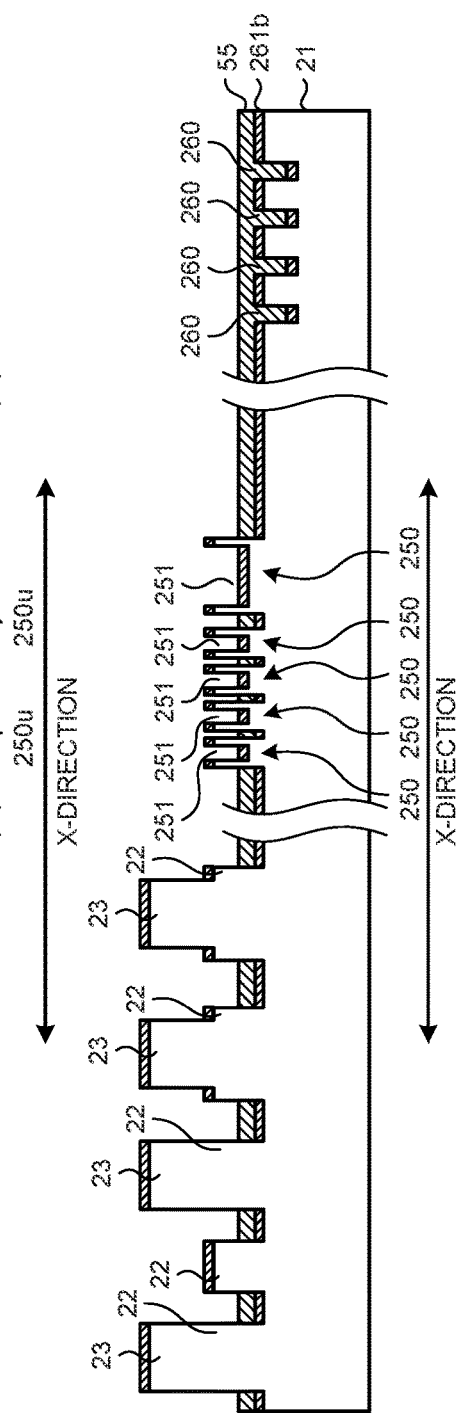

As illustrated in a cross-sectional view of FIG. 12C, the etch back of the resist film 55 is continued. As a result, the upper surface of the heterogeneous film 261b formed on the bottom surfaces of the recessed portions 251 is exposed.

As illustrated in a plan view of FIG. 13A and a cross-sectional view of FIG. 13B, the etch back of the resist film 55 is further continued. As a result, the heterogeneous film 261b formed on each of the upper surface of the substrate 21, the upper surfaces of the line portions 22, the upper surfaces of the columnar portions 23, and the upper surfaces and the bottom surfaces of the inspection marks 250 is exposed, and the resist film 55 remains only in the alignment marks 260. In other words, only the heterogeneous film 261b at the bottom surfaces of the alignment marks 260 becomes a state in which the heterogeneous film is covered with the resist film 55.

As illustrated in a plan view of FIG. 14A and a cross-sectional view of FIG. 14B, the heterogeneous film 261b is subjected to etch back, and the heterogeneous film 261b is removed from the upper surface of the substrate 21, the upper surfaces of the line portions 22, and the upper surfaces of the columnar portions 23, and the upper surfaces and the bottom surfaces of the inspection marks 250. As a result, a state in which the heterogeneous film 261, which improves the distinguishability of the alignment marks 260, is disposed on the bottom surfaces of the alignment marks 260 is obtained.

Thereafter, the resist film 55 remaining in the alignment marks 260 is removed by, for example, asking using oxygen plasma.

In the above described manner, the template 20 of the embodiment is manufactured.

Herein, as described above, the outer portions 253 of the inspection marks 250 included in the overlay mark 25 (see above described FIG. 2A and FIG. 2B) and the protruding pattern 24 including the line portions 22 and the columnar portions 23 are formed in batch by using the same resist pattern 53p and the mask pattern 43p.

Therefore, the outer portions 253 of the overlay mark 25 are disposed at relative positions with respect to the disposed position of the protruding pattern 24. More specifically, the disposed positions of the outer portions 253 of the overlay mark 25 and the disposed position of the protruding pattern 24 have a relative relation.

More specifically, for example, when the plural templates 20 are mass-produced, in one of the templates 20, it is assumed that the misalignment amount of the outer portions 253 of the overlay mark 25 from designed values with respect to the substrate 21 of the template 20 is zero. In this case, the misalignment amount of the protruding pattern 24 from a designed value with respect to the substrate 21 of the same template 20 is also zero.

Also, in another one of the templates 20, it is assumed that the misalignment amount of the outer portion 253 of the overlay mark 25 from a designed value with respect to the substrate 21 of the template 20 is a distance Dx in the X-direction and a distance Dy in the Y-direction. In this case, the misalignment amount of the protruding pattern 24 from a designed value with respect to the substrate 21 of the same template 20 is also the distance Dx in the X-direction and the distance Dy in the Y-direction.

In this manner, among the plural templates 20, the relative positions of the outer portions 253 of the overlay mark 25 and the protruding pattern 24 are constant.

Similarly, the inner portions 252 of the inspection marks 250 included in the overlay mark 25 (see above described FIG. 2A and FIG. 2B) and the alignment mark 26 including the alignment marks 260 are formed in batch by using the same resist pattern 54p and the mask pattern 44p.

Therefore, the inner portions 252 of the overlay mark 25 are disposed at relative positions with respect to the disposed positions of the alignment marks 260 of the alignment mark 26. In other words, the disposed positions of the inner portions 252 of the overlay mark 25 and the disposed positions of the alignment mark 260 have a relative relation.

More specifically, for example, when the plural templates 20 are mass-produced, in one of the templates 20, if the misalignment amount of the inner portion 252 of the overlay mark 25 from a designed value with respect to the substrate 21 of the template 20 is zero, the misalignment amount of the alignment mark 260 from a designed value is also zero.

Also, in another one of the templates 20, if the misalignment amount of the inner portion 252 of the overlay mark 25 from a designed value with respect to the substrate 21 of the template 20 is the distance Dx in the X-direction and the distance Dy in the Y-direction, the misalignment amount of the alignment mark 260 from a designed value is also the distance Dx in the X-direction and the distance Dy in the Y-direction.

In this manner, among the plural templates 20, the relative positions of the inner portions 252 of the overlay mark 25 and the alignment marks 260 are constant.

On the other hand, the outer portions 253 of the overlay mark 25 and the protruding pattern 24 are formed in a process different from that of the inner portions 252 of the overlay mark 25 and the alignment marks 260 of the alignment mark 26 by using the mutually different resist patterns 53p and 54p and the mask patterns 43p and 44p.

Therefore, the disposed positions of the outer portions 253 of the overlay mark 25 and the protruding pattern 24 and the disposed positions of the inner portions 252 of the overlay mark 25 and the alignment marks 260 are not in a relative relation.

Specifically, for example, when the plural templates 20 are mass-produced, in one of the templates 20, even if the misalignment amounts of the outer portions 253 of the overlay mark 25 and the protruding pattern 24 from designed values are zero with respect to the substrate 21 of the template 20, the misalignment amounts of the inner portions 252 of the overlay mark 25 and the alignment marks 260 from designed values are not necessarily zero.

In this manner, the relative positions of the outer portions 253 of the overlay mark 25 and the protruding pattern 24 with respect to the inner portions 252 of the overlay mark 25 and the alignment marks 260 may be varied in each template 20.

Note that the above described various designed values are the values based on, for example, design data prepared in advance for manufacturing of the templates 20.

(Formation of Dual Damascene Structure)

Next, by using FIG. 15A to FIG. 19B, processes of transferring the protruding pattern 24, etc. of the template 20 to the semiconductor device 30 to form the dual damascene structure 64 (see FIG. 1K) will be described. A forming process of the dual damascene structure 64 is included in the manufacturing method of the semiconductor device 30 of the embodiment.

FIG. 15A to FIG. 17C are diagrams illustrating an example of a procedure of an imprinting method using the template 20 according to the embodiment. FIG. 18A to FIG. 19B are diagrams illustrating an example of a procedure of a forming method of the dual damascene structure 64 according to the embodiment. Note that the X-direction and the Y-direction of a wafer W of the semiconductor device 30 illustrated in FIG. 15A to FIG. 19B match the X-direction and the Y-direction of the substrate 21 of the above described template 20.

Figure 15C:
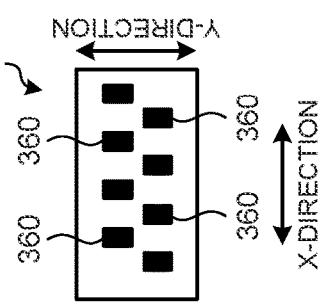
FIG. 15A to FIG. 15C are diagrams illustrating the example of the procedure of the imprinting process using the template according to the embodiment.
Figure 15B:
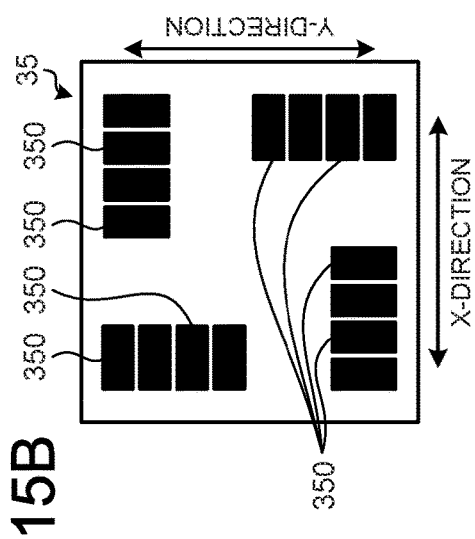
Figure 15A:
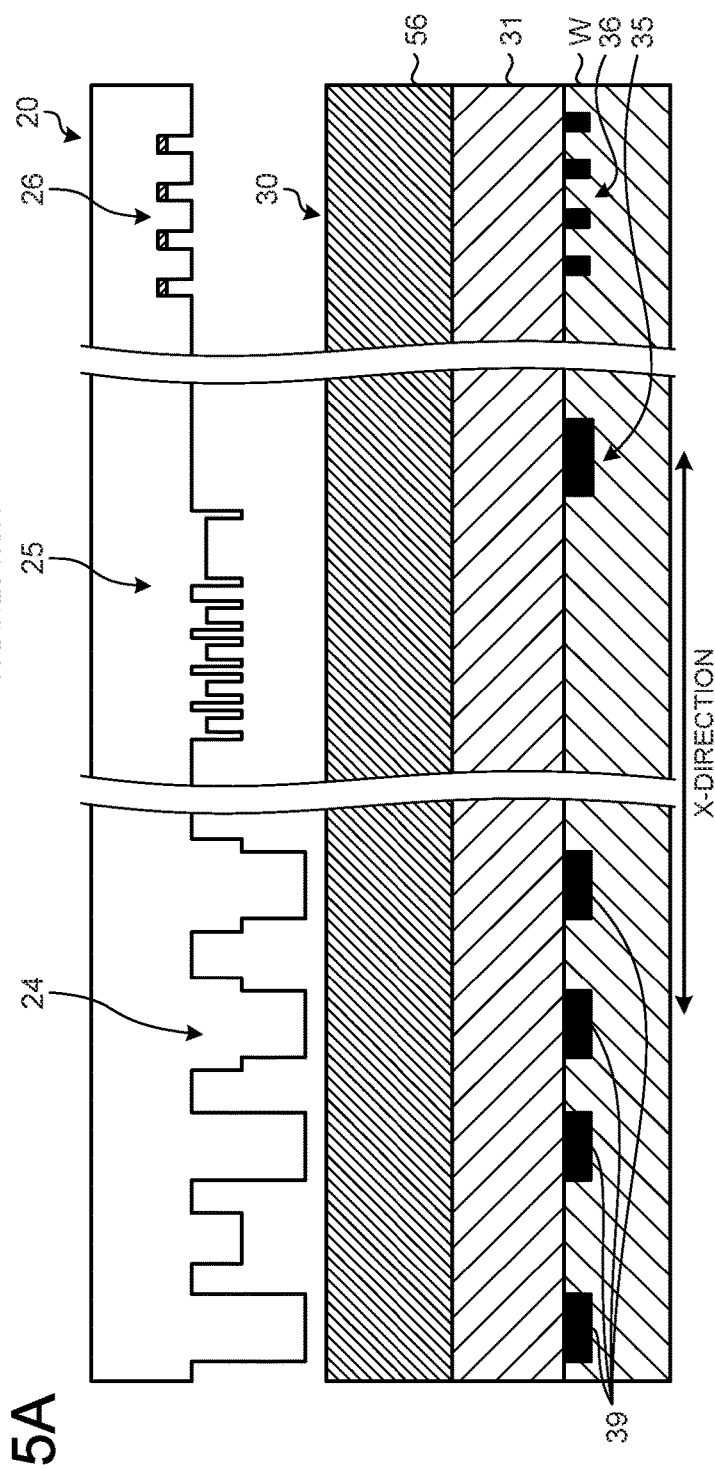

As illustrated in a cross-sectional view of FIG. 15A, the semiconductor device 30 of the embodiment is a semiconductor device which is a target of the imprinting process using the template 20 and is in a process of manufacturing, and the semiconductor device 30 is provided with, for example, the wafer W, the process target film 31, and a resist film 56. Above the wafer W on which the resist film 56 is formed, the template 20 is disposed so that the surface on which the protruding pattern 24, etc. are formed faces the wafer W.

The wafer W serving as a second substrate is a semiconductor wafer such as a silicon wafer, an insulating wafer such as a ceramic wafer, or a conductor wafer such as a diamond wafer. The process target film 31 is formed on the wafer W, and the resist film 56 is formed on the process target film 31.

Note that, in the present specification, not only the single wafer W, but also, for example, the entirety of the wafer W including the process target film 31 may be referred to as the second substrate. Also in a case in which a structure which constitutes part of the semiconductor device 30 such as another film or a transistor is interposed between the process target film 31 and the wafer W and a case in which another film such as a Spin On Carbon (SOC) film, a Spin On Glass (SOG) film, or the like is interposed between the resist film 56 and the process target film 31, the entire wafer W including them may be referred to as the second substrate.

Also, in the present specification, for example, the entire wafer W including the process target film 31 may be referred to as a transfer target object as a transfer target of the protruding pattern 24, etc. of the template 20. Also in a case in which a structure which constitutes part of the semiconductor device 30 such as another film or a transistor is interposed between the process target film 31 and the wafer W and a case in which another film such as a SOC (Spin On Carbon) film, a SOG (Spin On Glass) film, or the like is interposed between the resist film 56 and the process target film 31, the entire wafer W including them may be referred to as the transfer target object.

In a case in which the dual damascene structure 64 (see FIG. 1K) is formed in the above described manner, an insulating film such as a SiO$_2$ film can be used as the process target film 31. The process target film 31 may have a constituent in which plural types of insulating films are stacked.

The resist film 56 serving as a mask film is, for example, a film of a resist material such as a liquid photo-curing resin or the like applied onto the process target film 31 by spin application. However, in order to be subjected to an imprinting process, a liquid resist material may be dripped onto the process target film 31 by an inkjet method. In such a case, plural droplet-like resist materials are disposed on the process target film 31.

Other than that, as a resist pattern subjected to an imprinting process, a thermosetting resin or the like can be also used. However, an organic material other than them may be used as long as the material functions as a mask of the process target film 31 when the process target film 31 is subjected to etching as described later.

Also, the wafer W is provided with wiring 39, an overlay mark 35, and an alignment mark 36. The overlay mark 35 includes, for example, plural inspection marks 350. The alignment mark 36 includes, for example, plural alignment marks 360.

The wiring 39 can be formed, for example, by embedding an electrically conductive film such as a metal film. The inspection marks 350 and the alignment marks 360 are formed, for example, by embedding a film having a different constituent material from that of the wafer W such as a silicon oxide film. However, the wiring 39, the inspection marks 350, and the alignment marks 360 may be provided to project in the process target film 31 when a silicon oxide film is formed on the upper surface of the wafer W.

Also, in a case in which one or plural different films are formed between the wafer W and the process target film 31, the wiring 39, the inspection marks 350, and the alignment marks 360 may be formed on any of these films.

Note that it is assumed that the wiring 39, the inspection marks 350, and the alignment marks 360 are formed in batch by using, for example, the same mask pattern or electron-beam drawing.

The wiring 39 is disposed in a region, in which the dual damascene structure 64 is formed on the process target film 31, and at the positions corresponding to the columnar portions 23 of the protruding pattern 24 of the template 20. The overlay mark 35 is disposed at a position, which is not overlaid with the region in which the dual damascene structure 64 is formed on the process target film 31, and at a position corresponding to the overlay mark 25 of the template 20. Also, the alignment mark 36 is disposed at a position, which is not overlaid with the region in which the dual damascene structure 64 is formed on the process target film 31, and at a position corresponding to the alignment mark 26 of the template 20.

As an example, the overlay mark 35 and the alignment mark 36 can be disposed on a dicing line provided on the wafer W. The dicing line is a part which is cut when the plural semiconductor devices 30 are cut into chips from the wafer W in the end of the manufacturing process of the semiconductor devices 30.

As illustrated in a partial plan view of the wafer W of FIG. 15B, the plural inspection marks 350 constituting the overlay mark 35 have a shape in which the four sides of a cross shape are further separated compared with the plural inspection marks 250 which are disposed in a shape like a windmill on the substrate 21 of the template 20. In this manner, the overlay mark 35 has a complementary shape of the overlay mark 25 of the template 20.

As illustrated in a partial plan view of the wafer W of FIG. 15C, the plural alignment marks 360 constituting the alignment mark 36 are arranged in one or plural rows in the X-direction as well as the plural alignment marks 260, which are disposed on the substrate 21 of the template 20. In this manner, the alignment mark 36 has a complementary shape of the alignment mark 26 of the template 20.

As illustrated in a cross-sectional view of FIG. 16, the template 20 is pressed against the resist film 56 on the wafer W. As a result, the recessed portions of the protruding pattern 24 of the template 20, the inspection marks 250 constituting the overlay mark 25, and the alignment marks 260 constituting the alignment mark 26 are filed with the resist film 56 interposed between the template 20 and the process target film 31 on the wafer W.

Also, in a state in which the template 20 is pressed against the resist film 56 on the wafer W, the alignment mark 26 of the template 20 and the alignment mark 36 of the wafer W are observed from above the template 20 by using a microscope such as an alignment scope to carry out alignment. Alignment is a process of precisely aligning the positions of the template 20 and the wafer W in the X-direction and the Y-direction by finely aligning the positions of the alignment marks 26 and 36.

Specifically, alignment is carried out so that the positions of the alignment mark 26 of the template 20 and the alignment mark 36 of the wafer W having mutually complementary shapes are mutually overlaid when viewed from above the template 20. In actual alignment, while the position of the template 20 in the X-direction and the Y-direction is finely aligned plural times, the positional misalignment of both of the template 20 and the wafer W in the X-direction and the Y-direction is corrected as much as possible within predetermined time. By such alignment, the protruding pattern 24 of the template 20 can be transferred to a desired position on the wafer W.

Meanwhile, when the alignment is carried out, the alignment marks 260 constituting the alignment mark 26 of the template 20 are filled with the resist film 56. Since the light refractive indexes of the template 20, which includes a transparent member such as quartz, and the resist film 56, which includes a photo-curing resin or the like, are extremely close to each other, it is difficult to visually check the alignment marks 260 per se filled with the resist film 56.

However, at the bottom surfaces of the alignment marks 260, the heterogeneous film 261 having a refractive index different from that of the resist film 56 such as a chromium film is disposed. By virtue of this, the alignment marks 260 can be visually checked even in a state in which they are filled with the resist film 56.

Note that, if droplets of a resist material are discharged onto the process target film 31 by an inkjet method instead of forming the resist film 56 by spin application, the wet droplets are spread on the process target film 31 in a film shape when the template 20 is pressed against the droplets. As a result, as well as the case of the above described resist film 56, the protruding pattern 24, the inspection marks 250, and the alignment marks 260 can be filled with the resist material.

Figure 17B:
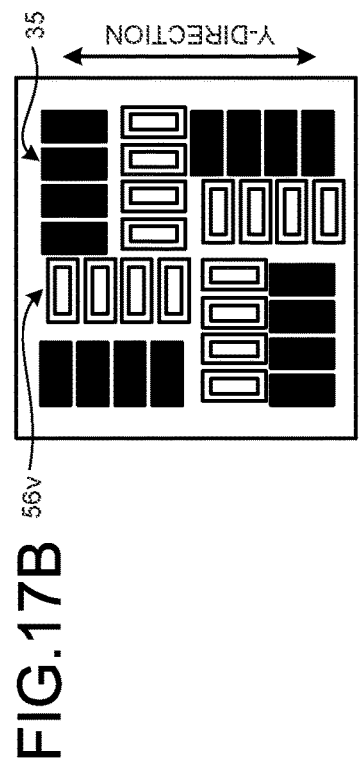
FIG. 17A to FIG. 17C are diagrams illustrating the example of the procedure of the imprinting process using the template according to the embodiment.
Figure 17C:
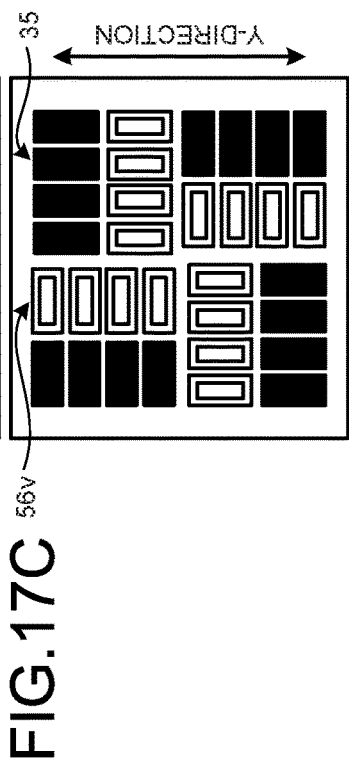
Figure 17A:
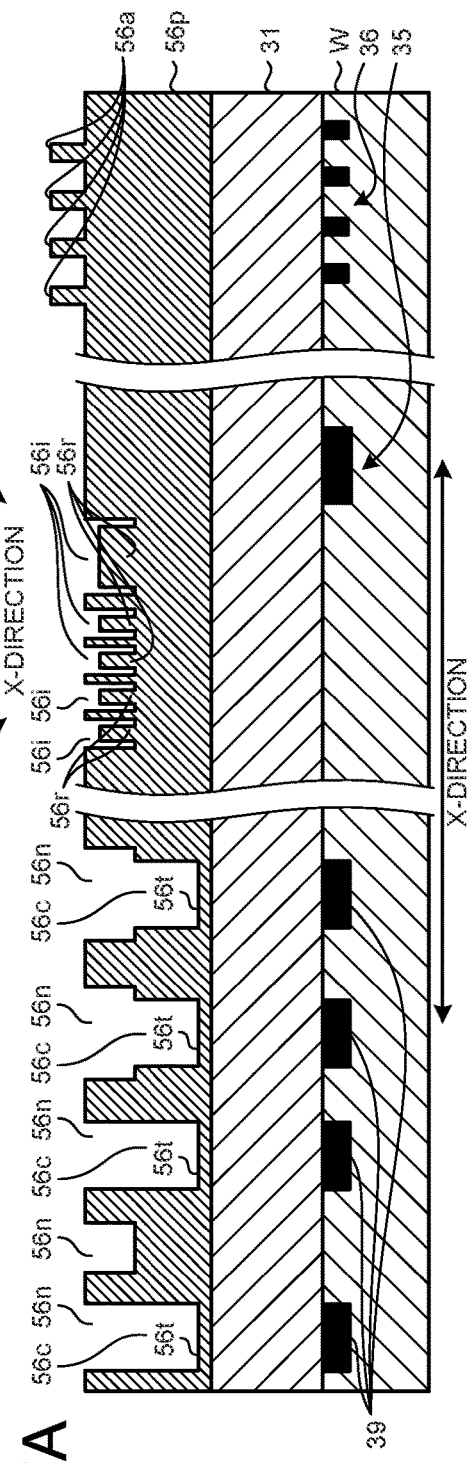

As illustrated in a cross-sectional view of FIG. 17A, when the template 20 is released, the resist pattern 56p to which the protruding pattern 24, the overlay mark 25, and the alignment mark 26 of the template 20 have been transferred is formed. The resist pattern 56p as the mask pattern has a trench pattern 56n, a hole pattern 56c, an inspection mark pattern 56i, and an alignment mark pattern 56a.

The trench pattern 56n is a recessed pattern to which the protruding line portions 22 (see FIG. 2A and FIG. 2B) of the template 20 have been transferred. The hole pattern 56c is a recessed pattern to which the columnar portions 23 of the template 20 (see FIG. 2A and FIG. 2B) have been transferred. The hole pattern 56c is disposed at an upper position corresponding to the wiring 39 of the wafer W by the above described alignment. A resist residual film 56t is disposed on bottom surfaces of the hole pattern 56c.

The inspection mark pattern 56i is a pattern to which the inspection marks 250 of the template 20 have been transferred. The inspection mark pattern 56i has, in a recessed pattern, protruding portions 56r projecting from bottom surfaces of the recessed pattern. The protruding portions 56r are a pattern to which the recessed portions 251 of the template 20 have been transferred. The inspection mark pattern 56i is disposed at a position overlaid with the overlay mark 35 of the wafer W.

The alignment mark pattern 56a is a protruding pattern to which the recessed alignment marks 260 of the template 20 have been transferred. The alignment mark pattern 56a is disposed at a position overlaid with the alignment mark 36 of the wafer W.

After the resist pattern 56p is formed in the above described manner, the inspection mark pattern 56i of the resist pattern 56p and the overlay mark 35 of the wafer W are observed by, for example, inline SEM (Scanning Electron Microscope) or the like to inspect whether the trench pattern 56n and the hole pattern 56c are formed at desired positions on the wafer W or not. States thereof are illustrated in FIG. 17B and FIG. 17C. FIG. 17B and FIG. 17C illustrate states obtained by observing overlay marks 56v and 35 by inline SEM or the like from above the resist pattern 56p.

The overlay mark 56v includes the inspection mark pattern 56i, which is disposed in the resist pattern 56p, and has a shape like a windmill as well as the overlay mark 25 of the template 20.

In the example illustrated in FIG. 17B, the overlay marks 56v and 35 are misaligned from each other in the X-direction and the Y-direction. In other words, FIG. 17B illustrates a state in which the trench pattern 56n and the hole pattern 56c formed on the wafer W are positionally misaligned both in the X-direction and the Y-direction with respect to the wafer W.

In a case in which the overlay misalignment amount of the trench pattern 56n and the hole pattern 56c is exceeding a specified value, if processing with respect to the wafer W is advanced in this state, positional misalignment in the vertical direction may occur between the dual damascene structure 64 formed on the process target film 31, constituents already formed in a lower layer of the process target film 31, constituents to be formed thereafter on an upper layer of the process target film 31, etc. Due to such positional misalignment, in some cases, the wiring to be connected in the vertical direction is disconnected, and the wiring not supposed to be connected is short-circuited.

Therefore, if the overlay misalignment amount has exceeded the specified value in the above described inspection, the formed resist pattern 56p is removed by asking using oxygen plasma or the like, and an imprinting process is carried out again. In other words, rework (reformation) of the resist pattern 56p is carried out.

In the example illustrated in FIG. 17C, mutually corresponding parts of the overlay marks 56v and 35 are aligned both in the X-direction and the Y-direction. In other words, FIG. 17C illustrates a state in which the trench pattern 56n and the hole pattern 56c are appropriately overlaid both in the X-direction and the Y-direction with respect to the wafer W.

In this manner, in an inspection after formation of the resist pattern 56p, for example, whether the overlay misalignment amount of the resist pattern 56p is within a specified value or not is inspected.

Meanwhile, in the imprinting process with respect to the wafer W, for example, the process is carried out for each region of the wafer W called a shot region. The shot region is a region which is subjected to pattern transfer when the template 20 is pressed against the region one time. Normally, the semiconductor devices 30 which are plural finished products can be obtained from the shot regions.

Therefore, in the imprinting process, alignment of the template 20, transfer of the protruding pattern 24, etc. are repeated with respect to plural shot regions. When all of the imprinting processes of the shot regions serving as processing targets are finished, the above described overlay misalignment inspection is carried out with respect to the resist pattern 56p formed in each of the shot regions. For example, when the resist patterns 56p of a predetermined number or more of shot regions pass the above described inspection, a process described hereinafter is carried out with respect to the wafer W.

As illustrated in a cross-sectional view of FIG. 18A, the resist pattern 56p is subjected to etch back to remove the resist residual film 56t at the bottom surfaces of the hole pattern 56c.

As illustrated in a cross-sectional view of FIG. 18B, the process target film 31 is subjected to etching while using the resist pattern 56p as a mask. As a result, first, the hole pattern 56c of the resist pattern 56p is transferred to the process target film 31, and the hole pattern 33 recessed from the upper surface of the process target film 31 is formed.

In this process, the part of the hole pattern 56c of the resist pattern 56p disappears, and the film thickness of the entire resist pattern 56p is reduced.

As a result, the trench pattern 56n of the resist pattern 56p is disposed on the upper surface of the process target film 31 on which the hole pattern 33 is formed. Part of the trench pattern 56n is disposed at a position overlaid with the hole pattern 33.

Also, the film of the inspection mark pattern 56i and the alignment mark pattern 56a of the resist pattern 56p is reduced overall. The upper surface of the process target film 31 is exposed from the bottom surface of the inspection mark pattern 56i.

As illustrated in a cross-sectional view of FIG. 18C, the process target film 31 is further subjected to etching while using the resist pattern 56p as a mask.

As a result, the trench pattern 56n of the resist pattern 56p is transferred to the process target film 31, and the trench pattern 32 recessed from the upper surface of the process target film 31 is formed. Also, the hole pattern 33 is further dug down, extends from the bottom surface of the trench pattern 32, and becomes through-holes which reach the upper surface of the wafer W. As a result, for example, the bottom surface of the hole pattern 33 is connected to the wiring 39 disposed on the wafer W.

Also, the inspection mark pattern 56i of the resist pattern 56p is transferred to the process target film 31, and an inspection mark pattern 350t is formed. The inspection mark pattern 350t of the process target film 31 has protruding portions 351, which project from the bottom surface of the recessed pattern, in the recessed pattern.

In this process, for example, the part of the trench pattern 56n of the resist pattern 56p disappears, and the film thickness of the entire resist pattern 56p is further reduced.

As a result, the resist pattern 56p disappears from the trench pattern 32 and the upper surface of the process target film 31 on which the inspection mark pattern 350t is formed. Also, the film of the alignment mark pattern 56a of the resist pattern 56p is further reduced overall. From the bottom surface of the alignment mark pattern 56a, for example, the upper surface of the process target film 31 is exposed. However, the alignment mark pattern 56a is not transferred to the upper surface of the process target film 31.

Note that the trench pattern 32 and the resist pattern 56p on the process target film 31 on which the inspection mark pattern 350t is formed may remain on the process target film 31 without completely disappearing. Also, the resist pattern 56p may remain also on the process target film 31 below the alignment mark pattern 56a, and, in this case, the upper surface of the process target film 31 is not required to be exposed. When the resist pattern 56p has an excessive film thickness in this manner, the resist pattern 56p can be more precisely transferred to the process target film 31.

Then, the remaining resist pattern 56p is removed by asking using oxygen plasma or the like. As a result, the process target film 31 having the recessed pattern 34, which includes the trench pattern 32 and the hole pattern 33, and the overlay mark 35t, which includes the inspection mark pattern 350t in which the protruding portions 351 are formed, is formed. In the region in which the alignment mark pattern 56a of the resist pattern 56p has been disposed above the alignment mark 36 of the wafer W, the upper surface of the process target film 31 remains flat.

Figure 19A:
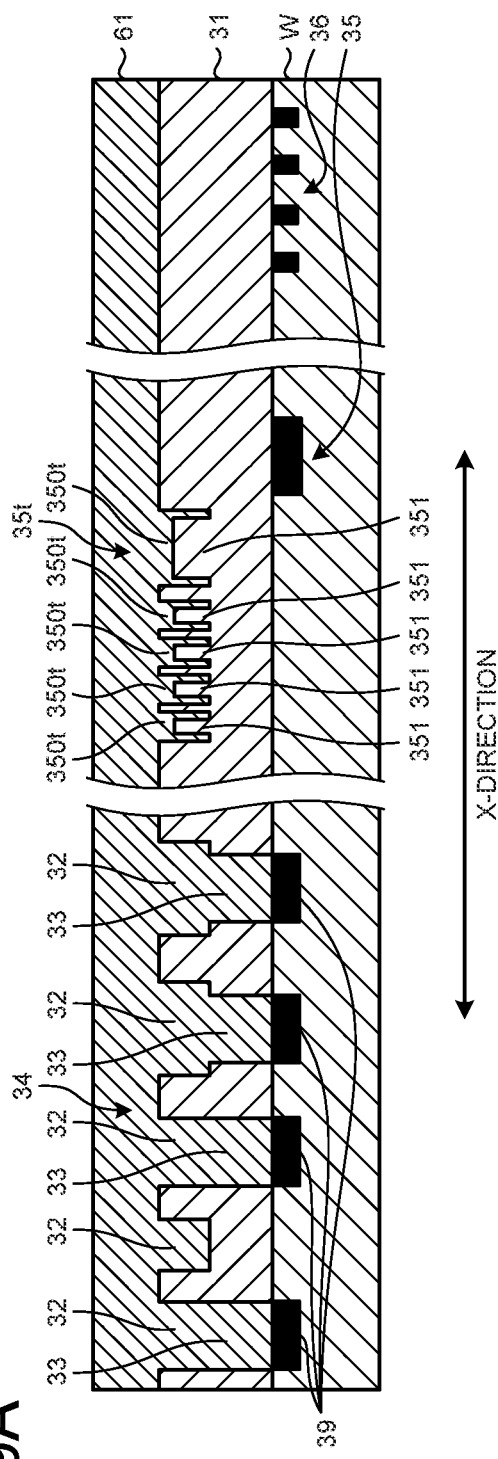
FIG. 19A and FIG. 19B are diagrams illustrating the example of the procedure of the forming method of the dual damascene structure according to the embodiment.

As illustrated in a cross-sectional view of FIG. 19A, an electrically conductive film 61 such as a copper film or a tungsten film which covers the upper surface of the process target film 31 is formed. As a result, the interior of the recessed pattern 34, which includes the trench pattern 32 and the hole pattern 33 of the process target film 31, and the overlay mark 35t, which includes the inspection mark pattern 350t in which the protruding portions 351 are formed, is filled with the electrically conductive material.

Figure 19B:
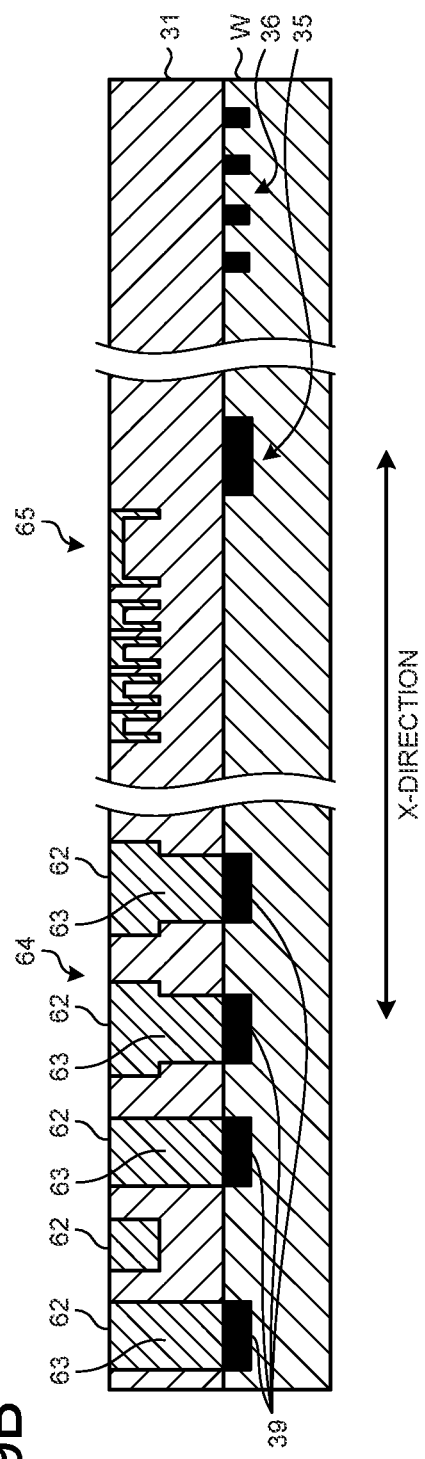

As illustrated in a cross-sectional view of FIG. 19B, the electrically conductive film 61 on the process target film 31 is removed, for example, by Chemical Mechanical Polishing (CMP).

As a result, the electrically conductive material with which the recessed pattern 34 of the process target film 31 has been filled, remains, and the dual damascene structure 64 including the wiring 62 and the vias 63 is formed. Note that each of the vias 63 is connected to the wiring 39 to which the wafer W corresponds.

Also, the electrically conductive material with which the overlay mark 35t of the process target film 31 has been filled, remains, and the overlay mark 65 is formed. The overlay mark 65 is not configured to contribute to the function of the semiconductor device 30. Also, the electrically conductive material in the overlay mark 65 is in a floating state and therefore does not affect the function of the semiconductor device 30.

In the above described manner, the dual damascene structure 64 is formed on the semiconductor device 30 of the embodiment.

Then, various processes are further carried out with respect to the semiconductor device 30, and the manufacturing process is finished. Note that the semiconductor device 30, which has been cut into a chip and become a finished product, may have the overlay mark 65 at a part reserved for scraping in dicing.

(Inspection of Transfer Pattern)

Next, by using FIG. 20A to FIG. 25, details of an inspection carried out after formation of the resist pattern 56p will be described.

As described above, in the template 20 of the embodiment, the disposed position of the protruding pattern 24 and the disposed position of the alignment mark 26 do not have a correlation. The disposed position of the overlay mark 25 regarding each part thereof has a correlation with respect to the disposed position of the protruding pattern 24 or the disposed position of the alignment mark 26.

In the inspection of the resist pattern 56p of the embodiment, various determination is carried out by using the above described correlation. Specifically, in the inspection of the resist pattern 56p, the relative position accuracy between the patterns of the template 20 used in the imprinting process, the alignment accuracy of the template 20 and the wafer W in the imprinting process, and the overlay accuracy of the resist pattern 56p with respect to the wafer W can be determined.

The relative position accuracy between the patterns of the template 20 used in the imprinting process is the presence/absence of mutual positional misalignment between the protruding pattern 24, the overlay mark 25, and the alignment mark 26 of the template 20 and is formation position accuracy of these constituents expressed by, for example, the magnitude of the positional misalignment amount. Hereinafter, the relative position accuracy between the patterns of the template 20 will also be simply referred to as inter-pattern position accuracy.

The alignment accuracy of the template 20 and the wafer W in the imprinting process is the presence/absence of the positional misalignment between the template 20 and the wafer W in the X-direction and the Y-direction and is the position accuracy of alignment in the imprinting process expressed by, for example, the magnitude of the position misalignment amount. Hereafter, the alignment accuracy of the template 20 and the wafer W in the imprinting process will be also simply referred to as alignment accuracy.

The overlay accuracy of the resist pattern 56p with respect to the wafer W is the presence/absence of the positional misalignment of the trench pattern 56n and the hole pattern 56c of the resist pattern 56p with respect to the wafer W in the X-direction and the Y-direction and is the accuracy of the overlay position expressed by, for example, magnitude of the positional misalignment amount. Hereafter, the overlay accuracy of the resist pattern 56p with respect to the wafer W will be also simply referred to as overlay accuracy.

First, as a presupposition, an example of possible relative positions of the protruding pattern 24, the overlay mark 25, and the alignment mark 26 of the template 20 will be described.

Figure 20A:
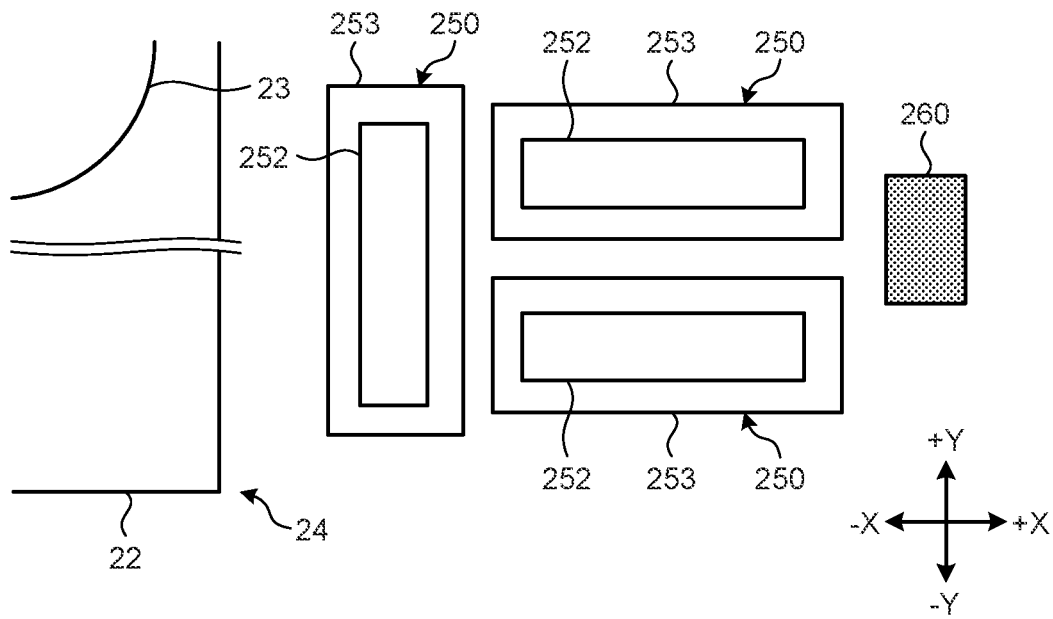
FIG. 20A and FIG. 20B are plan views exemplarily illustrating relative positional relations of a protruding pattern, an overlay mark, and an alignment mark of the template according to the embodiment.
Figure 20B:
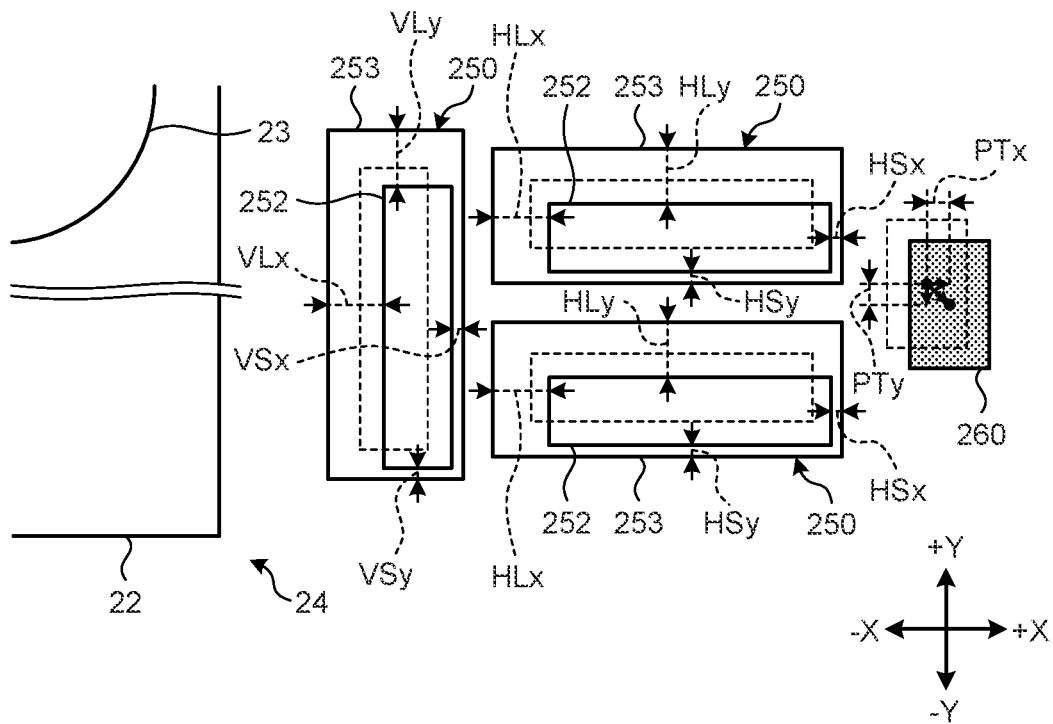

FIG. 20A and FIG. 20B are plan views exemplarily illustrating relative positional relations of the protruding pattern 24, the overlay mark 25, and the alignment mark 26 of the template 20 according to the embodiment. FIG. 20A and FIG. 20B illustrate part of one of the line portions 22 and one of the columnar portions 23 as an example of the protruding pattern 24, some of the inspection marks 250 as an example of the overlay mark 25, and one of the alignment marks 260 as an example of the alignment mark 26 in a manner that they are close to each other.

FIG. 20A illustrates a case in which each of the alignment marks 260 of the alignment mark 26 is formed at a designed position. The formation of the alignment mark 260 at the designed position means that the formation position of the alignment mark 260 in the plane of the substrate 21 of the template 20 matches the design, and the relative position of the alignment mark 260 with respect to the protruding pattern 24 matches design as a result. The state that these relative positions match the design means that these relative positions are, for example, in a positional relation matching design data prepared in advance as described above.

Therefore, the positional misalignment amount of each of the alignment marks 260 with respect to each of the line portions 22 and each of the columnar portions 23 of the protruding pattern 24 is zero both in the X-direction and the Y-direction. Also, the positional misalignment amount of each of the alignment mark 260 with respect to the outer portion 253 of each of the inspection marks 250 of the overlay mark 25 is zero both in the X-direction and the Y-direction.

In other words, the formation position of the alignment mark 260 with respect to the line portion 22 and the columnar portion 23 expressed by a separated distance in the X-direction and a separated distance in the Y-direction matches the design. Also, the formation position of the alignment mark 260 with respect to the outer portion 253 expressed by a separated distance in the X-direction and a separated distance in the Y-direction also matches the design.

However, the alignment mark 260, the outer portion 253 of the inspection mark 250, and the line portion 22 and the columnar portion 23 are mutually separated at a degree that, for example, they cannot be captured in a view field of inline SEM, which can observe them. Therefore, it is difficult to measure the distances, etc. between these constituents and directly observe whether there is positional misalignment or not between these constituents. Therefore, as described below, attention will be focused on the positional relation between the outer portion 253 and the inner portion 252 of the inspection mark 250.

As illustrated in FIG. 20A, when the alignment mark 260 is formed at the designed position, the inner portion 252 of each of the inspection marks 250 of the overlay mark 25 is also formed at the designed position. In other words, the positional misalignment amount of the inner portion 252 with respect to the line portion 22, the columnar portion 23, and the outer portion 253 of the inspection mark 250 is zero both in the X-direction and the Y-direction. In this case, as described above, the center point of the inner portion 252 expressed by a position in the X-direction and the Y-direction matches the center point of the outer portion 253 expressed by a position in the X-direction and the Y-direction.

Therefore, if the positional misalignment amount of the alignment mark 260 is zero, it is observed that the outer portion 253 is disposed at equal distances in both sides of the inner portion 252 in the X-direction and is disposed at equal distances in both sides of the inner portion 252 in the Y-direction. As a result, it can be understood that the alignment mark 260 does not have positional misalignment with respect to the line portion 22, the columnar portion 23, and the outer portion 253 of the inspection mark 250.

FIG. 20B illustrates a case in which each of the alignment marks 260 of the alignment mark 26 is formed at a position not matching the design. In the example of FIG. 20B, the center point of the alignment mark 260 is formed to be misaligned by a distance PTx in a +X-direction and misaligned by a distance PTy in a −Y-direction from a designed position expressed by a dotted line.

In other words, the position of the alignment mark 260 with respect to the line portion 22, the columnar portion 23, and the outer portion 253 of the inspection mark 250 is misaligned by the distance PTx in the +X-direction and misaligned by the distance PTy in the −Y-direction. In this case, the center point of the inner portion 252 expressed by a position in the X-direction and the Y-direction does not match the center point of the outer portion 253 expressed by a position in the X-direction and the Y-direction.

Therefore, if the formation position of the alignment mark 260 is misaligned, it is observed that the outer portion 253 is not disposed at equal distances in both sides of the inner portion 252 in the X-direction and is not disposed at equal distances in both sides of the inner portion 252 in the Y-direction. As a result, it can be understood that the alignment mark 260 has positional misalignment with respect to the line portion 22, the columnar portion 23, and the outer portion 253 of the inspection mark 250.

Furthermore, the positional misalignment amount of the alignment mark 260 in the X-direction can be calculated from distances HLx and HSx from the inspection mark 250 extending in the X-direction to the outer portion 253 in both sides of the inner portion 252 in the X-direction. More specifically, the positional misalignment amount PTx of the alignment mark 260 in the X-direction is calculated by following Equation (1) or Equation (2).

$$PTx = HLx - (HLx + HSx)/2 \quad (1)$$

$$= (HLx + HSx)/2 - HSx \quad (2)$$

Also, the positional misalignment amount of the alignment mark 260 in the X-direction can be calculated also from distances VLx and VSx from the inspection mark 250 extending in the Y-direction to the outer portion 253 in both sides of the inner portion 252 in the X-direction. More specifically, the positional misalignment amount PTx of the alignment mark 260 in the X-direction is calculated by following Equation (3) or Equation (4).

$$PTx = VLx - (VLx + VSx)/2 \quad (3)$$

$$= (VLx + VSx)/2 - VSx \quad (4)$$

The positional misalignment amount PTx in the X-direction of the alignment mark 260 is obtained in this manner by using at least any of above described Equations (1) to (4). However, it is possible that at least any of the sizes of the inner portion 252 and the sizes of the outer portion 253 is not formed as designed due to processing error or the like. Therefore, it is desired to measure plural ones of the inspection marks 250 extending in the X-direction and plural ones of the inspection marks 250 extending in the Y-direction and specify the positional misalignment amount PTx by an average value or the like.

Similarly, the positional misalignment amount of the alignment mark 260 in the Y-direction can be calculated from distances HLy and HSy from the inspection mark 250 extending in the X-direction to the outer portion 253 in both sides of the inner portion 252 in the Y-direction. More specifically, the positional misalignment amount PTy of the alignment mark 260 in the Y-direction is calculated by following Equation (5) or Equation (6).

$$PTy = HLy - (HLy + HSy)/2 \quad (5)$$

$$= (HLy + HSy)/2 - HSy \quad (6)$$

Also, the positional misalignment amount of the alignment mark 260 in the Y-direction can be calculated also from distances VLy and VSy from the inspection mark 250 extending in the Y-direction to the outer portion 253 in both sides of the inner portion 252 in the Y-direction. More specifically, the positional misalignment amount PTy of the alignment mark 260 in the Y-direction can be calculated also by following Equation (7) or Equation (8).

$$PTy = VLy - (VLy + VSy)/2 \quad (7)$$

$$= (VLy + VSy)/2 - VSy \quad (8)$$

The positional misalignment amount PTy in the Y-direction of the alignment mark 260 is obtained in this manner by using at least any of above described Equations (5) to (8). However, since there can be processing errors in the size of the inner portion 252 and the size of the outer portion 253 as described above, it is desired to measure plural ones of the inspection marks 250 extending in the X-direction and plural ones of the inspection marks 250 extending in the Y-direction and specify the positional misalignment amount PTy by an average value or the like.

Herein, in calculation of the positional misalignment amount PTx of the alignment mark 260 in the X-direction, it is also conceivable to use the designed distance of the inner portion 252 to the outer portion 253 in one side in the X-direction instead of calculating (HLx+HSx)/2 of above described Equations (1) and (2) or (VLx+VSx)/2 of Equations (3) and (4). Herein, in calculation of the positional misalignment amount PTy of the alignment mark 260 in the y-direction, it is also conceivable to use the designed distance of the inner portion 252 to the outer portion 253 in one side in the Y-direction instead of calculating (HLy+HSy)/2 of above described Equations (5) and (6) or (VLy+VSy)/2 of Equations (7) and (8).

However, as described above, the inner portion 252 and the outer portion 253 may have dimensional differences due to processing errors. Therefore, the positional misalignment amount of the alignment mark 260 can be more accurately calculated by using above described Equations (1) to (8).

In view of the above described contents, various inspections of the resist pattern 56p will be described below.

Figure 21A:
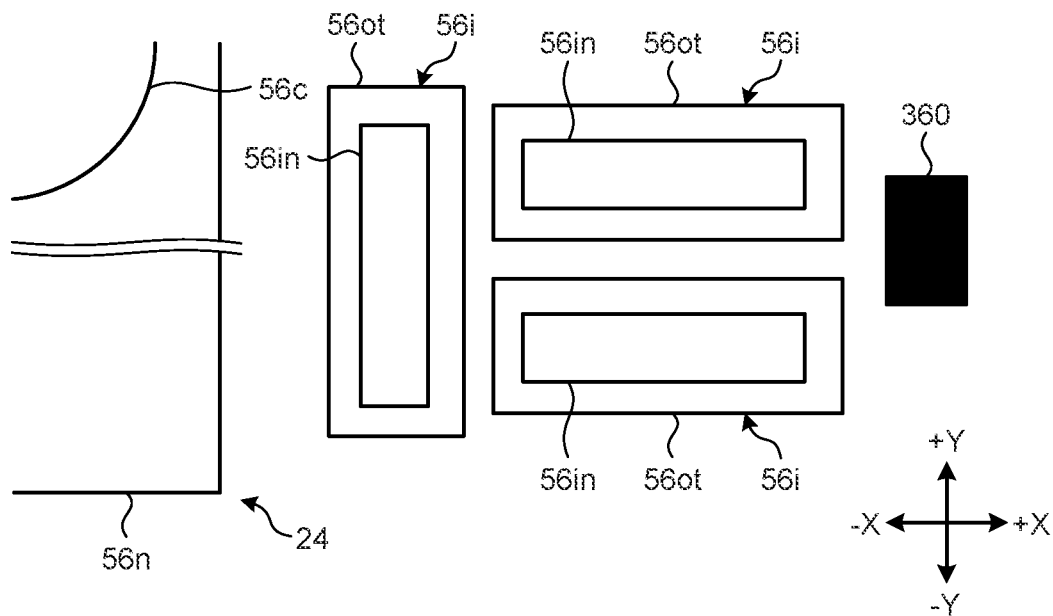
FIG. 21A and FIG. 21B are diagrams describing a method of inspecting relative position accuracy between patterns of the template, which are used in the imprinting process, in an inspection of a resist pattern according to the embodiment.
Figure 21B:
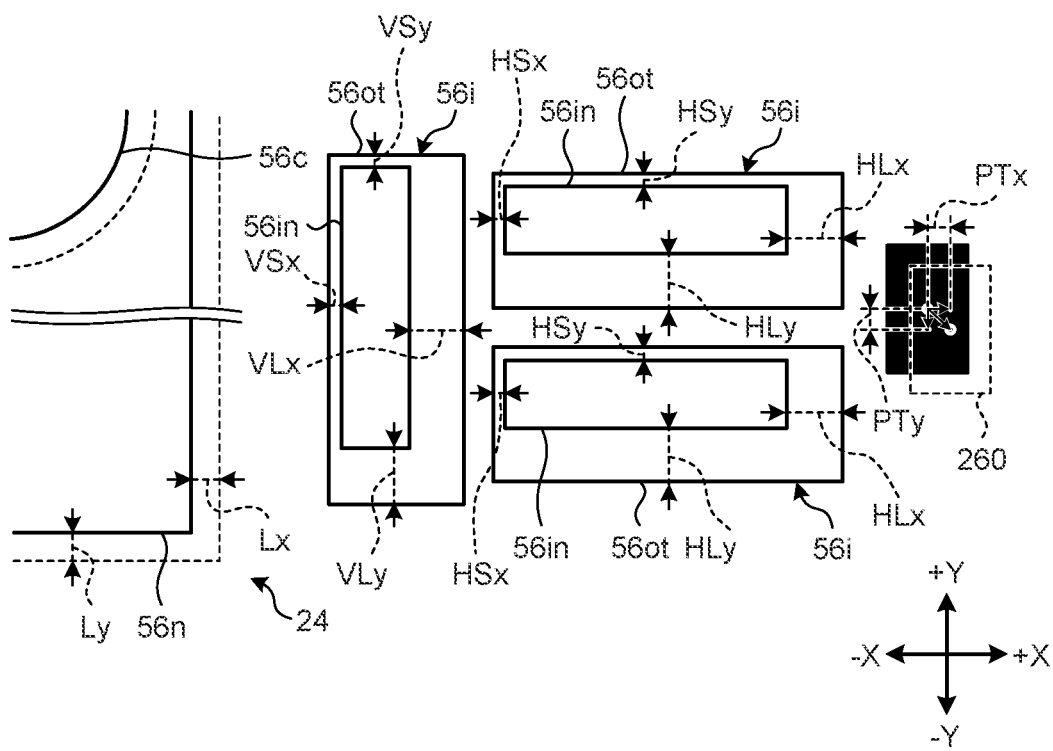

FIG. 21A and FIG. 21B are diagrams describing a method of inspecting relative position accuracy between the patterns of the template 20, which are used in the imprinting process, in an inspection of the resist pattern 56p according to the embodiment.

FIG. 21A and FIG. 21B illustrate a state of observation by inline SEM or the like used in the inspection of the resist pattern 56p.

As illustrated in FIG. 21A and FIG. 21B, the inspection mark pattern 56i of the resist pattern 56p has an outer-portion pattern 56ot to which the outer portion 253 of the template 20 has been transferred. Also, the inspection mark pattern 56i has an inner-portion pattern 56in to which the inner portion 252 of the template 20 has been transferred.

When inline SEM or the like is used, the trench pattern 56n and the hole pattern 56c of the resist pattern 56p and the inspection mark pattern 56i can be observed. Also, when inline SEM or the like is used, the alignment mark 360 formed on the wafer W can be observed through the resist pattern 56p, the process target film 31, etc.

However, as described above, it is difficult to include all of the trench pattern 56n and the hole pattern 56c of the resist pattern 56p, the inspection mark pattern 56i of the resist pattern 56p, and the alignment mark 360 formed on the wafer W at the same time in the view field of inline SEM or the like.

Therefore, in an inspection using inline SEM or the like, in order to specify the inter-pattern position accuracy of the template 20 used in the imprinting process of the resist pattern 56p, attention is focused on the positional relation between the inner-portion pattern 56in and the outer-portion pattern 56ot of the inspection mark pattern 56i of the resist pattern 56p as described below.

FIG. 21A illustrates an example of a case in which the resist pattern 56p is formed by using the template 20 in which the alignment mark 260 is formed at a designed position. Herein, it is assumed that, in formation of the resist pattern 56*p*, the alignment of the template 20 with respect to the wafer W is precisely carried out without positional misalignment.

As illustrated in FIG. 21A, in a case in which the template 20 in which the alignment mark 260 is formed at the designed position is used, when the alignment mark 260 of the template 20 is precisely aligned with respect to the alignment mark 360 of the wafer W, the trench pattern 56*n* and the hole pattern 56*c* of the resist pattern 56*p* are disposed at the designed positions on the wafer W.

In the above described case, as well as the case in which the inspection mark 250 of the template 20 is observed, it can be observed that the outer-portion pattern 56*ot* is disposed at equal distances in X-direction both sides and Y-direction both sides of the inner-portion pattern 56*in* of the resist pattern 56*p*.

As a result, it can be specified that the alignment mark 260 of the template 20 used in the imprinting process has been formed without positional misalignment both in the X-direction and the Y-direction.

FIG. 21B illustrates an example of a case in which the resist pattern 56*p* is formed by using the template 20 in which the alignment mark 260 is formed at a position not matching the design.

Herein, it is assumed that the template 20 is the template 20 illustrated in FIG. 20B and that the center point of the alignment mark 260 of the template 20 is misaligned from a designed position expressed by a dotted line by the distance PTx in the +X-direction and the distance PTy in the −Y-direction. Also, it is assumed that, in formation of the resist pattern 56*p*, the alignment of the template 20 with respect to the wafer W is precisely carried out without positional misalignment.

In a case in which the template 20 like this is used, when the alignment mark 260 of the template 20 is precisely aligned with respect to the alignment mark 360 of the wafer W, the relative position of the alignment mark 360 of the wafer W with respect to the line portion 22 and the columnar portion 23 of the template 20 is misaligned by the distance PTx in the −X-direction and the distance PTy in the +Y-direction from the ideal disposed position of the alignment mark 360 illustrated by a dotted line in FIG. 21B. In other words, the wafer W is aligned in a state in which the relative position thereof is misaligned by the distance PTx in the −X-direction and the distance PTy in the +Y-direction with respect to the line portion 22 and the columnar portion 23 of the template 20.

In the above described case, as well as the case in which the inspection mark 250 of the template 20 is observed, it is observed that the center point of the inner-portion pattern 56*in* is misaligned from the center point of the outer-portion pattern 56*ot* in the −X-direction and the +Y-direction in the inspection mark pattern 56*i* of the resist pattern 56*p*. Herein, it should be noted that the positive/negative misalignment directions in the X-direction and the Y-direction are reversed between the observation result of the template 20 and the observation result of the resist pattern 56*p*.

As a result, it can be understood that the alignment mark 260 of the template 20 used in the imprinting process is formed to be misaligned in the +X-direction and the −Y-direction.

More specifically, as well as the case of the above described template 20, by any of Equations (1) to (4), a fact that the template 20 used in the imprinting process has the alignment mark 260 formed with misalignment of the distance PTx in the +X-direction with respect to the protruding pattern 24 can be calculated from the X-direction distance of the inner-portion pattern 56*in* with respect to the outer-portion pattern 56*ot*.

This can be a verification that the trench pattern 56*n* and the hole pattern 56*c* of the resist pattern 56*p* are formed with misalignment of the distance PTx in the −X-direction with respect to the alignment mark 360 of the wafer W. Therefore, it can be understood that, even if the alignment using the alignment mark 260 of the template 20 and the alignment mark 360 of the wafer W is precisely carried out, overlay misalignment of the resist pattern 56*p* by the distance PTx in the −X-direction with respect to the wafer W is generated.

Also, as well as the case of the above described template 20, by any of Equations (5) to (8), a fact that the template 20 used in the imprinting process has the alignment mark 260 formed with misalignment of the distance PTy in the −Y-direction with respect to the protruding pattern 24 can be calculated from the Y-direction distance of the inner-portion pattern 56*in* with respect to the outer-portion pattern 56*ot*.

This can be a verification that the trench pattern 56*n* and the hole pattern 56*c* of the resist pattern 56*p* are formed with misalignment of the distance PTy in the +Y-direction with respect to the alignment mark 360 of the wafer W. Therefore, it can be understood that, even if the alignment using the alignment mark 260 of the template 20 and the alignment mark 360 of the wafer W is precisely carried out, overlay misalignment of the resist pattern 56*p* by the distance PTy in the +Y-direction with respect to the wafer W is generated.

As described above, by inspecting the resist pattern 56*p* after the imprinting process, the inter-pattern position accuracy of the template 20 used in the imprinting process can be specified. Also, as described above, the formation position accuracy of the trench pattern 56*n* and the hole pattern 56*c* of the resist pattern 56*p* with respect to the alignment mark 360 of the wafer W can be also specified.

Note that the inter-pattern position accuracy of the template 20 used in the imprinting process can be also specified by directly checking the positional relation between the inner portion 252 and the outer portion 253 of the inspection mark 250 of the template 20. Also, according to the inter-pattern position accuracy of the template 20 specified in such a manner, it is also possible to estimate the formation position of the resist pattern 56*p* with respect to the alignment mark 360 of the wafer W in the case in which the template 20 is used.

Herein, when the resist pattern 56*p* is directly inspected, the formation position of the resist pattern 56*p* can be more precisely specified. Therefore, according to the inspection of the resist pattern 56*p*, it is preferred to specify the formation position of the resist pattern 56*p* and the inter-pattern position accuracy of the used template 20. Also, it is more preferred to similarly carry out the inspection of the template 20 used in the imprinting process in addition to the inspection of the resist pattern 56*p* like this from the viewpoint of inspection accuracy improvement.

Also, if the inspection of the template 20 is carried out, based on the inspection result thereof, the alignment position of the template 20 with respect to the wafer W, which is a next imprinting process target, may be corrected. If the inter-pattern position accuracy of the template 20 used in the imprinting process is already known, the overlay misalignment of the resist pattern 56*p* with respect to the wafer W can be constrained by correcting the alignment position based on that. More specifically, alignment is executed by appropriately shifting the alignment marks 26 and 36 of the template 20 and the wafer W so that the positional misalignment amount of the line portion 22 and the columnar portion 23 of the template 20 with respect to the wafer W is reduced.

Next, an inspection of the alignment accuracy of the template 20 and the wafer W in the imprinting process will be described.

Figure 22:
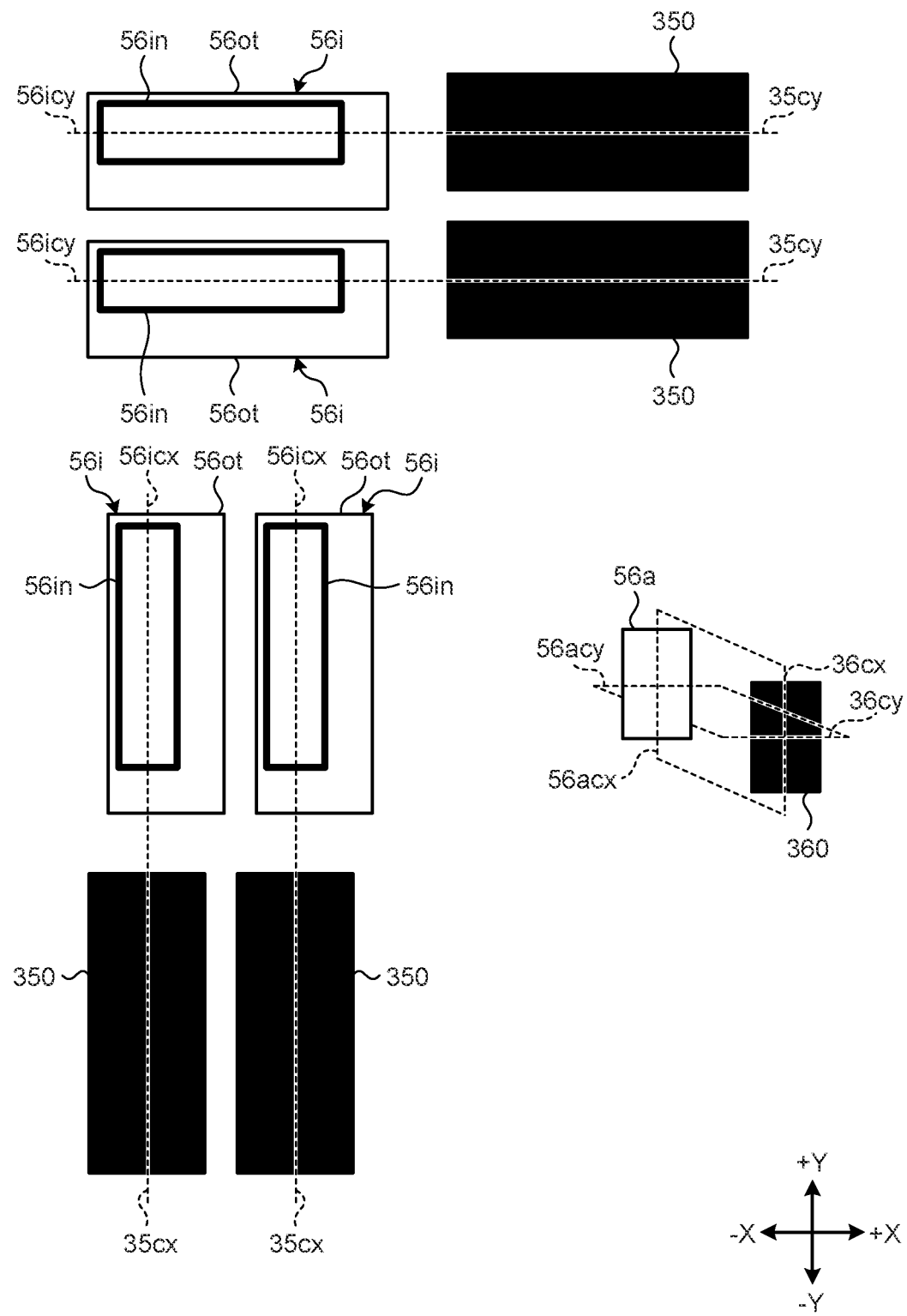
FIG. 22 is a diagram describing a method of inspecting the alignment accuracy of the template and a wafer in the imprinting process in the inspection of the resist pattern according to the embodiment.
Figure 23:
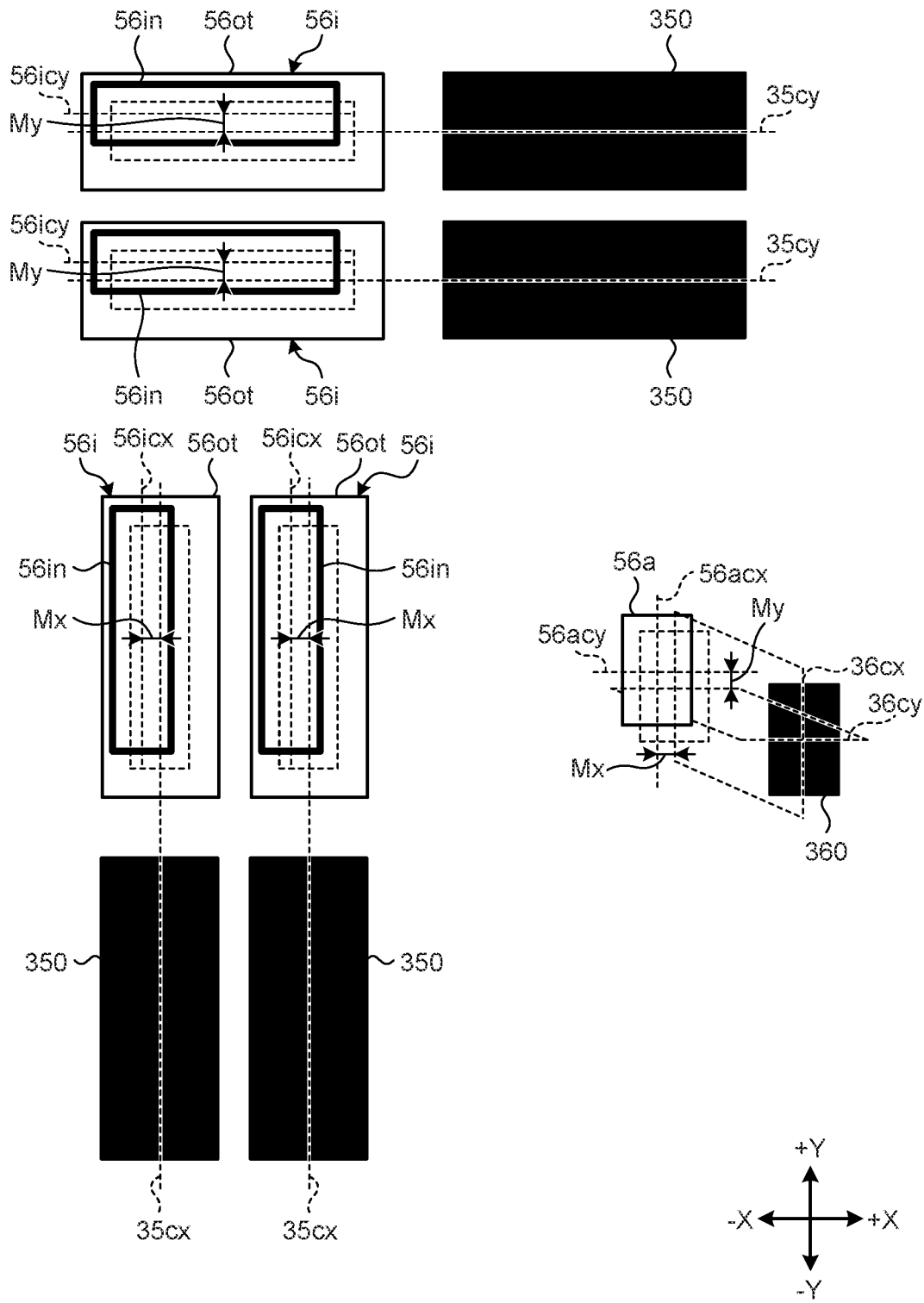
FIG. 23 is a diagram describing a method of inspecting the alignment accuracy of the template and the wafer in the imprinting process in the inspection of the resist pattern according to the embodiment.

FIG. 22 and FIG. 23 are diagrams describing a method of inspecting the alignment accuracy of the template 20 and the wafer W in the imprinting process in the inspection of the resist pattern 56p according to the embodiment.

FIG. 22 and FIG. 23 illustrate a state of observation by inline SEM or the like used in the inspection of the resist pattern 56p.

As illustrated in FIG. 22 and FIG. 23, according to the inline SEM or the like, the inspection mark pattern 56i of the resist pattern 56p and the inspection mark 350 formed on the wafer W can be observed at the same time through the resist pattern 56p, the process target film 31, etc. Also, when inline SEM or the like is used, the alignment mark 360 formed on the wafer W can be observed through the resist pattern 56p, the process target film 31, etc.

However, as described above, it is difficult to include all of the inspection mark pattern 56i of the resist pattern 56p, the inspection mark 350 of the wafer W, and the alignment mark 360 of the wafer W at the same time in the view field of the inline SEM or the like.

Therefore, in order to specify the alignment accuracy in the imprinting process in the inspection using the inline SEM or the like, attention is focused on the positional relation between the inner-portion pattern 56in of the inspection mark pattern 56i of the resist pattern 56p and the inspection mark 350 of the wafer W as described below.

Note that the resist pattern 56p illustrated in FIG. 22 and FIG. 23 is assumed to have been formed by using the above described template 20 of FIG. 20B.

FIG. 22 illustrates an example of a case in which the template 20 and the wafer W are precisely aligned without positional misalignment.

As illustrated in FIG. 22, in the inspection mark pattern 56i of the resist pattern 56p, a line passing through an X-direction center of the inner-portion pattern 56in of the inspection mark pattern 56i extending in the Y-direction is a center line 56icx. Also, in the inspection mark pattern 56i of the resist pattern 56p, a line passing through an Y-direction center of the inner-portion pattern 56in of the inspection mark pattern 56i extending in the X-direction is a center line 56icy.

Similarly, in the inspection mark 350 of the wafer W, a line passing through an X-direction center of the inspection mark 350 extending in the Y-direction is a center line 35cx. Also, in the inspection mark 350 of the wafer W, a line passing through a Y-direction center of the inspection mark 350 extending in the X-direction is a center line 35cy.

Herein, if the template 20 and the wafer W are precisely aligned, an X-direction center line 56acx of the alignment mark pattern 56a of the resist pattern 56p and an X-direction center line 36cx of the alignment mark 360 of the wafer W are overlaid with each other in principle. Also, a Y-direction center line 56acy of the alignment mark pattern 56a of the resist pattern 56p and a Y-direction center line 36cy of the alignment mark 360 of the wafer W are overlaid with each other in principle. However, this does not mean that the alignment mark pattern 56a and the alignment mark 360 overlaid with each other can be distinguished by the inline SEM or the like.

On the other hand, when the alignment mark pattern 56a of the resist pattern 56p and the alignment mark 360 of the wafer W are completely overlaid with each other in the vertical direction, the X-direction positions and the Y-direction positions of the inner-portion pattern 56in of the inspection mark pattern 56i and the alignment mark 360 of the wafer W are also aligned.

Also, as described above, the alignment mark 360 of the wafer W and the inspection mark 350 are formed in batch by using the same mask pattern, etc. Therefore, the X-direction positions and the Y-direction positions of the inner-portion pattern 56in of the inspection mark pattern 56i and the inspection mark 350 of the wafer W are also aligned.

Therefore, if the alignment is precise, it is observed that the center lines 56icx and 35cx of the inner-portion pattern 56in of the inspection mark pattern 56i extending in the Y-direction and the inspection mark 350 of the wafer W extending in the Y-direction are arranged in a straight line. According to this, it can be understood that the template 20 and the wafer W are aligned without positional misalignment in the X-direction.

Also, if the alignment is precise, it is observed that the center lines 56icy and 35cy of the inner-portion pattern 56in of the inspection mark pattern 56i extending in the X-direction and the inspection mark 350 of the wafer W extending in the X-direction are arranged in a straight line. According to this, it can be understood that the template 20 and the wafer W are aligned without positional misalignment in the Y-direction.

FIG. 23 illustrates an example of a case in which the template 20 and the wafer W are aligned with misalignment by a distance Mx in the −X-direction and a distance My in the +Y-direction. Also in FIG. 23, as well as the above described case of FIG. 22, the lines passing through the centers of the respective patterns are the center lines 56icx, 56icy, 35cx, and 35cy.

If there is misalignment both in the X-direction and the Y-direction between the template 20 and the wafer W, the X-direction center line 56acx of the alignment mark pattern 56a of the resist pattern 56p and the X-direction center line 36cx of the alignment mark 360 of the wafer W are misaligned. The misalignment amount in this case is, for example, a distance Mx. Also, the Y-direction center line 56acy of the alignment mark pattern 56a of the resist pattern 56p and the Y-direction center line 36cy of the alignment mark 360 of the wafer W are misaligned. The misalignment amount in this case is, for example, a distance My. However, this does not mean that the misalignment amount of the alignment mark pattern 56a and the alignment mark 360 partially overlaid with each other can be precisely identified by the inline SEM or the like.

On the other hand, when the alignment mark pattern 56a of the resist pattern 56p and the alignment mark 360 of the wafer W are not overlaid with each other in the vertical direction, the resist pattern 56p is subjected to patterning while the X-direction position and the Y-direction position of the inner-portion pattern 56in of the inspection mark pattern 56i and the inspection mark 350 of the wafer W are not aligned.

Therefore, if the alignment is not precise, it is observed that the center line 56icx of the inner-portion pattern 56in of the inspection mark pattern 56i extending in the Y-direction is misaligned from the line of the center line 35cx of the inspection mark 350 of the wafer W extending in the Y-direction. According to this, it can be understood that the template 20 and the wafer W are aligned with misalignment in the X-direction. Also, in this case, the misalignment amount of the center lines 56icx and 35cx are the distance Mx in the −X-direction, and it is understood that the alignment has been misaligned by the distance Mx in the −X-direction.

Similarly, it is observed that the center line 56$icy$ of the inner-portion pattern 56$in$ of the inspection mark pattern 56$i$ extending in the X-direction is misaligned from the line of the center line 35$cy$ of the inspection mark 350 of the wafer W extending in the X-direction. According to this, it can be understood that the template 20 and the wafer W are aligned with misalignment in the Y-direction. Also, in this case, the misalignment amount of the center lines 56$icy$ and 35$cy$ are the distance My in the +Y-direction, and it is understood that the alignment has been misaligned by the distance My in the +Y-direction.

Next, an inspection of the overlay accuracy of the resist pattern 56$p$ with respect to the wafer W will be described.

Figure 24:
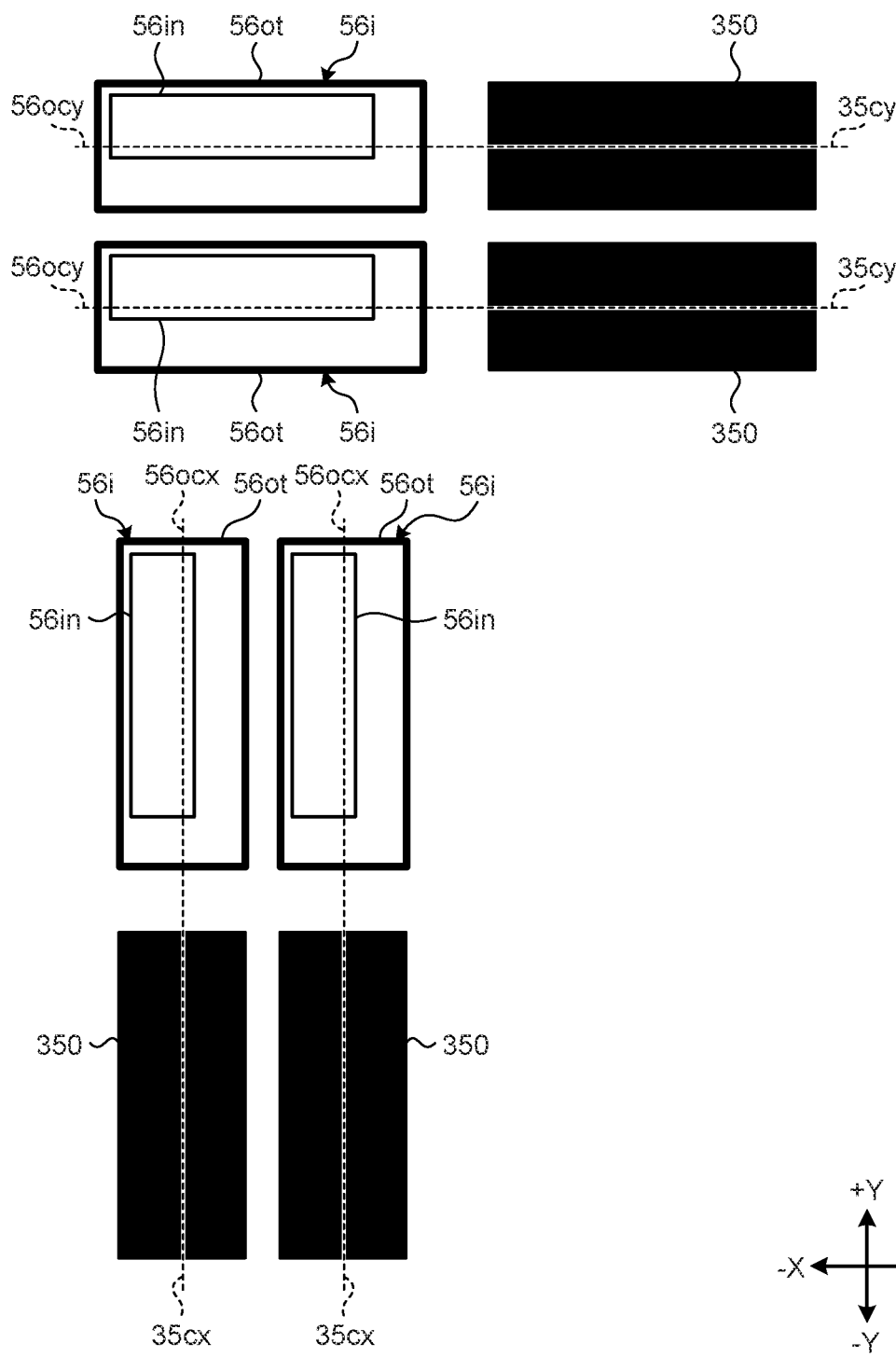
FIG. 24 is a diagram describing a method of inspecting the overlay accuracy of the resist pattern with respect to the wafer in the inspection of the resist pattern according to the embodiment.
Figure 25:
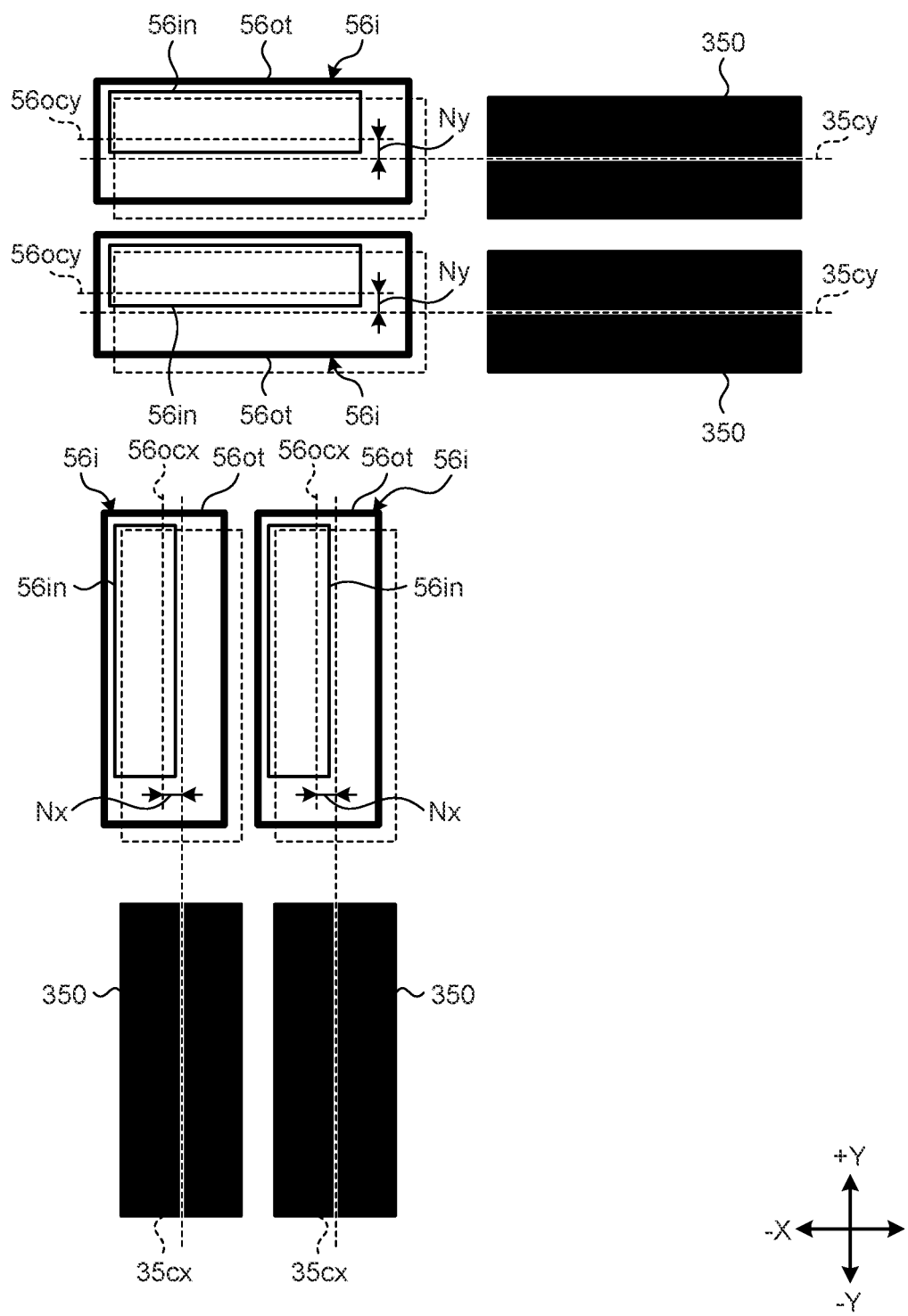
FIG. 25 is a diagram describing the method of inspecting the overlay accuracy of the resist pattern with respect to the wafer in the inspection of the resist pattern according to the embodiment.

FIG. 24 and FIG. 25 are diagrams describing a method of inspecting the overlay accuracy of the resist pattern 56$p$ with respect to the wafer W in the inspection of the resist pattern 56$p$ according to the embodiment.

FIG. 24 and FIG. 25 illustrate states of simultaneously observing the inspection mark pattern 56$i$ of the resist pattern 56$p$ and the inspection mark 350 formed on the wafer W through the resist pattern 56$p$, the process target film 31, etc. by the inline SEM or the like used in the inspection of the resist pattern 56$p$.

Note that the resist pattern 56$p$ illustrated in FIG. 24 and FIG. 25 is assumed to have been formed by using the above described template 20 of FIG. 20B.

In order to inspect the overlay accuracy of the resist pattern 56$p$ in the inspection using the inline SEM or the like, as described below, attention is focused on the positional relation between the outer-portion pattern 56$ot$ of the inspection mark pattern 56$i$ of the resist pattern 56$p$ and the inspection mark 350 of the wafer W.

FIG. 24 illustrates an example of a case in which the resist pattern 56$p$ is precisely overlaid with the wafer W without positional misalignment.

As illustrated in FIG. 24, in the inspection mark pattern 56$i$ of the resist pattern 56$p$, a line passing through an X-direction center of the outer-portion pattern 56$ot$ of the inspection mark pattern 56$i$ extending in the Y-direction is a center line 56$ocx$. Also, in the inspection mark pattern 56$i$ of the resist pattern 56$p$, a line passing through a Y-direction center of the outer-portion pattern 56$ot$ of the inspection mark pattern 56$i$ extending in the X-direction is a center line 56$ocy$.

Also, also in FIG. 24, as well as above described FIG. 22 and FIG. 23, the lines passing through the centers of the inspection mark 350 of the wafer W are the center lines 35$cx$ and 35$cy$.

If the resist pattern 56$p$ is precisely overlaid with respect to the wafer W, the outer-portion pattern 56$ot$ extending in the Y-direction of the resist pattern 56$p$ and the center lines 56$ocx$ and 35$cx$ of the inspection mark 350 extending in the Y-direction of the wafer W are observed to be arranged in one straight line. By virtue of this, it can be understood that the outer-portion pattern 56$ot$ and the inspection mark 350 are not misaligned in the X-direction. Therefore, it can be understood that the X-direction overlay misalignment amount of the trench pattern 56$n$ and the hole pattern 56$c$, which have relative positional relations with the outer-portion pattern 56$ot$, with respect to the wafer W is also zero.

Also, if the resist pattern 56$p$ is precisely overlaid with respect to the wafer W, the outer-portion pattern 56$ot$ extending in the X-direction of the resist pattern 56$p$ and the center lines 56$ocy$ and 35$cy$ of the inspection mark 350 extending in the X-direction of the wafer W are observed to be arranged in one straight line. By virtue of this, it can be understood that the outer-portion pattern 56$ot$ and the inspection mark 350 are not misaligned in the Y-direction. Therefore, it can be understood that the Y-direction overlay misalignment amount of the trench pattern 56$n$ and the hole pattern 56$c$, which have relative positional relations with the outer-portion pattern 56$ot$, with respect to the wafer W is also zero.

FIG. 25 illustrates an example of a case in which the resist pattern 56$p$ is overlaid with the wafer W with misalignment of a distance Nx in the −X-direction and misalignment of a distance Ny in the Y-direction.

When the overlaid position of the resist pattern 56$p$ with respect to the wafer W is misaligned in the X-direction, it is observed that the center line 56$ocx$ of the outer-portion pattern 56$ot$ extending in the Y-direction of the resist pattern 56$p$ is misaligned from the line of the center line 35$cx$ of the inspection mark 350 of the wafer W extending in the Y-direction.

As a result, it can be understood that the outer-portion pattern 56$ot$ and the inspection mark 350 are misaligned in the X-direction and that X-direction overlay misalignment of the trench pattern 56$n$ and the hole pattern 56$c$, which have relative positional relations with the outer-portion pattern 56$ot$, with respect to the wafer W has occurred. Also, it can be understood that, in this case, the misalignment amount of the center lines 56$ocx$ and 35$cx$ is the distance Nx in the −X-direction and that the overlay misalignment amount is the distance Nx in the −X-direction.

Similarly, when the overlaid position of the resist pattern 56$p$ with respect to the wafer W is misaligned in the Y-direction, it is observed that the center line 56$ocy$ of the outer-portion pattern 56$ot$ extending in the X-direction of the resist pattern 56$p$ is misaligned from the line of the center line 35$cy$ of the inspection mark 350 of the wafer W extending in the X-direction.

As a result, it can be understood that the outer-portion pattern 56$ot$ and the inspection mark 350 are misaligned in the Y-direction and that Y-direction overlay misalignment of the trench pattern 56$n$ and the hole pattern 56$c$, which have relative positional relations with the outer-portion pattern 56$ot$, with respect to the wafer W has occurred. Also, it can be understood that, in this case, the misalignment amount of the center lines 56$ocy$ and 35$cy$ is the distance Ny in the +Y-direction and that the overlay misalignment amount is the distance Ny in the +Y-direction.

Hereinabove, the inspection method of the resist pattern 56$p$ of the embodiment has been described. However, the inter-pattern position accuracy, alignment accuracy, and overlay accuracy affect mutually.

More specifically, for example, if the relative positions of the protruding pattern 24 and the alignment mark 26 of the template 20 are misaligned, the relative positions of the trench pattern 56$n$ and the hole pattern 56$c$ of the resist pattern 56$p$ and the alignment mark pattern 56$a$ are also misaligned. Therefore, if one of the alignment position of the template 20 and the wafer W and the overlaid position of the resist pattern 56$p$ with respect to the wafer W is precisely aligned, the other is misaligned.

Also, for example, if the alignment of the template 20 and the wafer W is misaligned, the overlaid position of the resist pattern 56$p$ with respect to the wafer W may also be misaligned.

Therefore, in the inspection of the resist pattern 56$p$ of the embodiment, for example, it is preferred to apply a following procedure.

The relative positions of the outer-portion pattern 56*ot* and the inner-portion pattern 56in of the inspection mark pattern 56*i* are observed. Also, the relative positions of the inner-portion pattern 56in of the inspection mark pattern 56*i* and the inspection mark 350 of the wafer W are observed. Also, the relative positions of the outer-portion pattern 56*ot* of the inspection mark pattern 56*i* and the inspection mark 350 of the wafer W are observed. However, the order of these observations may be arbitrary. Then, while taking the relative positions of these three types into consideration, the inter-pattern position accuracy, alignment accuracy, and overlay accuracy are specified.

(Comparative Example)

As described above, when a dual damascene structure or the like is to be formed by an imprinting process, for example, a protruding pattern for transferring the pattern of the dual damascene structure and a recessed pattern such as an alignment mark used in alignment with a wafer are formed on a template. However, it is difficult to collectively form the protruding pattern and the recessed pattern.

For example, in a template of a comparative example, the protruding pattern and the recessed pattern are formed in different processes, and the relative positions between these patterns therefore may not be as designed. Also, if an imprinting process is carried out with a template in which the relative positions between patterns are misaligned, a dual damascene structure having a misaligned overlaid position with respect to a wafer may be formed.

However, the dual damascene structure and the alignment mark are formed, for example, at distant positions on a wafer. Therefore, it is difficult to observe presence/absence of the positional misalignment between the above described patterns and quantitatively specify the positional misalignment amount thereof.

According to the template 20 of the embodiment, the inspection mark 250 having the inner portion 252 and the outer portion 253 is provided. By virtue of this, the relative positions of the resist pattern 56*p* and the wafer W can be specified.

According to the template 20 of the embodiment, the inner portion 252 has a pair of sides 252*x* and 252*x* along the X-direction and a pair of sides 252*y* and 252*y* along the Y-direction, and the outer portion 253 has a pair of sides 253*x* and 253*x* along the X-direction and a pair of sides 253*y* and 253*y* along the Y-direction.

By virtue of this, while constraining the influence of dimensional differences in a case in which the inner portion 252 and the outer portion 253 are formed on the template 20, the relative positions of the protruding pattern 24 and the alignment mark 26 of the template 20 can be specified.

Also, while constraining the influence of dimensional differences in a case in which the inner-portion pattern 56in and the outer-portion pattern 56*ot* are transferred to the resist pattern 56*p*, the inter-pattern position accuracy, alignment accuracy, and overlay accuracy can be specified.

According to the template 20 of the embodiment, the inner portion 252 is used in the position detection of the resist pattern 56*p* with respect to the wafer W in the X-direction and the Y-direction. By virtue of this, the alignment accuracy of the template 20 and the wafer W in the imprinting process can be specified after the imprinting process.

According to the template 20 of the embodiment, the outer portion 253 is used to detect the overlay misalignment amount of the resist pattern 56*p* with respect to the wafer W. By virtue of this, the overlay positional accuracy of the template 20 and the wafer W in the imprinting process can be specified after the imprinting process.

According to the template 20 of the embodiment, the inner portion 252 is disposed at a relative position with respect to the disposed position of the alignment mark 260, and the outer portion 253 is disposed at a relative position with respect to the disposed position of the protruding pattern 24.

By virtue of this, the inter-pattern position accuracy, alignment accuracy, and overlay accuracy can be specified by inspecting the resist pattern 56*p* by inline SEM or the like after the imprinting process. In other words, the inspection mark patterns 56*i* of one type can be observed at the same timing in the manufacturing process of the semiconductor device 30 by using the same inspection apparatus.

When the inspection is carried out at the same timing, disturbing elements caused by involvement of another process can be eliminated, and uniform inspection results can be obtained about the inter-pattern position accuracy, alignment accuracy, and overlay accuracy. When the same inspection apparatus is used, the influence of errors among inspection apparatuses, models of inspection apparatuses, etc. can be eliminated, and more precise inspection results can be obtained. Since it is only required to observe only one type of marks, the time and effort of moving an observation location and finding another mark can be omitted, and the load and time in the inspection can be reduced.

According to the template 20 of the embodiment, the inspection mark 250 is incorporated in the overlay mark 25 used in the imprinting process. Therefore, there is no need to dispose a new mark in order to carry out the above described various inspections, and increase in the area of various marks can be constrained. Also, when the template 20 has the inspection mark 250 like this, for example, the tendency of each shot region of the wafer W can be comprehended. The comprehended result can be subjected to feedback to positioning in the imprinting process.

(Modification Example)

Next, templates of Modification Examples 1 to 5 of the embodiment will be described by using FIG. 26 to FIG. 30. In the templates of Modification Examples 1 to 5, the shapes of inspection marks are different from the above described embodiment.

As described above, the inner portion 252 of the inspection mark 250 of the template 20 has, for example, a rectangular shape or the like and therefore has at least a pair of sides opposed to each other in the X-direction and at least a pair of sides opposed to each other in the Y-direction. By virtue of this, dimensional differences caused in processing of the template 20, etc. can be eliminated, and more precise inspection results can be obtained.

Similarly, since the outer portion 253 of the inspection mark 250 of the template 20 has at least one pair of sides opposed to each other in the X-direction and at least one pair of sides opposed to each other in the Y-direction, more precise inspection results can be obtained.

The shape of the inspection mark satisfying these requirements is not limited to the inspection mark 250 of the above described embodiment.

FIG. 26 to FIG. 30 illustrate examples of some inspection marks having shapes satisfying above described requirements. FIG. 26 to FIG. 30 are plan views exemplarily illustrating inspection marks 250*a* to 250*e* provided on templates according to Modification Examples 1 to 5 of the embodiment.

Figure 26:
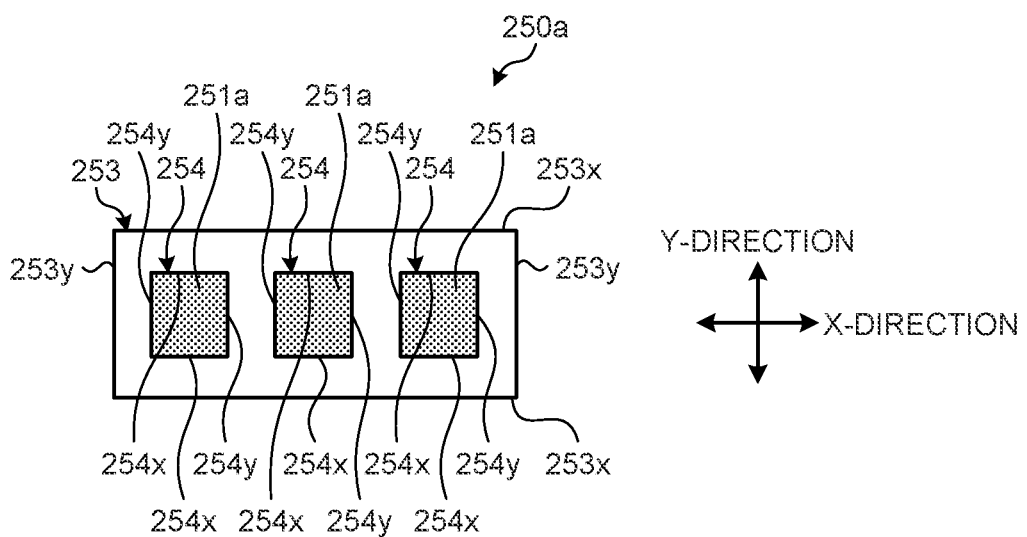
FIG. 26 is a plan view exemplarily illustrating an inspection mark of a template according to Modification Example 1 of the embodiment.

As illustrated in FIG. 26, the template of Modification Example 1 is a mark projecting from the upper surface of the substrate of the template and is provided with the inspection mark 250a surrounding plural recessed portions 251a arranged in the X-direction and disposed in an inside region. More specifically, the inspection mark 250a has plural inner portions 254 with respect to one outer portion 253.

The outer portion 253 of the inspection mark 250a has a rectangular shape similar to that of the above described embodiment. More specifically, the outer portion 253 constitutes an outer edge portion of the inspection mark 250a and has a pair of sides 253x and 253x extending in the X-direction and opposed to each other in the Y-direction and has a pair of sides 253y and 253y extending in the Y-direction and opposed to each other in the X-direction.

Each of the plural inner portions 254 of the inspection mark 250a sections each of the recessed portions 251a of the inspection mark 250a, has a pair of sides 254x and 254x extending in the X-direction and opposed to each other in the Y-direction, and has a pair of sides 254y and 254y extending in the Y-direction and opposed to each other in the X-direction.

By virtue of this, in the template of Modification Example 1, the plural inner portions 254 in the single inspection mark 250a have the plural pairs of sides 254y and 254y opposed to each other in the X-direction and the plural pairs of sides 254x and 254x opposed to each other in the Y-direction.

Therefore, in the inspection using the transfer pattern of the inspection mark 250a, measurement data of plural types can be obtained from these plural sides, and inspection accuracy can be improved. Also, even if the number of the inspection marks 250a included in the overlay mark is reduced, inspection accuracy can be maintained. If the number of the inspection marks 250a can be reduced, the area of the overlay mark can be reduced.

Figure 27:
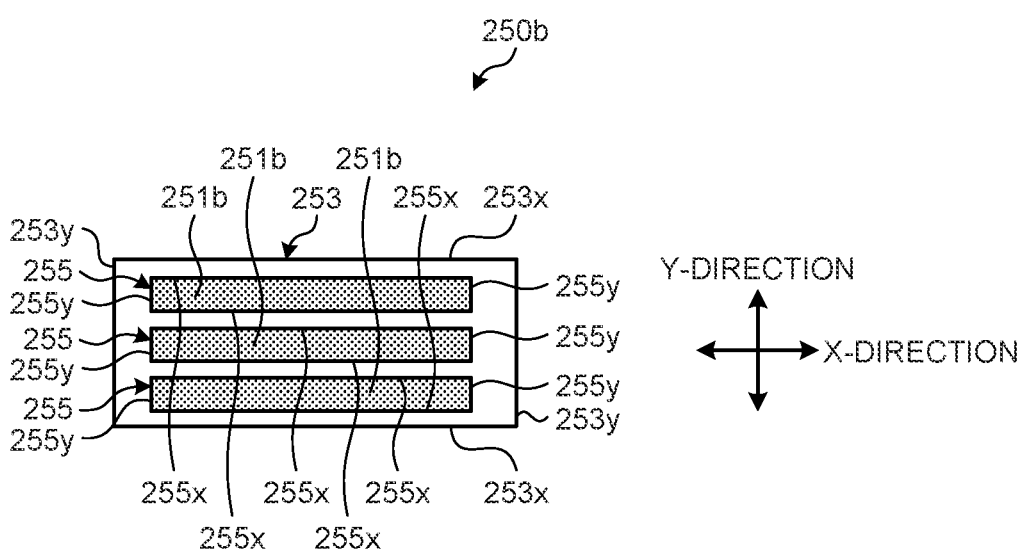
FIG. 27 is a plan view exemplarily illustrating an inspection mark of a template according to Modification Example 2 of the embodiment.

As illustrated in FIG. 27, the template of Modification Example 2 is a mark projecting from the upper surface of the substrate of the template and is provided with an inspection mark 250b surrounding plural recessed portions 251b arranged in the Y-direction and disposed in an inside region. More specifically, the inspection mark 250b also has plural inner portions 255 with respect to one outer portion 253. The outer portion 253 of the inspection mark 250b has a rectangular shape similar to that of the above described embodiment.

Each of the plural inner portions 255 of the inspection mark 250b sections each of the recessed portions 251b of the inspection mark 250b, has a pair of sides 255x and 255x extending in the X-direction and opposed to each other in the Y-direction, and has a pair of sides 255y and 255y extending in the Y-direction and opposed to each other in the X-direction.

By virtue of this, also in the template of Modification Example 2, the plural inner portions 255 in the single inspection mark 250b have the plural pairs of sides 255y and 255y opposed to each other in the X-direction and the plural pairs of sides 255x and 255x opposed to each other in the Y-direction. Therefore, the inspection mark 250b of Modification Example 2 also exerts similar effects as the inspection mark 250a of above described Modification Example 1.

Figure 28:
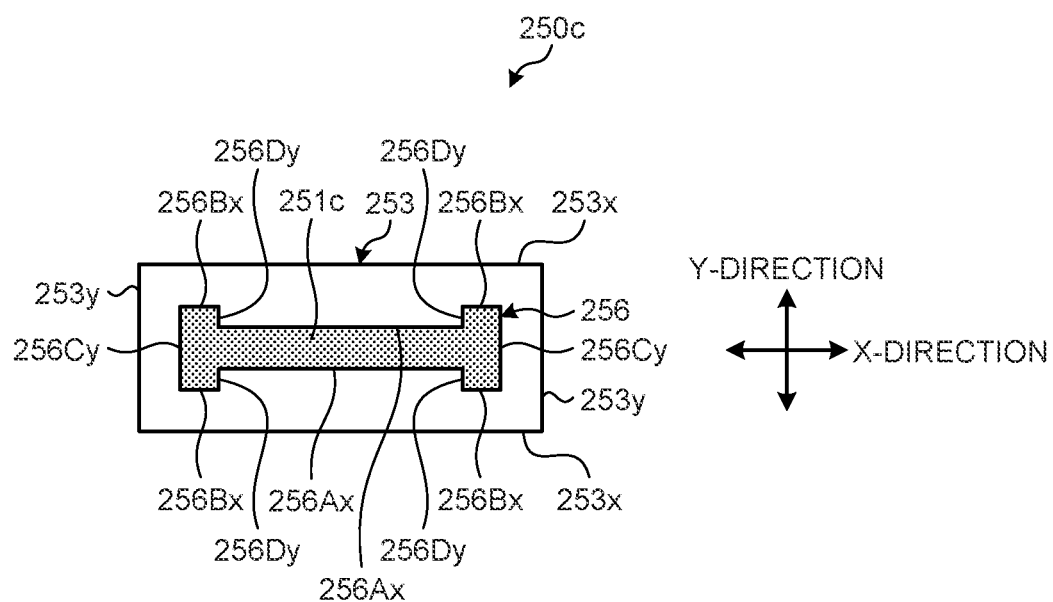
FIG. 28 is a plan view exemplarily illustrating an inspection mark of a template according to Modification Example 3 of the embodiment.

As illustrated in FIG. 28, a template of Modification Example 3 is provided with an inspection mark 250c, which is a mark projecting from the upper surface of the substrate of the template, is disposed in an inside region, and surrounds the recessed portion 251c having widened X-direction both end portions. In other words, the inspection mark 250c has the outer portion 253 surrounding the recessed portion 251c having an H-shape when viewed from above.

The outer portion 253 has a rectangular shape similar to that of the above described embodiment.

The inner portion 256 of the inspection mark 250c has three pairs of sides 256Ax and 256Ax, sides 256Bx and 256Bx, and sides 256Bx and 256Bx extending in the X-direction and opposed to each other in the Y-direction. Also, the inner portion 256 has, in each side in the X-direction, two pairs of sides 256Cy and 256Dy and sides 256Cy and 256Dy extending in the Y-direction and opposed to each other in the X-direction. Furthermore, one pair of sides 256Cy and 256Cy are also opposed to each other in the X-direction at both end portions of the inner portion 256.

These sides 256Ax, 256Dy, 256Bx, 256Cy, 256Bx, 256Dy, 256Ax, 256Dy, 256Bx, 256Cy, 256Bx, and 256Dy surround the recessed portion 251c of the inspection mark 250c in this order so that the inner portion 256 sections the recessed portion 251c.

In this manner, in the template of Modification Example 3, the single inner portion 256 in the inspection mark 250c has plural pairs of sides 256Cy, 256Cy, 256Dy, 256Dy, 256Dy, and 256Dy opposed to each other in the X-direction and has plural pairs of sides 256Ax, 256Ax, 256Bx, 256Bx, 256Bx, and 256Bx opposed to each other in the Y-direction. Therefore, also the inspection mark 250c of Modification Example 3 can exert similar effects as those of the inspection mark 250a of above described Modification Example 1.

Figure 29:
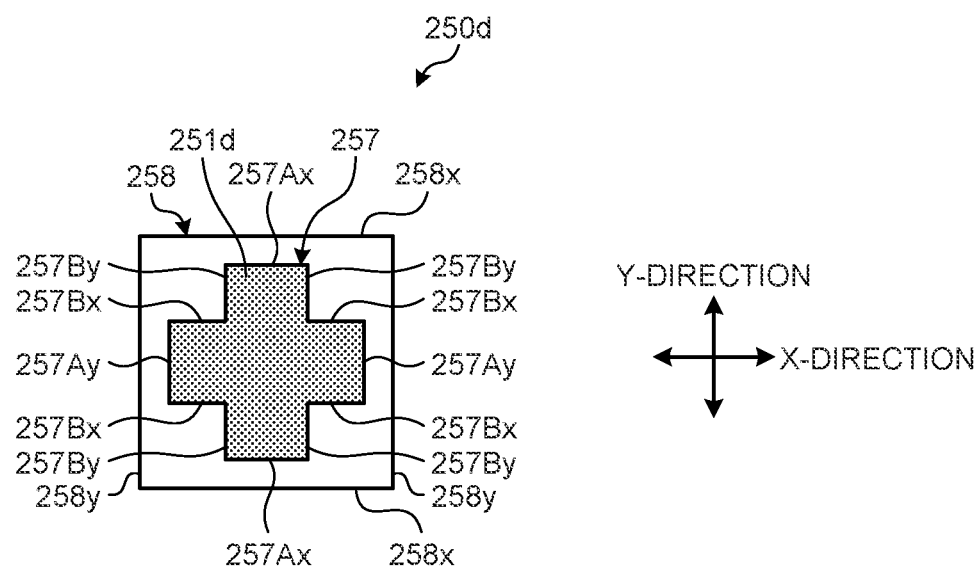
FIG. 29 is a plan view exemplarily illustrating an inspection mark of a template according to Modification Example 4 of the embodiment.

As illustrated in FIG. 29, a template of Modification Example 4 is a mark projecting from the upper surface of the substrate of the template and is provided with an inspection mark 250d surrounding a recessed portion 251d disposed in an inside region. More specifically, the inspection mark 250d has a rectangular outer portion 258 surrounding a recessed portion 251d having a cross-shape when viewed from above.

More specifically, the outer portion 258 of the inspection mark 250d constitutes an outer edge portion of the inspection mark 250d and has a pair of sides 258x and 258x extending in the X-direction and opposed to each other in the Y-direction and has a pair of sides 258y and 258y extending in the Y-direction and opposed to each other in the X-direction.

The inner portion 257 of the inspection mark 250d has three pairs of sides 257Ax and 257Ax, sides 257Bx and 257Bx, and sides 257Bx and 257Bx extending in the X-direction and opposed to each other in the Y-direction. Also, the inner portion 257 has three pairs of sides 257Ay and 257Ay, sides 257By and 257By, and sides 257By and 257By extending in the Y-direction and opposed to each other in the X-direction.

These sides 257Ax, 257By, 257Bx, 257Ay, 257Bx, 257By, 257Ax, 257By, 257Bx, 257Ay, 257Bx, and 257By surround the recessed portion 251d of the inspection mark 250d in this order so that the inner portion 257 sections the recessed portion 251d.

In this manner, in the template of Modification Example 4, the single inner portion 257 in the inspection mark 250d has plural pairs of sides 257Ay, 257Ay, 257By, 257By, 257By, and 257By opposed to each other in the X-direction and has plural pairs of sides 257Ax, 257Ax, 257Bx, 257Bx, 257Bx, and 257Bx opposed to each other in the Y-direction. Therefore, also the inspection mark 250d of Modification Example 4 can exert similar effects as those of the inspection mark 250a of above described Modification Example 1.

Figure 30:
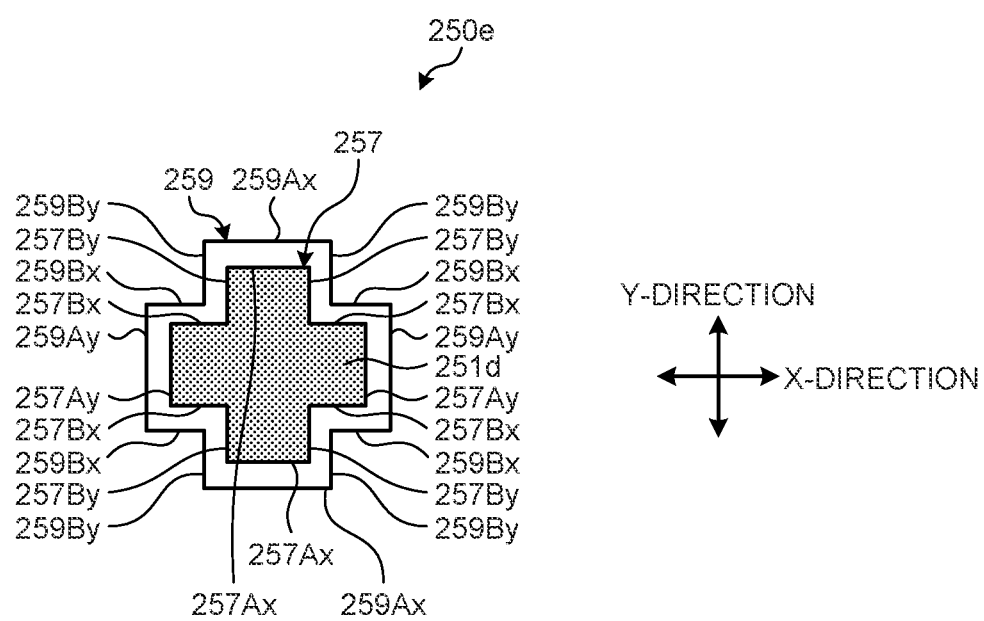
FIG. 30 is a plan view exemplarily illustrating an inspection mark of a template according to Modification Example 5 of the embodiment.

As illustrated in FIG. 30, a template of Modification Example 4 is a mark projecting from the upper surface of the substrate of the template and is provided with an inspection mark 250e surrounding, in a cross shape, a cross-shaped recessed portion 251d disposed in an inside region. More specifically, the inspection mark 250e has the inner portion 257 of above described Modification Example 4 and an outer portion 259 having a cross shape when viewed from above.

The outer portion 259 of the inspection mark 250e has three pairs of sides 259Ax and 259Ax, sides 259Bx and 259Bx, and sides 259Bx and 259Bx extending in the X-direction and opposed to each other in the Y-direction. Also, the outer portion 259 has three pairs of sides 259Ay and 259Ay, sides 259By and 259By, and sides 259By and 259By extending in the Y-direction and opposed to each other in the X-direction.

These sides 259Ax, 259By, 259Bx, 259Ay, 259Bx, 259By, 259Ax, 259By, 259Bx, 259Ay, 259Bx, and 259By surround the inner portion 257 of the inspection mark 250e in this order so that the outer portion 259 constitutes an outer edge portion of the inspection mark 250e.

In this manner, in the template of Modification Example 5, the outer portion 259 of the inspection mark 250e has plural pairs of sides 259Ay, 259Ay, 259By, 259By, 259By, and 259By opposed to each other in the X-direction and has plural pairs of sides 259Ax, 259Ax, 259Bx, 259Bx, 259Bx, and 259Bx opposed to each other in the Y-direction.

Therefore, in the inspection using the transfer pattern of the inspection mark 250e, plural types of data can be acquired by variously combining the plural sides to which the outer portion 259 has been transferred and the plural sides to which the inner portion 257 having the same configuration as the above description has been transferred, inspection accuracy can be further improved, and inspection accuracy can be maintained even when the number of the inspection marks 250e included in the overlay mark is further reduced. When the number of the inspection mark 250a is further reduced, the area of the overlay mark can be further reduced.

Note that, in the above described embodiment, the template 20 is assumed to be a replica template manufactured by using the master template 10. However, the template 20 may be manufactured without using the master template 10.

In such a case, a resist pattern having a pattern of columnar portions is formed on a substrate such as quartz by electron drawing or the like to transfer the columnar portions to the substrate. Also, a resist pattern having a pattern of line portions is formed on a substrate by electron drawing or the like, and the line portions are transferred to the substrate. The projecting portions corresponding to the outer shapes of the inspection marks are formed in batch when the columnar portions are formed or when the line portions are formed. The inner portions of the inspection marks and the alignment marks are formed in batch thereafter.

A configuration similar to the template 20 of the above described embodiment can be obtained also by such a manufacturing method. However, in such a case, a measure against positional misalignment between the columnar portions and the line portions is additionally required. Details of the measure against the positional misalignment will not be discussed herein.

Also, in the above described embodiment, the protruding pattern 24 of the template 20 has the line portions 22 and the columnar portions 23. However, the above described embodiment can be applied also in the case in which the protruding pattern has either one of the line portions 22 and the columnar portions 23.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
a first substrate;
a pattern projected from a principal surface of the first substrate;
a first mark projected from the principal surface of the first substrate, the first mark surrounding a recessed portion disposed in an inside region of the first mark; and
a second mark recessed from the principal surface of the first substrate; wherein
the first mark is provided with, in a planar view,
an inner portion having a pair of first sides opposed to each other and a pair of second sides opposed to each other, the first sides extending in a first direction along the first substrate, the second sides extending in a second direction intersecting with the first direction along the first substrate, the inner portion surrounding the recessed portion of the first mark, and
an outer portion having a pair of third sides opposed to each other and a pair of fourth sides opposed to each other, the third sides extending in the first direction, the fourth sides extending in the second direction, the outer portion being an outer edge portion of the first mark.

2. The template according to claim 1, wherein
the second mark has a film on a bottom surface, the film being a different material from the first substrate.

3. The template according to claim 1, wherein
the inner portion is disposed at a relative position with respect to a disposed position of the second mark, and
the outer portion is disposed at a relative position with respect to a disposed position of the pattern.

4. A manufacturing method of a template comprising:
forming a pattern and a projecting portion on a first substrate, the pattern projecting from a principal surface of the first substrate, the projecting portion having an outer edge corresponding to an outer shape of a first mark and projecting from the principal surface of the first substrate; and
forming a second mark and the first mark on the first substrate, the second mark recessed from the principal surface of the first substrate, the first mark having a recessed portion in an inside region of the first mark, the first mark being formed by recessing the inside region of an upper surface of the projecting portion.

5. The manufacturing method of the template according to claim 4, wherein
forming the first mark and the second mark includes
forming a mask film on the first substrate; and
subjecting the mask film to an imprinting process and forming a mask pattern, the mask pattern having a first thickness above the pattern projecting from a principal surface of the first substrate, the mask pattern having a second thickness thinner than the first thickness above the projecting portion, the mask pattern having a third thickness thinner than the second thickness above a formation position of the second mark, the mask pattern having a first pattern for a recessed portion above the projecting portion, the mask pattern having a second pattern for the second mark above the formation position of the second mark.

6. The manufacturing method of the template according to claim 4, wherein
forming the first mark and the second mark includes
forming a film on a bottom surface, the film being a different material from the first substrate.

7. A manufacturing method of a semiconductor device comprising:
forming a process target film and a mask film in this order on a second substrate and
forming a mask pattern having the mask film on which a predetermined pattern is transferred by an imprinting process; wherein
forming the mask pattern includes
transferring a pattern, a first mark, and a second mark of a template to the mask film,
the template having
a first substrate;
the pattern projected from a principal surface of the first substrate;
the first mark projected from the principal surface of the first substrate, the first mark surrounding a recessed portion disposed in an inside region of the first mark; and
the second mark recessed from the principal surface of the first substrate;
wherein
the first mark is provided with, in a planar view,
an inner portion having a pair of first sides opposed to each other and a pair of second sides opposed to each other, the first sides extending in a first direction along the first substrate, the second sides extending in a second direction intersecting with the first direction along the first substrate, the inner portion surrounding the recessed portion of the first mark, and
an outer portion having a pair of third sides opposed to each other and a pair of fourth sides opposed to each other, the third sides extending in the first direction, the fourth sides extending in the second direction, the outer portion being an outer edge portion of the first mark.

8. The manufacturing method of the semiconductor device according to claim 7, the manufacturing method further including
forming an alignment mark on the second substrate, the alignment mark corresponding to the second mark; wherein
forming the mask pattern includes
aligning a position of the pattern before transfer with respect to the second substrate by the second mark and the alignment mark.

9. The manufacturing method of the semiconductor device according to claim 7, the manufacturing method further including
forming an inspection mark on the second substrate, the inspection mark corresponding to the first mark, and
inspecting the mask pattern; wherein
inspecting the mask pattern includes
detecting a position of the pattern after the transfer with respect to the second substrate by an inner-portion pattern and the inspection mark, the inner-portion pattern being a transfer of the inner portion of the first mark to the mask film.

10. The manufacturing method of the semiconductor device according to claim 9, wherein
inspecting the mask pattern includes
detecting overlay misalignment of the pattern with respect to the second substrate after the transfer by an outer-portion pattern and the inner-portion pattern, the outer-portion pattern being a transfer of the outer portion of the first mark to the mask film.

11. The manufacturing method of the semiconductor device according to claim 10, further including
reforming the mask pattern when an amount of the overlay misalignment exceeds a specified value.

* * * * *